United States Patent
Suzaki et al.

(10) Patent No.: US 11,950,492 B2
(45) Date of Patent: Apr. 2, 2024

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventors: Yuji Suzaki, Yokohama (JP); Akinori Yamatani, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 173 days.

(21) Appl. No.: 16/738,456

(22) Filed: Jan. 9, 2020

(65) Prior Publication Data
US 2020/0243769 A1 Jul. 30, 2020

(30) Foreign Application Priority Data
Jan. 29, 2019 (KR) .................. 10-2019-0011417

(51) Int. Cl.
*H01L 51/00* (2006.01)
*H10K 85/30* (2023.01)
(Continued)

(52) U.S. Cl.
CPC .......... *H10K 85/322* (2023.02); *H10K 50/12* (2023.02); *H10K 50/15* (2023.02); *H10K 50/16* (2023.02)

(58) Field of Classification Search
CPC ............... H01L 51/008; H01L 51/5024; H01L 51/5056; H01L 51/5072; C07F 5/027; C07F 5/02; H10K 85/322
See application file for complete search history.

(56) References Cited

U.S. PATENT DOCUMENTS 6,045,974 A 4/2000 Cunningham et al.
7,279,704 B2 * 10/2007 Walters .................. C09K 11/06
257/40
(Continued)

FOREIGN PATENT DOCUMENTS

CN 102971332 A 3/2013
CN 106467553 A 3/2017
(Continued)

OTHER PUBLICATIONS

Agou, Tomohiro et al.; Synthesis of π-Conjugated Dendrimers Based on Azaborines, American Chemical Society, Organic Letters vol. 11, No. 16, pp. 3534-3537, May 12, 2009.
(Continued)

*Primary Examiner* — Alexander C Kollias
(74) *Attorney, Agent, or Firm* — Lewis Roca Rothgerber Christie LLP

(57) ABSTRACT

An organic electroluminescence device includes a first electrode, a hole transport region on the first electrode, an emission layer on the hole transport region, an electron transport region on the emission layer, and a second electrode on the electron transport region, wherein the emission layer includes a polycyclic compound containing one electron donor and one electron acceptor, and the electron donor includes an azaborine group and the electron acceptor includes any one of a cyano group, a carbonyl group, a boron group, a sulfonyl group, a sulfinyl group, a phosphine oxide group, a nitrogen-containing five-membered ring, or a nitrogen-containing six-membered monocyclic ring.

17 Claims, 2 Drawing Sheets

(51) Int. Cl.
*H10K 50/12* (2023.01)
*H10K 50/15* (2023.01)
*H10K 50/16* (2023.01)

(56) References Cited

U.S. PATENT DOCUMENTS

| | | | |
|---|---|---|---|
| 9,073,948 B2 | 7/2015 | Kottas et al. | |
| 9,917,272 B2 | 3/2018 | Voges et al. | |
| 10,177,312 B2 | 1/2019 | Parham et al. | |
| 11,251,380 B2 | 2/2022 | Yamatani | |
| 2003/0157366 A1 | 8/2003 | Matsuura et al. | |
| 2011/0278556 A1 | 11/2011 | Kottas et al. | |
| 2011/0279019 A1* | 11/2011 | Kottas | C07F 5/027 313/504 |
| 2014/0014922 A1 | 1/2014 | Lin et al. | |
| 2015/0270506 A1* | 9/2015 | Voges | H01L 51/5012 257/40 |
| 2016/0072076 A1* | 3/2016 | Stoessel | C09K 11/06 548/440 |
| 2017/0092874 A1* | 3/2017 | Tanabe | H01L 51/0071 |
| 2017/0309828 A1* | 10/2017 | Tanabe | C07D 413/14 |
| 2018/0069182 A1 | 3/2018 | Hatakeyama et al. | |
| 2018/0094000 A1 | 4/2018 | Hatakeyama et al. | |
| 2018/0301629 A1 | 10/2018 | Hatakeyama et al. | |
| 2018/0366653 A1 | 12/2018 | He et al. | |
| 2019/0027694 A1 | 1/2019 | Hatakeyama et al. | |
| 2019/0058124 A1 | 2/2019 | Hatakeyama et al. | |
| 2019/0115537 A1 | 4/2019 | Makishima et al. | |
| 2019/0296254 A1 | 9/2019 | Ko et al. | |
| 2020/0106023 A1 | 4/2020 | Zhang et al. | |

FOREIGN PATENT DOCUMENTS

| | | | |
|---|---|---|---|
| CN | 106467554 A | 3/2017 | |
| CN | 106687561 A | 5/2017 | |
| CN | 107266484 A | 10/2017 | |
| CN | 107417715 A | 12/2017 | |
| CN | 107501311 A | 12/2017 | |
| CN | 108342192 A | 7/2018 | |
| CN | 109134520 A | 1/2019 | |
| CN | 110016055 A | 7/2019 | |
| CN | 110299457 A | 10/2019 | |
| DE | 196 48 256 A1 | 5/1997 | |
| EP | 3 508 490 A1 | 7/2019 | |
| JP | 4428772 B2 | 3/2010 | |
| JP | 4590825 B2 | 12/2010 | |
| JP | 2017-126606 A | 7/2017 | |
| JP | 2017-193618 A | 10/2017 | |
| JP | 2018-61028 A | 4/2018 | |
| JP | 2018-61029 A | 4/2018 | |
| JP | 2018-61030 A | 4/2018 | |
| KR | 10-2014-0103842 A | 8/2014 | |
| KR | 10-2017-0035376 A | 3/2017 | |
| KR | 10-2017-0037135 A | 4/2017 | |
| KR | 10-2018-0046851 A | 5/2018 | |
| WO | WO 2011/143563 A2 | 11/2011 | |
| WO | WO 2012/149999 A1 | 11/2012 | |
| WO | WO 2014/056565 A1 | 4/2014 | |
| WO | WO 2016/046350 A1 | 3/2016 | |
| WO | WO 2015/072537 A1 | 3/2017 | |
| WO | WO2015/102118 A1 | 3/2017 | |
| WO | WO 2017/092508 A1 | 6/2017 | |
| WO | WO2016/152418 A1 | 2/2018 | |
| WO | WO2016/152544 A1 | 2/2018 | |
| WO | WO 2018/047639 A1 | 3/2018 | |
| WO | WO 2018/062278 A1 | 4/2018 | |
| WO | WO2017/126443 A1 | 5/2018 | |
| WO | WO 2018/216990 A1 | 11/2018 | |
| WO | WO2017/138526 A1 | 12/2018 | |
| WO | WO2017/188111 A1 | 2/2019 | |
| WO | WO2017/195669 A1 | 4/2019 | |

OTHER PUBLICATIONS

Agou, Tomohiro et al.; Synthesis of π-Conjugated Dendrimers Based on Azaborine, Department of Chemistry, May 12, 2009, 63 pages.

Chinese Examination report for corresponding CN Application 202010050970.8 dated Jan. 27, 2024, 10pp.

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATIONS

This application claims priority to and the benefit of Korean Patent Application No. 10-2019-0011417, filed on Jan. 29, 2019, the entire content of which is incorporated herein by reference.

BACKGROUND

1. Field

Embodiments of the present disclosure herein relate to a polycyclic compound and an organic electroluminescence device including the polycyclic compound.

2. Description of the Related Art

Recently, the development of an organic electroluminescence display device as an image display device has been actively conducted. Unlike a liquid crystal display device, the organic electroluminescence display device is a so-called self-luminescent display device in which holes and electrons injected from a first electrode and a second electrode are recombined in an emission layer, and a light emission material, which is an organic compound included in the emission layer, emits light to realize a display (e.g., to display an image).

In the application of an organic electroluminescence device to a display device, the organic electroluminescence device should have a low driving voltage, high luminous efficiency and a long life-time, and accordingly development on materials for an organic electroluminescence device capable of stably realizing these features is continuously conducted.

Recently, to realize an organic electroluminescence device having high efficiency, technology relating to phosphorescence emission using a triplet state energy or delayed fluorescence emission using triplet-triplet annihilation (TTA), which is a phenomenon of generating a singlet exciton by collision of a triplet exciton excitation, has been developed, and development of a thermally activated delayed fluorescence (TADF) material using the delayed fluorescence phenomenon has been actively conducted.

SUMMARY

Embodiments of the present disclosure provides an organic electroluminescence device having a long life-time and high efficiency, and a polycyclic compound used therefor.

The present disclosure also provides an organic electroluminescence device including a thermally activated delayed fluorescence emission material and a polycyclic compound used as a thermally activated delayed fluorescence emission material.

An embodiment of the present disclosure provides an organic electroluminescence device including: a first electrode; a hole transport region on the first electrode; an emission layer on the hole transport region; an electron transport region on the emission layer; and a second electrode on the electron transport region, wherein the emission layer includes a polycyclic compound containing one electron donor and one electron acceptor, and the electron donor includes an azaborine group and the electron acceptor includes any one of a cyano group, a carbonyl group, a boron group, a sulfonyl group, a sulfinyl group, a phosphine oxide group, a nitrogen-containing five-membered ring, or a nitrogen-containing six-membered monocyclic ring.

In an embodiment, the electron acceptor may be directly bonded to nitrogen in the azaborine group or may be bonded through a linker to nitrogen in the azaborine group.

In an embodiment, the emission layer may emit delayed fluorescence and the emission layer may be a delayed fluorescence emission layer including a host and a dopant.

In an embodiment, the dopant may be the polycyclic compound.

In an embodiment, the emission layer may be a thermally activated delayed fluorescence emission layer emitting blue light.

In an embodiment, the polycyclic compound may be represented by Formula 1 below:

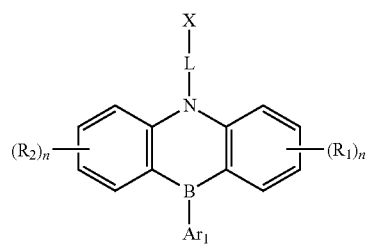

[Formula 1]

In Formula 1: $R_1$ and $R_2$ may each independently be a hydrogen atom, a deuterium atom, a halogen atom, a boron group, a substituted or unsubstituted amino group, a cyano group, a carbonyl group, a nitro group, a siloxy group, a silyl group, a phosphoryl group, a thiophosphoryl group, a substituted or unsubstituted thiol group, a sulfinyl group, a sulfonyl group, a substituted or unsubstituted alkoxy group having 1 to 20 carbon atoms, a substituted or unsubstituted aryloxy group having 6 to 30 ring-forming carbon atoms, a substituted or unsubstituted alkyl group having 1 to 20 carbon atoms, a substituted or unsubstituted aralkyl group having 7 to 30 carbon atoms, a substituted or unsubstituted aryl group having 6 to 30 ring-forming carbon atoms, or a substituted or unsubstituted heteroaryl group having 2 to 30 ring-forming carbon atoms, or may be bonded to adjacent groups to form a ring; L may be a single bond, a substituted or unsubstituted arylene group having 6 to 30 ring-forming carbon atoms, or a substituted or unsubstituted heteroarylene group having 2 to 30 ring-forming carbon atoms; $Ar_1$ may be a substituted or unsubstituted aryl group having 6 to 30 ring-forming carbon atoms, or a substituted or unsubstituted heteroaryl group having 2 to 30 ring-forming carbon atoms; m and n may each independently be an integer of 0 to 4; and X may be represented by any one among Formulae 2-1 to 2-8 below:

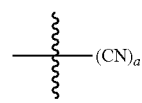

[Formula 2-1]

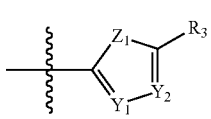
[Formula 2-2]

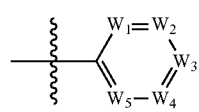
[Formula 2-3]

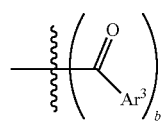
[Formula 2-4]

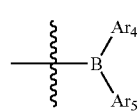
[Formula 2-5]

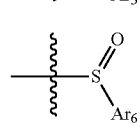
[Formula 2-6]

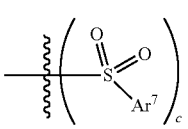
[Formula 2-7]

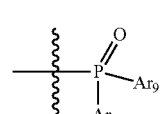
[Formula 2-8]

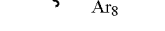

In Formulae 2-1 to 2-8: a to c may each independently be an integer of 1 to 4; $Z_1$ may be O, S, or $NAr_{10}$; $Y_1$ and $Y_2$ may each independently be N or $CR_4$ and at least one among $Y_1$ and $Y_2$ may be N; $W_1$ to $W_5$ may each independently be N or $CR_5$ and at least one among $W_1$ to $W_5$ may be N; $Ar_3$ to $Ar_{10}$ may each independently be a substituted or unsubstituted aryl group having 6 to 30 ring-forming carbon atoms or a substituted or unsubstituted heteroaryl group having 2 to 30 ring-forming carbon atoms, or may be bonded to adjacent groups to form a ring; $R_3$ and $R_4$ may each independently be a hydrogen atom, a deuterium atom, a halogen atom, a boron group, a substituted or unsubstituted amino group, a cyano group, a carbonyl group, a nitro group, an oxy group, a siloxy group, a silyl group, a phosphine oxide group, a phosphine sulfide group, a sulfinyl group, a sulfonyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to adjacent groups to form a ring; and $R_5$ may be a hydrogen atom, a deuterium atom, a halogen atom, a boron group, a substituted or unsubstituted amino group, a cyano group, a carbonyl group, a nitro group, an oxy group, a siloxy group, a silyl group, a phosphine oxide group, a phosphine sulfide group, a sulfinyl group, a sulfonyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms.

In an embodiment, $Ar_1$ may be represented by Formula 3 below:

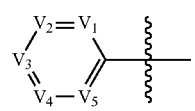
[Formula 3]

In Formula 3, $V_1$ to $V_5$ may each independently be N or $CR_6$, wherein $R_6$ may be a hydrogen atom, a deuterium atom, a halogen atom, a boron group, a substituted or unsubstituted amino group, a cyano group, a carbonyl group, an oxy group, a silyl group, a thiol group, a phosphine oxide group, a phosphine sulfide group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted aralkyl group having 7 to 30 carbon atoms, or a substituted or unsubstituted heteroaryl group having 2 to 30 ring-forming carbon atoms, or may be bonded to an adjacent group to form a ring.

In Formula 3, at least one among $V_1$ and $V_5$ may be $CR_7$, wherein $R_7$ may be a substituted or unsubstituted alkyl group having 2 to 20 carbon atoms.

In an embodiment, Formula 2-2 may be represented by any one among Formulae 2-2-1 to 2-2-5 below:

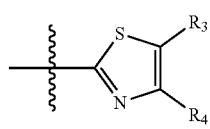
[Formula 2-2-1]

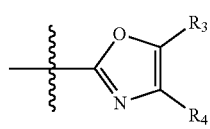
[Formula 2-2-2]

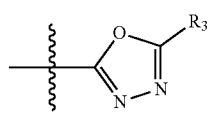
[Formula 2-2-3]

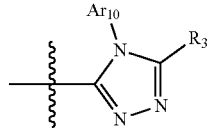
[Formula 2-2-4]

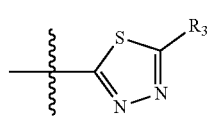
[Formula 2-2-5]

In Formulae 2-2-1 to 2-2-5, $R_3$, $R_4$, and $Ar_{10}$ may be the same as defined with respect to Formula 2-2.

In an embodiment, Formula 2-3 may be represented by any one among Formulae 2-3-1 to 2-3-5 below:

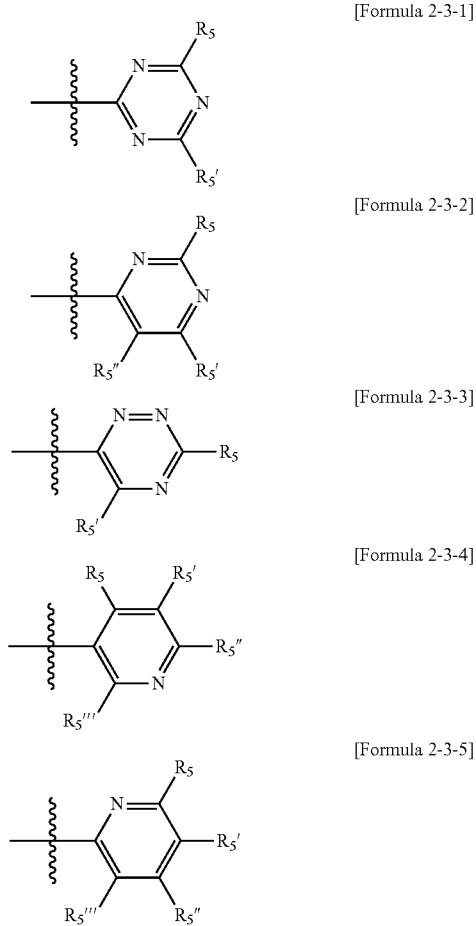

[Formula 2-3-1]

[Formula 2-3-2]

[Formula 2-3-3]

[Formula 2-3-4]

[Formula 2-3-5]

In Formulae 2-3-1 to 2-3-5, $R_5$, $R_5'$, $R_5''$, and $R_5'''$ may each independently be a hydrogen atom, a deuterium atom, a halogen atom, a boron group, a substituted or unsubstituted amino group, a cyano group, a carbonyl group, a nitro group, an oxy group, a siloxy group, a silyl group, a phosphine oxide group, a phosphine sulfide group, a sulfinyl group, a sulfonyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms.

In an embodiment, L may be a single bond (e.g., a direct bond), a substituted or unsubstituted phenylene group, or a substituted or unsubstituted bivalent biphenyl group.

In an embodiment, the compound represented by Formula 1 may be any one among compounds represented by Compound Group 1 herein below.

According to an embodiment of the present disclosure, an organic electroluminescence device includes: a first electrode; a hole transport region on the first electrode; an emission layer on the hole transport region; an electron transport region on the emission layer; and a second electrode on the electron transport region, wherein the emission layer includes a polycyclic compound represented by Formula 1.

In an embodiment of the present disclosure, a polycyclic compound is represented by Formula 1.

BRIEF DESCRIPTION OF THE DRAWINGS

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
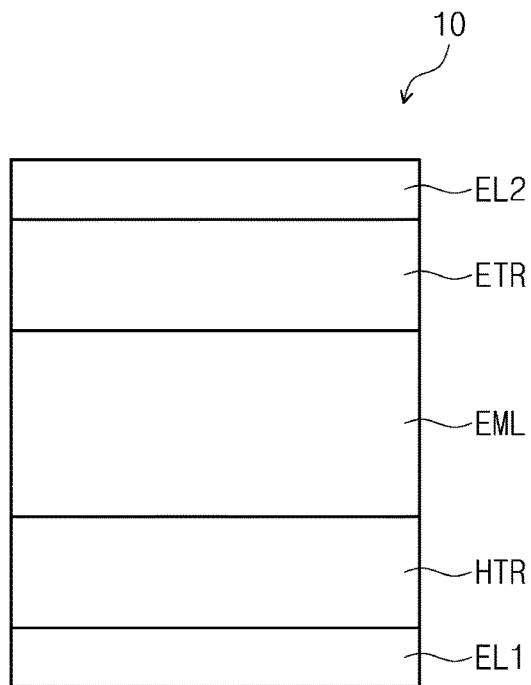
FIG. 1 is a cross-sectional view schematically illustrating an organic electroluminescence device according to an embodiment of the present disclosure.

The subject matter of the present disclosure may have various modifications and may be embodied in different forms, and example embodiments will be explained in more detail with reference to the accompany drawings. The subject matter of the present disclosure may, however, be embodied in different forms and should not be construed as being limited to the embodiments set forth herein. Rather, the present disclosure is intended to cover all modifications, equivalents, and substituents which are included in the spirit and scope of the appended claims, and equivalents thereof.

Like reference numerals refer to like elements throughout. In the drawings, the dimensions of structures may be exaggerated for clarity of illustration. It will be understood that, although the terms first, second, etc. may be used herein to describe various elements, these elements should not be limited by these terms. These terms are only used to distinguish one element from another element. For example, a first element could be termed a second element without departing from the teachings of the present disclosure. Similarly, a second element could be termed a first element. As used herein, the singular forms are intended to include the plural forms as well, unless the context clearly indicates otherwise.

In the present description, it should be understood that the term "comprise" or "have" intends to mean that there may be specified features, numerals, steps, operations, elements, parts, or combinations thereof, not excluding the possibility of the presence or addition of the specified features, numerals, steps, operations, elements, parts, or combinations thereof. It will also be understood that when a layer, a film, a region, a plate, etc. is referred to as being "on" another part, it can be "directly on" the other part, or intervening layers may also be present. In addition, it will also be understood that when an element or layer is referred to as being "between" two elements or layers, it can be the only element or layer between the two elements or layers, or one or more intervening elements or layers may also be present.

In the present description,

means a connecting position.

In the present description, the term "substituted or unsubstituted" corresponds to substituted or unsubstituted with at least one substituent selected from the group consisting of a deuterium atom, a halogen atom, a cyano group, a nitro group, an amino group, a silyl group, a boron group, a phosphine oxide group, a phosphine sulfide group, an alkyl group, an alkenyl group, an aryl group, and a heterocyclic group. In addition, each of the substituents exemplified above may be substituted or unsubstituted. For example, a biphenyl group may be interpreted as an aryl group or a phenyl group substituted with a phenyl group.

In the present description, the expression "being bonded to an adjacent group to form a ring" may mean being bonded to an adjacent group to form a substituted or unsubstituted hydrocarbon ring, or a substituted or unsubstituted heterocyclic ring. The hydrocarbon ring includes an aliphatic hydrocarbon ring and an aromatic hydrocarbon ring. The heterocyclic ring includes an aliphatic heterocyclic ring and an aromatic heterocyclic ring. The hydrocarbon ring and heterocyclic ring may be a monocyclic ring or a polycyclic ring. In addition, the ring formed by being bonded to an adjacent group may be connected to another ring to form a spiro structure.

In the present description, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentane, two ethyl groups may be interpreted as "adjacent groups" to each other.

In the present description, the halogen atom may be, for example, a fluorine atom, a chlorine atom, a bromine atom, or an iodine atom.

In the present description, the alkyl group may be a linear, branched, or cyclic type (e.g., a linear, branched, or cyclic alkyl group). The carbon number of the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, or the like, but the present disclosure is not limited thereto.

In the present description, the term "aryl group" means an optional functional group or substituent derived from an aromatic hydrocarbon ring. The aryl group may be a monocyclic aryl group or a polycyclic aryl group. The number of ring-forming carbon in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinqphenyl group, a sexiphenyl group, a triphenylenyl group, a pyrenyl group, a benzofluoranthenyl group, a chrysenyl group, or the like, but the present disclosure is not limited thereto.

In the present description, the fluorenyl group may be substituted, and two substituents may be combined with each other to form a spiro structure. Examples of a substituted fluorenyl group are as follows, but the present disclosure is not limited thereto.

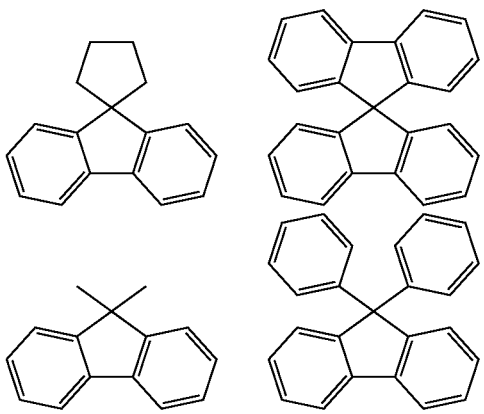

In the present description, the heteroaryl group may be a heteroaryl group including one or more of O, N, P, Si, or S as a heteroatom. The number of ring-forming carbon in the heteroaryl group may be 2 to 30 or 2 to 20. The heteroaryl group may be a monocyclic heteroaryl group or a polycyclic heteroaryl group. The polycyclic heteroaryl group may have, for example, a bicyclic structure or a tricyclic structure. Examples of the heteroaryl group may include a thiophene group, a furan group, a pyrrole group, an imidazole group, a thiazole group, an oxazole group, an oxadiazole group, a triazole group, a pyridyl group, a bipyridyl group, a pyrimidyl group, a triazine group, a triazole group, an acridyl group, a pyridazine group, a pyrazinyl group, a quinolinyl group, a quinazolinyl group, a quinoxalinyl group, a phenoxazyl group, a phthalazinyl group, a pyrido pyrimidinyl group, a pyrido pyrazinyl group, a pyrazino pyrazinyl group, an isoquinolinyl group, indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophenyl group, a dibenzothiophenyl group, a thienothiophenyl group, a benzofuranyl group, a phenanthrolinyl group, a thiazolyl group, an isooxazolyl, an oxadiazolyl group, a thiadiazolyl group, a benzothiazolyl group, a phenothiazinyl group, a dibenzosilole group, a dibenzofuranyl group, or the like, but the present disclosure is not limited thereto.

In the present description, the silyl group may include an alkylsilyl group and an arylsilyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, or the like, but the present disclosure is not limited thereto.

In the present description, the carbon number of the amine group is not particularly limited, but may be 1 to 30. The amine group may include an alkylamine group or an arylamine group. Examples of the amine group may include a methylamine group, a dimethylamine group, a phenylamine group, a naphthylamine group, a 9-methyl-anthracenylamine group, a triphenylamine group, or the like, but the present disclosure is not limited thereto.

In the present description, the explanation of the described aryl group may also be applied to the arylene group, except that the arylene group is a divalent group.

In the present description, the explanation of the described heteroaryl group may also be applied to the heteroarylene group, except that the heteroarylene group is a divalent group.

In the present description, the explanation of the described aryl group may also be applied to the aralkyl group, except that the aralkyl group is substituted with alkyl group. In the present description of the alkyl group of the aralkyl group, the explanation of the described alkyl group may also be applied.

Hereinafter, an organic electroluminescence device according to an embodiment of the present disclosure will be explained with reference to FIGS. 1 to 3.

Figure 2:
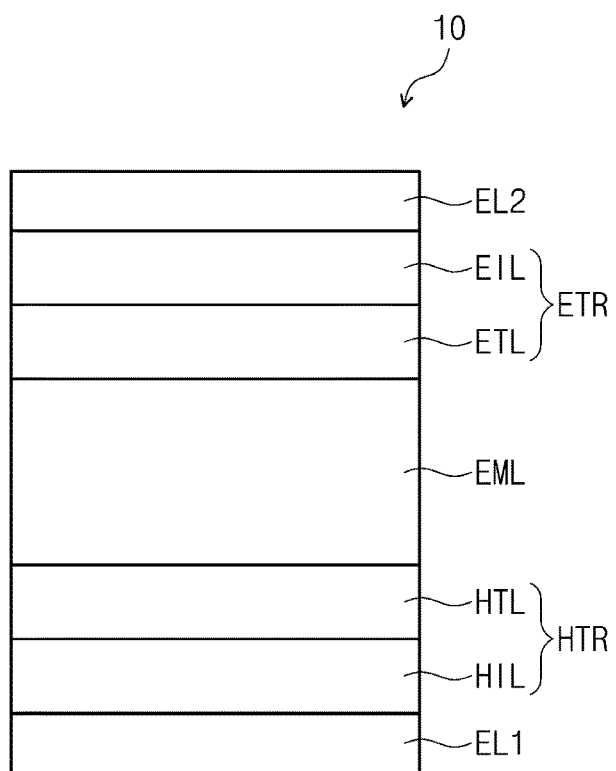
FIG. 2 is a cross-sectional view schematically illustrating an organic electroluminescence device according to an embodiment of the present disclosure.
Figure 3:
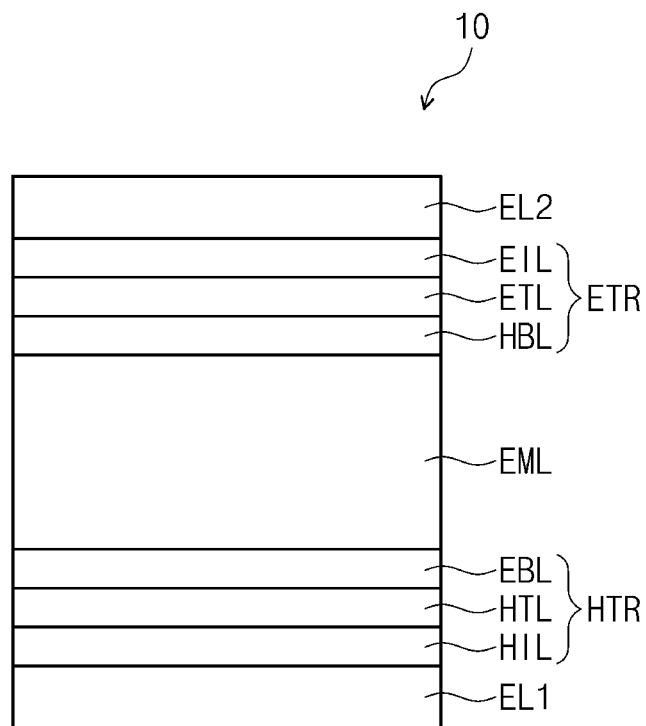
FIG. 3 is a cross-sectional view schematically illustrating an organic electroluminescence device according to an embodiment of the present disclosure.

As referring to FIGS. 1 to 3, an organic electroluminescence device 10 according to an embodiment may include a first electrode EL1, a hole transport region HTR, an emission layer EML, an electron transport region ETR, and a second electrode EL2, which are sequentially laminated.

The first electrode EL1 and the second electrode EL2 may to face each other, and a plurality of organic layers may be between the first electrode EL1 and the second electrode EL2. The plurality of organic layers may include a hole transport region HTR, an emission layer EML, and an electron transport region ETR. The organic electroluminescence device 10 of an embodiment may include a polycyclic compound of the described embodiment in the emission layer EML.

As compared with FIG. 1, FIG. 2 illustrates a cross-sectional view of an organic electroluminescence device 10 according to an embodiment in which a hole transport region HTR includes a hole injection layer HIL and a hole transport layer HTL and an electron transport region ETR includes an electron injection layer EIL and an electron transport layer ETL. In addition, as compared with FIG. 1, FIG. 3 illustrates a cross-sectional view of an organic electroluminescence device 10 according to an embodiment in which a hole transport region HTR includes a hole injection layer HIL, a hole transport layer HTL, and an electron blocking layer EBL and an electron transport region ETR includes an electron injection layer EIL, an electron transport layer ETL, and a hole blocking layer HBL.

An organic electroluminescence device 10 of an embodiment illustrated in FIGS. 1 to 3 may include a polycyclic compound of an embodiment containing one electron donor and one electron acceptor in at least one organic layer among the plurality of organic layers. In the polycyclic compound of an embodiment, the electron donor may include an azaborine group and the electron acceptor may include any one of a cyano group, a carbonyl group, a boron group, a sulfonyl group, a sulfinyl group, a phosphine oxide group, a nitrogen-containing five-membered ring, or a nitrogen-containing six-membered monocyclic ring.

In an organic electroluminescence device 10 of an embodiment, the first electrode EL1 may have conductivity (e.g., electrical conductivity). The first electrode EL1 may be formed of a metal alloy or a conductive compound. The first electrode EL1 may be an anode.

The first electrode EL1 may be a transmissive electrode, a transflective electrode, or a reflective electrode. When the first electrode EL1 is a transmissive electrode, the first electrode EL1 may be formed of a transparent metal oxide, for example, indium tin oxide (ITO), indium zinc oxide (IZO), zinc oxide (ZnO), indium tin zinc oxide (ITZO), or the like. When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound or a mixture thereof (for example, a mixture of Ag and Mg). In some embodiments, the first electrode EL1 may have a structure which has a plurality of layers including: a reflective layer or a transflective layer formed of any of the described materials; and a transparent conductive layer formed of ITO, IZO, ZnO, ITZO, or the like. For example, the first electrode EL1 may have a multi-layered structure of ITO/Ag/ITO.

The hole transport region HTR may be on the first electrode EL1. The hole transport region HTR may include at least one of a hole injection layer HIL, a hole transport layer HTL, a hole buffer layer, or an electron blocking layer EBL.

The hole transport region HTR may have a structure of: a single layer formed of a single material; a single layer formed of a plurality of different materials; or a multi-layer having a plurality of layers formed of a plurality of different materials.

For example, the hole transport region HTR may have a structure of a single layer which is a hole injection layer HIL or a hole transport layer HTL, or may have a structure of a single layer formed of a hole injection material and a hole transport material. In some embodiments, the hole transport region HTR may have a structure of a single layer formed of a plurality of different materials, or may have a structure of, sequentially laminated from the first electrode EL1, hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, but the present disclosure is not limited thereto.

The hole transport region HTR may be formed by using various suitable methods such as a vacuum deposition method, a spin coating method, a casting method, a Langmuir-Blodgett (LB) method, an inkjet printing method, a laser printing method, or a laser induced thermal imaging (LITI) method.

The hole injection layer HIL according to an organic electroluminescence device 10 of an embodiment may include any suitable hole injection material generally available in the art. In some embodiments, the hole injection layer HIL may include triphenylamine-containing polyetherketone (TPAPEK), 4-isopropyl-4'-methyldiphenyliodoniumtetrakis(pentafluorophenyl)borate (PPBI), N,N'-diphenyl-N,N'-bis-[4-(phenyl-m-tolyl-amino)-phenyl]-phenyl-4, 4'-diamine (DNTPD), a phthalocyanine compound such as copper phthalocyanine, 4,4',4"-tris(3-methylphenylphenylamino)triphenylamine (m-MTDATA), N,N'-di(1-naphthyl)-N,N'-diphenylbenzidine (NPB), N,N'-bis(1-naphthyl)-N,N'-diphenyl-4,4'-diamine (α-NPD), 4,4',4"-tris(N,N-diphenylamino)triphenylamine (TDATA), 4,4',4"-tris(N,N-2-naphthylphenylamino)triphenylamine (2-TNATA), polyaniline/dodecylbenzene sulfonic acid (PANI/DBSA), poly(3,4-ethylenedioxythiophene)/poly(4-styrenesulfonate) (PEDOT/PSS), polyaniline/camphorsulfonic acid (PANI/CSA), polyaniline/poly(4-styrenesulfonate) (PANI/PSS), dipyrazino[2,3-f:2',3'-h]quinoxaline-2,3,6,7,10,11-hexacarbonitrile (HAT-CN), or the like, but the present disclosure is not limited thereto.

The hole transport layer HTL according to an organic electroluminescence device 10 of an embodiment may include any suitable hole transport material generally available in the art such as, for example, 1,1-bis[(di-4-tolylamino)phenyl]cyclohexane (TAPC), a carbazole derivative such as N-phenylcarbazole and polyvinylcarbazole, N,N'-bis(3-methylphenyl)-N,N'-diphenyl-(1,1-biphenyl)-4,4'-diamine (TPD), 4,4',4"-tris(N-carbazolyl)triphenylamine (TCTA), N,N'-di(1-naphthyl)-N,N'-diphenylbenzidine (NPB), N,N'-bis(1-naphthyl)-N,N'-diphenyl-4,4'-diamine (α-NPD), or the like, but the present disclosure is not limited thereto.

In some embodiments, the hole transport region HTR may further include an electron blocking layer EBL, and the electron blocking layer EBL may be between the hole transport layer HTL and the emission layer EML. The electron blocking layer EBL may serve to prevent or reduce electron injection from the electron transport region ETR to the hole transport region HTR.

The electron blocking layer EBL may include any suitable material generally available in the art. In some embodiments, the electron blocking layer may include a carbazole-based derivative such as N-phenylcarbazole and polyvinylcarbazole, a fluorine-based derivative, a triphenylamine-based derivative such as N,N'-bis(3-methylphenyl)-N,N'-diphenyl-(1,1-biphenyl)-4,4'-diamine (TPD) and 4,4',4"-tris(N-carbazolyl)triphenylamine (TCTA), N,N'-di(naphthalene-1-yl)-N,N'-diphenyl-benzidine (NPB), 4,4'-cyclohexylidene-bis[N,N-bis(4-methylphenyl)benzenamine] (TAPC), 4,4'-bis[N,N'-(3-tolyl)amino]-3,3'-dimethylbiphenyl (HMTPD), mCP, or the like, and the electron blocking layer EBL may also include a polycyclic compound according to an embodiment of the present disclosure as described.

A thickness of the hole transport region HTR may be about 100-10000 Å, for example, about 100-5000 Å. A thickness of the hole injection layer HIL may be, for example, about 30-1000 Å, and a thickness of the hole transport layer HTL may be about 30-1000 Å. A thickness of the electron blocking layer EBL may be, for example, about 10-1000 Å. When the thicknesses of the hole transport region HTR, the hole injection layer HIL, the hole transport layer HTL, and the electron blocking layer EBL satisfy the ranges described herein, suitable or satisfactory hole transport performance may be achieved without a substantial rise of a driving voltage.

The hole transport region HTR may further include a charge-generating material in addition to the described materials to improve conductivity (e.g., electrical conductivity). The charge-generating material may be uniformly or ununiformly dispersed in the hole transport region HTR. The charge-generating material may be, for example, a p-dopant. The p-dopant may be one of a quinone derivative, a metal oxide, or a cyano group-containing compound, but the present disclosure is not limited thereto. The non-limited examples of the p-dopant may be, for example, a quinone derivative (such as tetracyanoquinodimethane (TCNQ) and 2,3,5,6-tetrafluoro-tetracyanoquinodimethane (F4-TCNQ)), a metal oxide (such as a tungsten oxide and a molybdenum oxide), or the like, but the present disclosure is not limited thereto.

As described herein, the hole transport region HTR may further include at least one of the hole buffer layer or the electron blocking layer EBL in addition to the hole injection layer HIL and the hole transport layer HTL. The hole buffer layer may improve luminous efficiency by compensating for a resonance distance depending on the wavelength of the light emitted from the emission layer EML. The materials contained in the hole transport region HTR may also be used as materials contained in the hole buffer layer.

The emission layer EML may be on the hole transport region HTR. A thickness of the emission layer EML may be, for example, about 100-600 Å. The emission layer EML may have a structure of: a single layer formed of a single material; a single layer formed of a plurality of different materials; or a multi-layer having a plurality of layers formed of a plurality of different materials.

The emission layer EML may be formed by using various suitable methods such as a vacuum deposition method, a spin coating method, a casting method, a Langmuir-Blodgett (LB) method, an inkjet printing method, a laser printing method, and a laser induced thermal imaging (LITI) method.

The emission layer EML may emit one of red light, green light, blue light, white light, yellow light, or cyan light. The emission layer EML may include a fluorescence emission material or a phosphorescence emission material.

In an embodiment, the emission layer may include a polycyclic compound containing one electron donor and one electron acceptor. In the polycyclic compound, the electron donor may include an azaborine group and the electron acceptor may include any one of a cyano group, a carbonyl group, a boron group, a sulfonyl group, a sulfinyl group, a phosphine oxide group, a nitrogen-containing five-membered ring, or a nitrogen-containing six-membered monocyclic ring.

In the polycyclic compound, the electron acceptor may be directly bonded to nitrogen in the azaborine group or may be bonded through a linker to nitrogen in the azaborine group.

In an embodiment, the emission layer EML may be a fluorescence emission layer. For example, some of the lights emitted from the emission layer EML may be emitted by thermally activated delayed fluorescence (TADF). For example, the emission layer EML may include emission components which emit thermally activated delayed fluorescence, and in an embodiment, the emission layer EML may be a thermally activated delayed fluorescence emission layer which emits blue light.

In an embodiment, the emission layer EML may include a polycyclic compound containing one electron donor and one electron acceptor. In some embodiments, in an embodiment, the emission layer EML may include a host and a dopant, and the dopant may include a polycyclic compound containing one electron donor and one electron acceptor.

The polycyclic compound may have, for example, a structure represented by Formula 1 below:

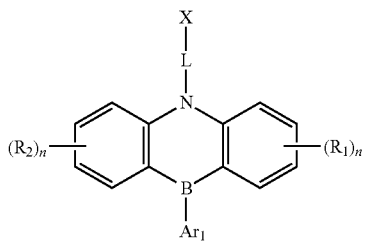

[Formula 1]

In Formula 1, $R_1$ and $R_2$ may each independently be a hydrogen atom, a deuterium atom, a halogen atom, a boron group, a substituted or unsubstituted amino group, a cyano group, a carbonyl group, a nitro group, a siloxy group, a silyl group, a phosphoryl group, a thiophosphoryl group, a substituted or unsubstituted thiol group, a sulfinyl group, a sulfonyl group, a substituted or unsubstituted alkoxy group having 1 to 20 carbon atoms, a substituted or unsubstituted aryloxy group having 6 to 30 ring-forming carbon atoms, a substituted or unsubstituted alkyl group having 1 to 20 carbon atoms, a substituted or unsubstituted aralkyl group having 7 to 30 carbon atoms, a substituted or unsubstituted aryl group having 6 to 30 ring-forming carbon atoms, or a substituted or unsubstituted heteroaryl group having 2 to 30 ring-forming carbon atoms, or may be bonded to adjacent groups to form a ring. The aralkyl group may have 6 to 30 ring-forming carbon atoms.

In Formula 1, m and n may each independently be an integer of 0 to 4. In some embodiments, when m is an integer of 2 or larger, a plurality of $R_1$'s may be the same as or different from each other and when n is an integer of 2 or larger, a plurality of $R_2$'s may be the same as or different from each other.

In Formula 1, L may be a single bond (e.g., a direct bond), a substituted or unsubstituted arylene group having 6 to 30 ring-forming carbon atoms, or a substituted or unsubstituted heteroarylene group having 2 to 30 ring-forming carbon atoms.

In Formula 1, $Ar_1$ may be a substituted or unsubstituted aryl group having 6 to 30 ring-forming carbon atoms, or a substituted or unsubstituted heteroaryl group having 2 to 30 ring-forming carbon atoms.

In Formula 1, X may be represented by any one among Formulae 2-1 to 2-8 below:

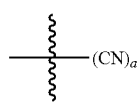

[Formula 2-1]

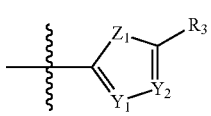

[Formula 2-2]

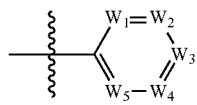

[Formula 2-3]

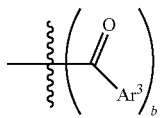

[Formula 2-4]

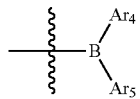

[Formula 2-5]

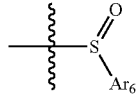

[Formula 2-6]

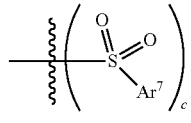

[Formula 2-7]

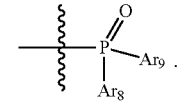

[Formula 2-8]

In Formula 2-2: $Z_1$ may be O, S, or $NAr_{10}$; $Y_1$ and $Y_2$ may each independently be N or $CR_4$ and at least one among $Y_1$ and $Y_2$ may be N; and $R_3$ and $R_4$ may each independently be a hydrogen atom, a deuterium atom, a halogen atom, a boron group, a substituted or unsubstituted amino group, a cyano group, a carbonyl group, a nitro group, an oxy group, a siloxy group, a silyl group, a phosphine oxide group, a phosphine sulfide group, a sulfinyl group, a sulfonyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl ring having 2 to 30 ring-forming carbon atoms, or may be bonded to adjacent groups to form a ring.

In Formula 2-3: $W_1$ to $W_5$ may each independently be N or $CR_5$ and at least one among $W_1$ to $W_5$ may be N; and $R_5$ may be a hydrogen atom, a deuterium atom, a halogen atom, a boron group, a substituted or unsubstituted amino group, a cyano group, a carbonyl group, a nitro group, an oxy group, a siloxy group, a silyl group, a phosphine oxide group, a phosphine sulfide group, a sulfinyl group, a sulfonyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl ring having 2 to 30 ring-forming carbon atoms.

In Formulae 2-1 to 2-8: a to c may each independently be an integer of 1 to 4; and $Ar_3$ to $Ar_{10}$ may each independently be a substituted or unsubstituted aryl group having 6 to 30 ring-forming carbon atoms or a substituted or unsubstituted heteroaryl group having 2 to 30 ring-forming carbon atoms, or may be bonded to adjacent groups to form a ring.

In some embodiments, Formula 2-1 may be an embodiment including a cyano group as an electron acceptor and one or more cyano groups may be included. Formula 2-2 may be an embodiment including a nitrogen-containing five-membered ring as an electron acceptor, and for example, a nitrogen-containing five-membered monocyclic ring or a nitrogen-containing five-membered polycyclic ring may be included. Formula 2-3 may be an embodiment including a nitrogen-containing six-membered monocyclic ring as an electron acceptor. Formula 2-4 may be an embodiment including a carbonyl group as an electron acceptor and one or more carbonyl groups may be included. Formula 2-5 may be an embodiment including a boron group as an electron acceptor and Formula 2-6 may be an embodiment including a sulfinyl group as an electron acceptor. Formula 2-7 may be an embodiment including a sulfonyl group as an electron acceptor and one or more sulfonyl groups may be included. Formula 2-8 may be an embodiment including a phosphine oxide group as an electron acceptor.

In the polycyclic compound of an embodiment represented by Formula 1, the

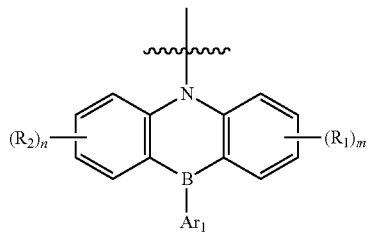

portion, which is an azaborine portion, may be an electron donor and the X portion

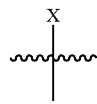

in Formula 1 may be an electron acceptor.

The polycyclic compound may include an azaborine group containing boron as an electron donor and include X in Formula 1 represented by Formulae 2-1 to 2-8 as an electron acceptor, and the electron acceptor may be directly bonded to the nitrogen in the electron donor or be bonded through a linker to the nitrogen in the electron donor, thereby exhibiting an excellent effect, and for example, as the polycyclic compound is used as a thermally activated delayed fluorescence emission material, thereby improving efficiency of the organic electroluminescence device.

In Formula 1, when L corresponding to the linker is a single bond (e.g., a direct bond), the electron acceptor may be directly bonded to the electron donator and when L corresponding to the linker is a substituted or unsubstituted arylene group having 6 to 30 ring-forming carbon atoms or a substituted or unsubstituted heteroarylene group having 2 to 30 ring-forming carbon atoms, the electron acceptor may be bonded to the electron donator through L.

In an embodiment, L in Formula 1 may be a single bond (e.g., a direct bond), a substituted or unsubstituted phenylene group, or a substituted or unsubstituted bivalent biphenyl group.

In an embodiment, An may be represented by Formula 3 below:

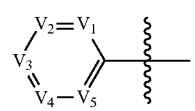

[Formula 3]

In Formula 3, $V_1$ to $V_5$ may each independently be N or $CR_6$, wherein $R_6$ may be a hydrogen atom, a deuterium atom, a halogen atom, a boron group, a substituted or unsubstituted amino group, a cyano group, a carbonyl group, an oxy group, a silyl group, a thiol group, a phosphine oxide group, a phosphine sulfide group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted aralkyl group having 7 to 30 carbon atoms, or a substituted or unsubstituted heteroaryl group having 2 to 30 ring-forming carbon atoms, or may be bonded to an adjacent group to form a ring.

In an embodiment, at least one among $V_1$ and $V_5$ may be $CR_7$, wherein $R_7$ may be a substituted or unsubstituted amino group, a substituted or unsubstituted alkyl group having 2 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms.

In an embodiment, $R_7$ may be a substituted or unsubstituted alkyl group having 2 to 20 carbon atoms. In another embodiment, $R_7$ may be an alkyl group having at least one branch and having 3 to 20 carbon atoms. When a substituent which has the same (e.g., substantially the same) volume such as an alkyl group having 2 to 20 carbon atoms is introduced near the boron B in Formula 1, the unstable boron may be three-dimensionally protected to contribute to improvement of the device characteristics.

In an embodiment, $V_1$ and $V_5$ may each independently be $CR_7$.

In an embodiment, Formula 3 may be a substituted or unsubstituted phenyl group.

In an embodiment, Formula 2-2 may be represented by any one among Formulae 2-2-1 to 2-2-5 below:

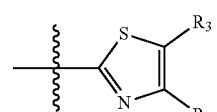

[Formula 2-2-1]

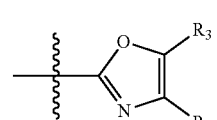

[Formula 2-2-2]

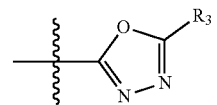

[Formula 2-2-3]

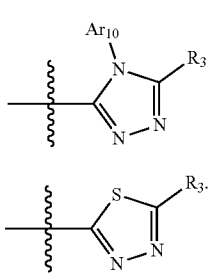

[Formula 2-2-4]

[Formula 2-2-5]

In Formulae 2-2-1 to 2-2-5, $R_3$, $R_4$, and $Ar_{10}$ may be the same as defined with respect to Formula 2-2. In some embodiments, Formulae 2-2-1 and 2-2-5 may represent embodiments in which $Z_1$ in Formula 2-2 is S, Formulae 2-2-2 and 2-2-3 may represent embodiments in which $Z_1$ is O, and Formula 2-2-4 may represent an embodiment in which $Z_1$ is $NAr_{10}$.

In an embodiment, Formula 2-3 may be represented by any one among Formulae 2-3-1 to 2-3-5 below:

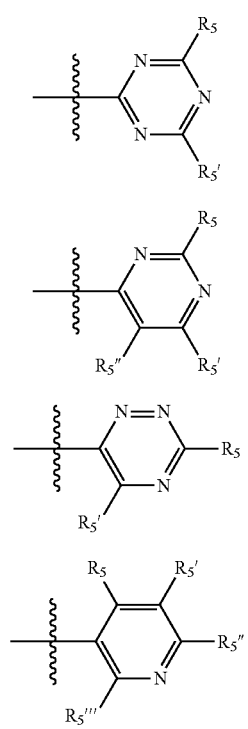

[Formula 2-3-1]

[Formula 2-3-2]

[Formula 2-3-3]

[Formula 2-3-4]

[Formula 2-3-5]

In Formulae 2-3-1 to 2-3-5, $R_5$, $R_5'$, $R_5''$, and $R_5'''$ may each independently be a hydrogen atom, a deuterium atom, a halogen atom, a boron group, a substituted or unsubstituted amino group, a cyano group, a carbonyl group, a nitro group, an oxy group, a siloxy group, a silyl group, a phosphine oxide group, a phosphine sulfide group, a sulfinyl group, a sulfonyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms.

Furthermore, a substituent of the "substituted or unsubstituted" in $R_1$ to $R_4$ in Formula 1 may exclude a cyano group. For example, the substituents in $R_1$ to $R_4$ may each independently be a hydrogen atom, a fluorine atom, a methyl group, an unsubstituted aryl group having 6 to 30 ring-forming carbon atoms, or an unsubstituted heteroaryl group having 2 to 30 ring-forming carbon atoms.

In an embodiment, Formula 1 may be represented by any one among Formulae 4-1 to 4-5 below:

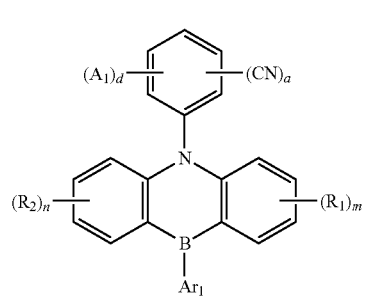

[Formula 4-1]

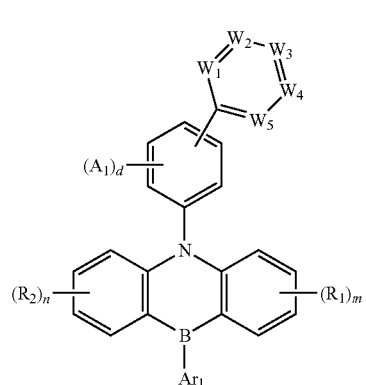

[Formula 4-2]

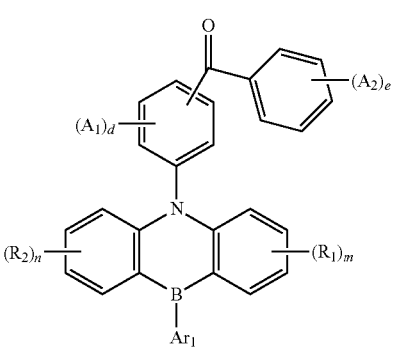

[Formula 4-3]

-continued

[Formula 4-4]

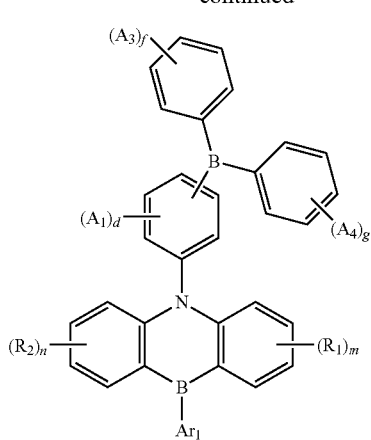

[Formula 4-5]

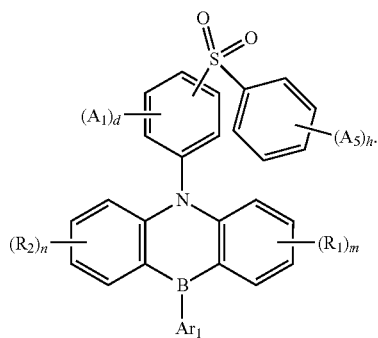

In Formulae 4-1 to 4-5, $A_1$ to $A_5$ may each independently be a hydrogen atom, a deuterium atom, a halogen atom, a boron group, a substituted or unsubstituted amino group, a cyano group, a carbonyl group, an oxy group, a silyl group, a thiol group, a phosphine oxide group, a phosphine sulfide group, a substituted or unsubstituted alkyl group having 1 to 20 carbon atoms, a substituted or unsubstituted aryl group having 6 to 30 ring-forming carbon atoms, an aralkyl group having 7 to 30 carbon atoms, or a substituted or unsubstituted heteroaryl group having 2 to 30 ring-forming carbon atoms, or may be bonded to adjacent groups to form a ring.

In Formulae 4-1 to 4-5, d to h may each independently be an integer of 0 to 4. In some embodiments, when d is an integer of 2 or larger, a plurality of $A_1$'s may be the same as or different from each other, when e is an integer of 2 or larger, a plurality of $A_2$'s may be the same as or different from each other, when f is an integer of 2 or larger, a plurality of $A_3$'s may be the same as or different from each other, when g is an integer of 2 or larger, a plurality of $A_4$'s may be the same as or different from each other, and when h is an integer of 2 or larger, a plurality of $A_5$'s may be the same as or different from each other. In some embodiments, in Formula 4-1, the sum of d and a is an integer of 0 to 5.

In Formulae 4-1 to 4-5, $W_1$ to $W_5$, $R_1$, $R_2$, $Ar_1$, a, m, and n may be the same as defined with respect to Formulae 1 and 2.

The polycyclic compound of an embodiment represented by Formula 1 may be a delayed fluorescence emission material. For example, the polycyclic compound of an embodiment may be a thermally activated delayed fluorescence material.

The polycyclic compound of an embodiment represented by Formula 1 may have an absolute value (ΔEst) of a difference between a singlet energy level (S1) and a triplet energy level (T1) of 0.25 eV or less. For example, S1−T1=0.25 eV (or S1−T1≤0.25 eV).

For example, the polycyclic compound represented by Formula 1 has a small difference between a singlet energy level (S1) and a triplet energy level (T1), and accordingly, the polycyclic compound may be used as a thermally activated delayed fluorescence emission material. In some embodiments, the polycyclic compound represented by Formula 1 may be used as a blue light emission material which emits thermally activated delayed fluorescence. Embodiments of the present disclosure, however, are not limited thereto, and the polycyclic compound of an embodiment may be a thermally activated delayed fluorescence material which emits green light or red light.

The polycyclic compound of an embodiment represented by Formula 1 may be any one among compounds represented by Compound Group 1 below:

Compound Group 1

1

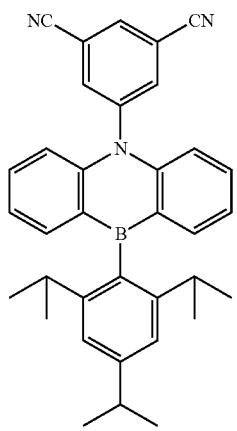

2

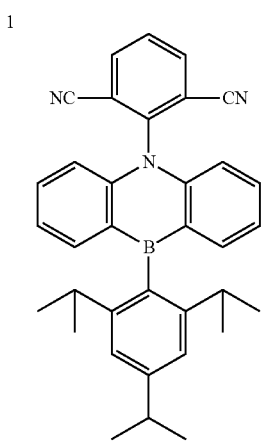

-continued
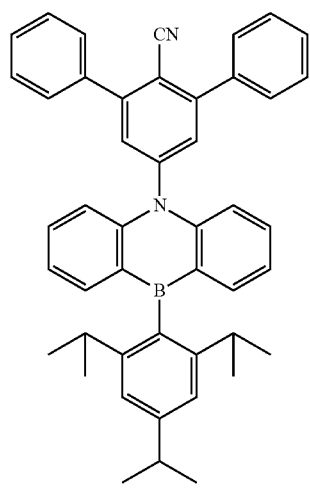
3
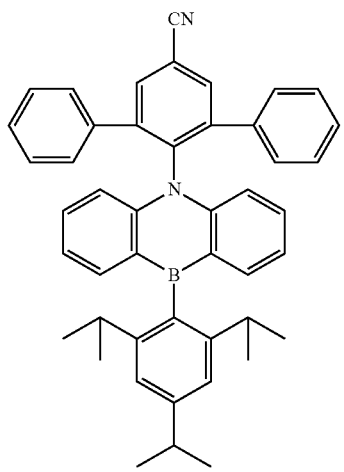
4
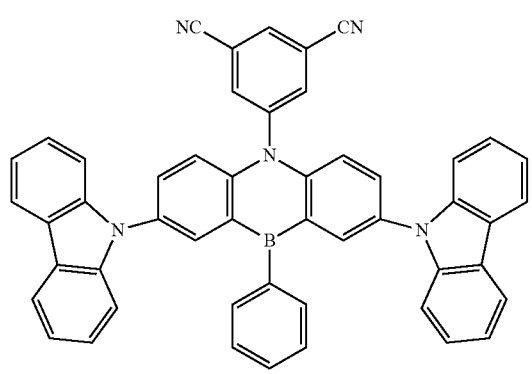
5
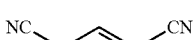
6
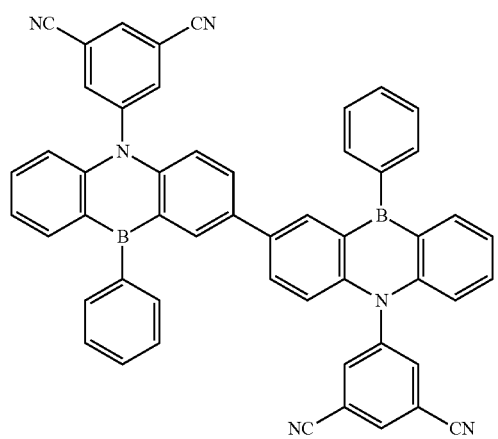
7
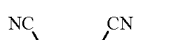
8
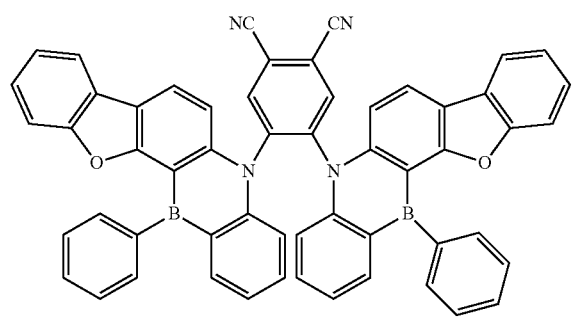
9
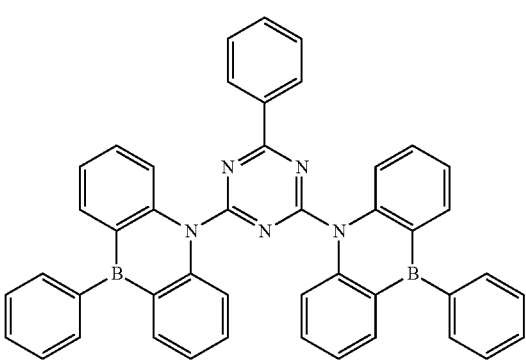
11

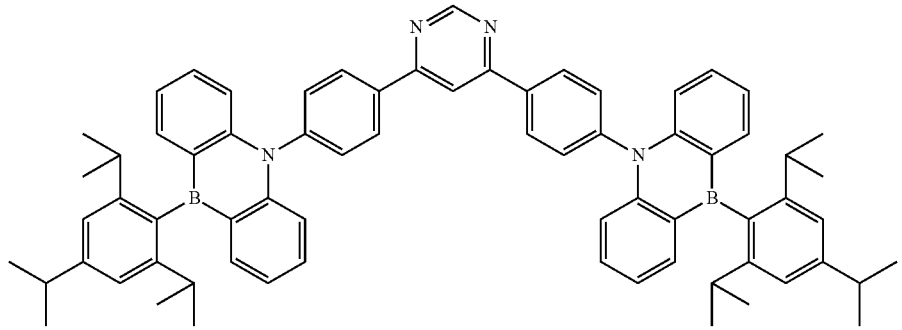
12
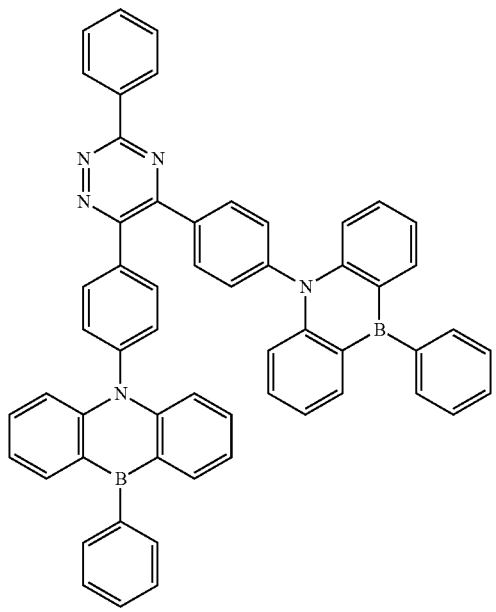
13
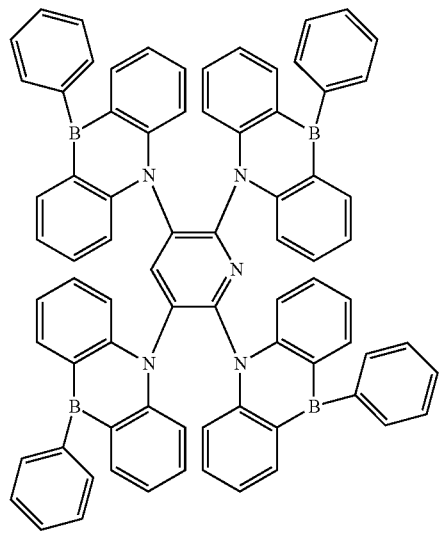
14
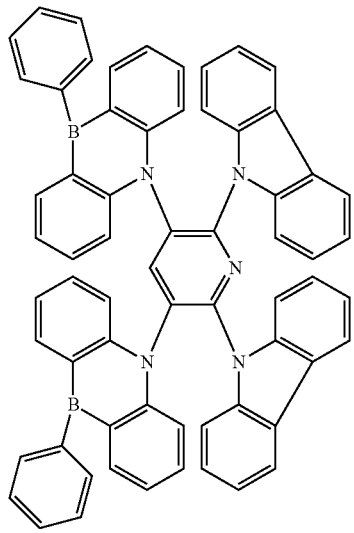
15
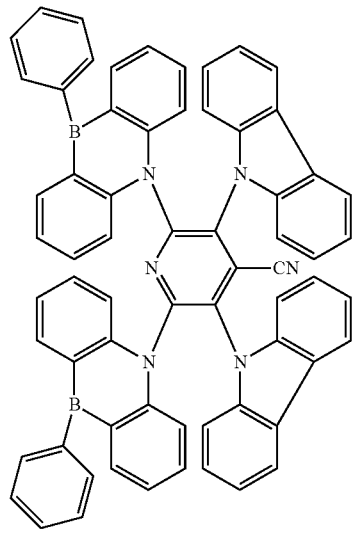
16

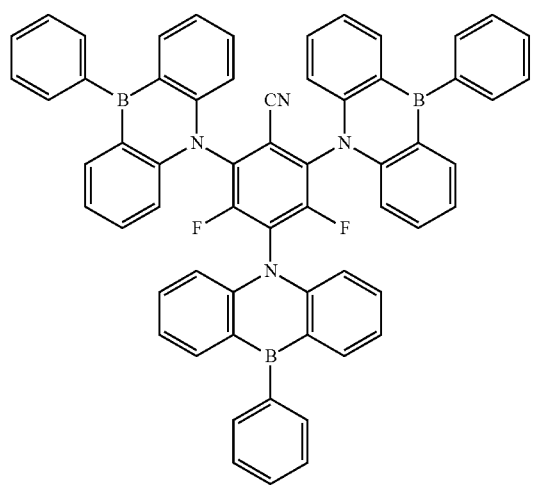
17
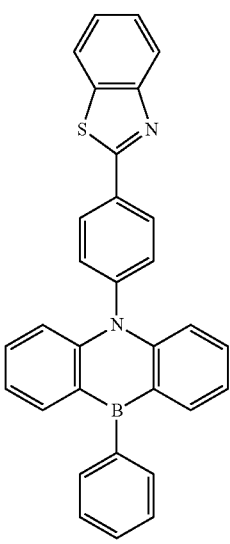
18
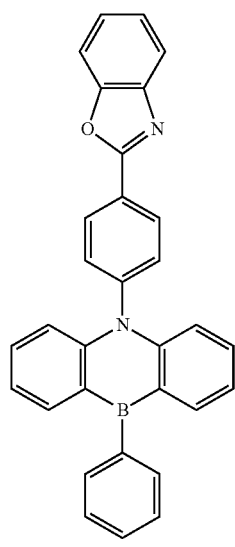
19
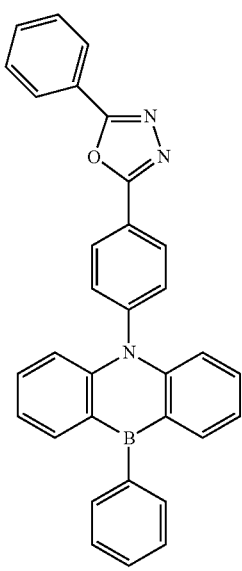
20

-continued
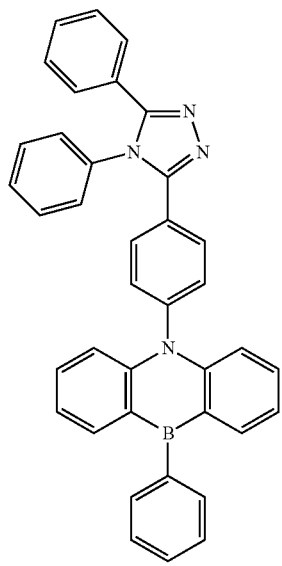
21
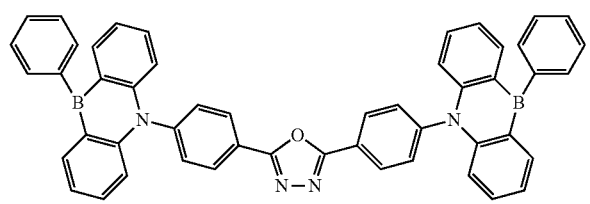
22
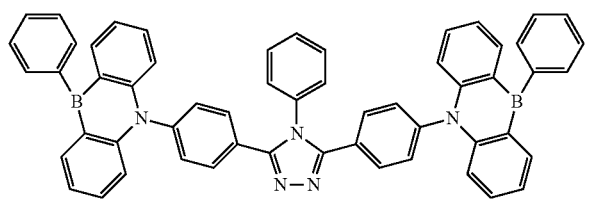
23
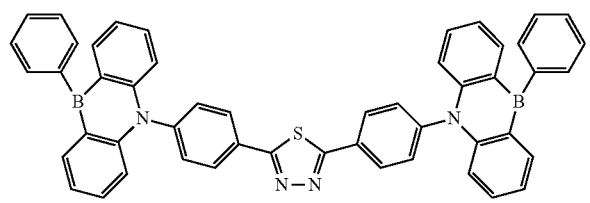
24
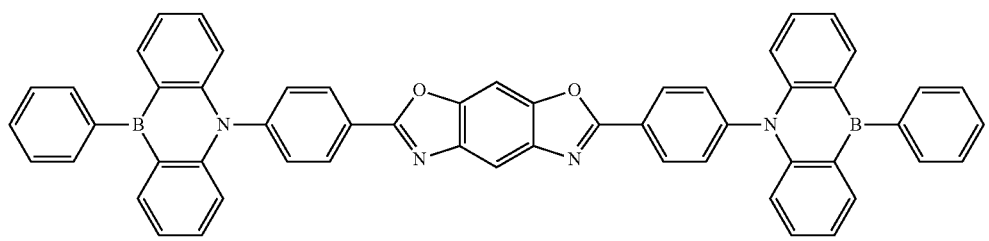
25
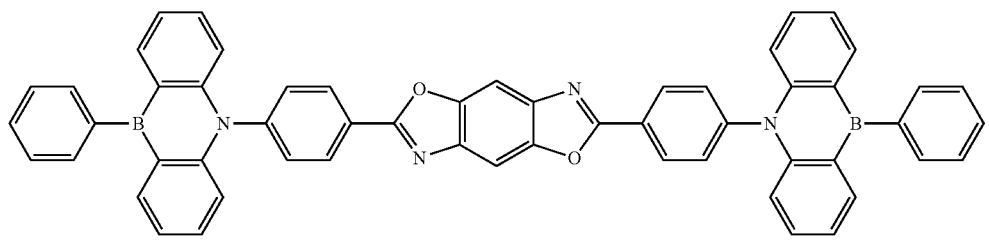
26
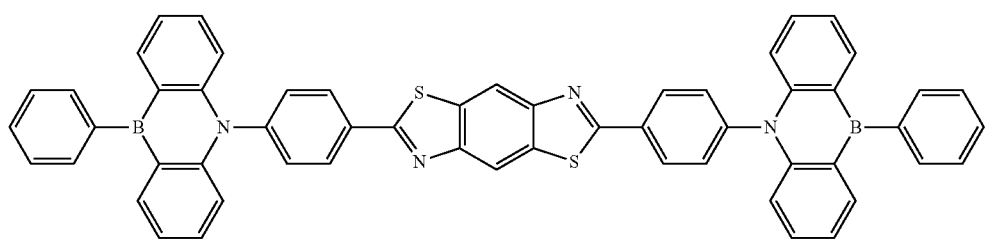
27

28
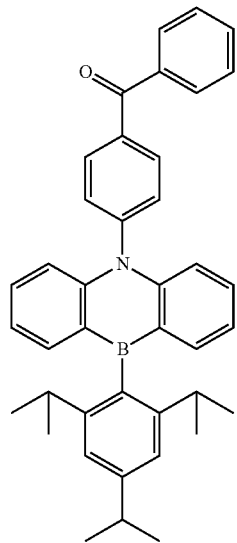
29
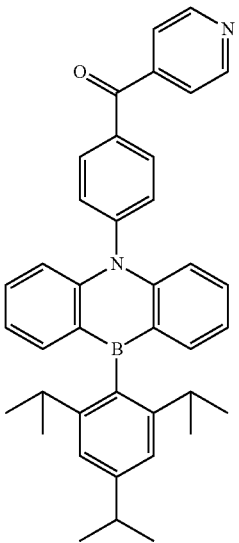
30
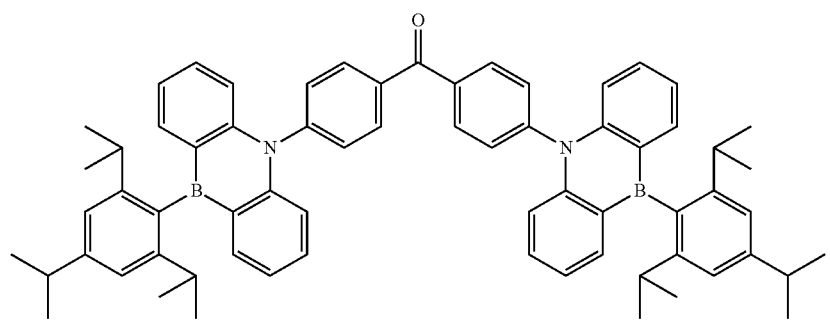
31
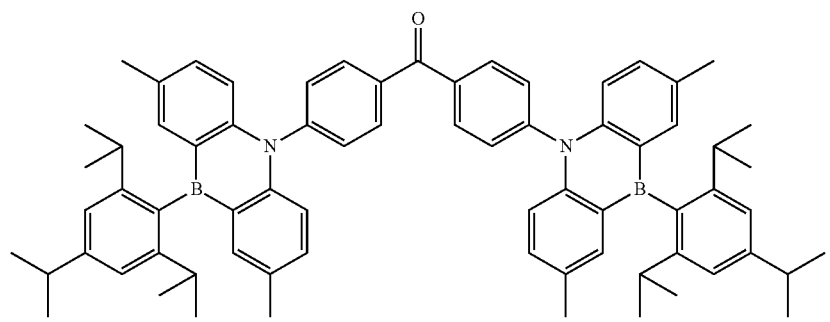
32
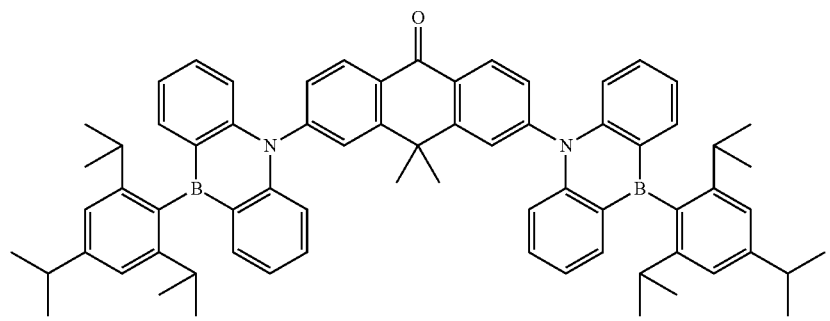

33
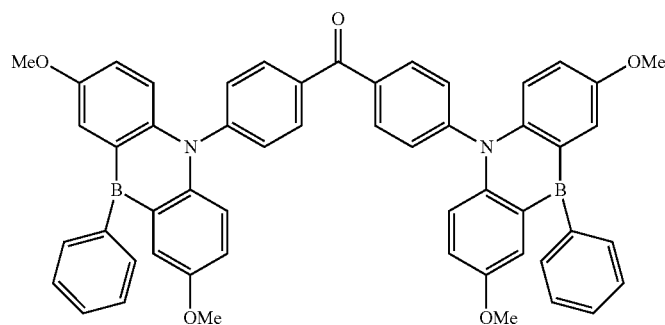
34
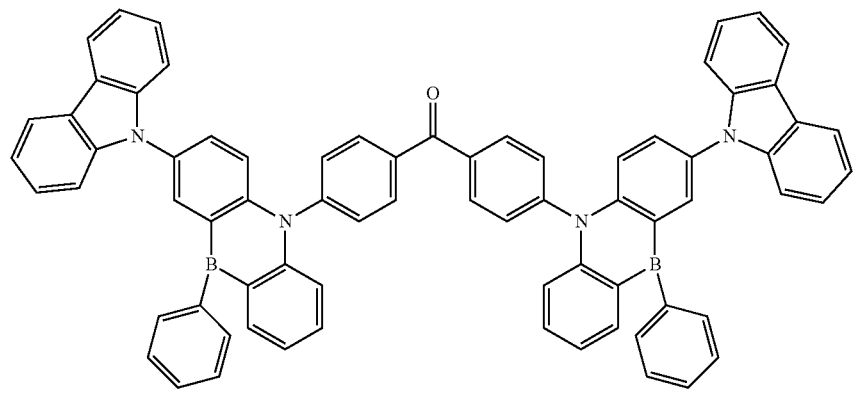
35
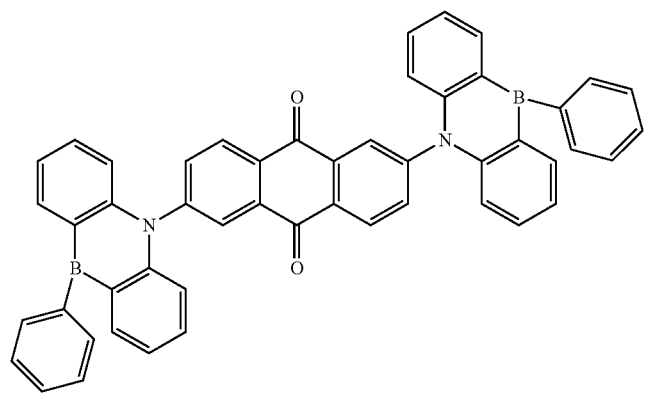
36
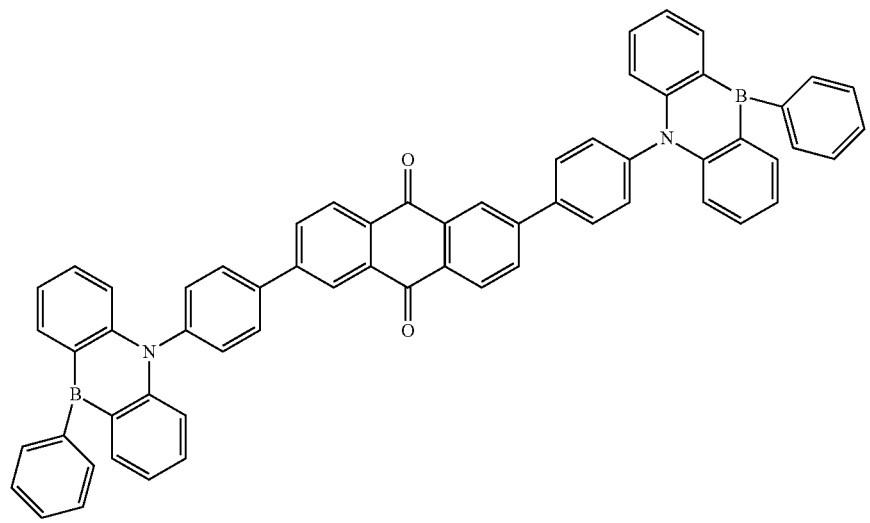

-continued
37
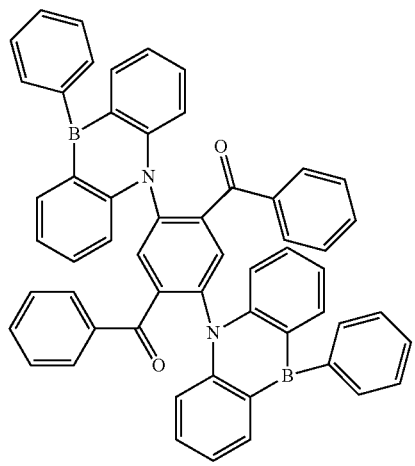
38
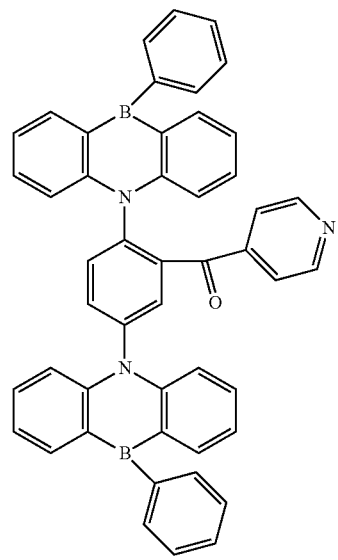
39
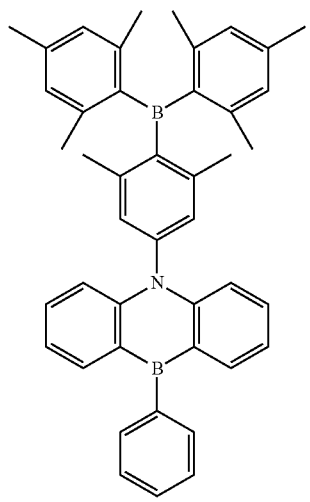
40
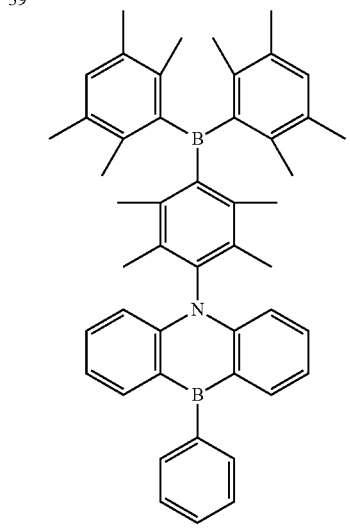
41
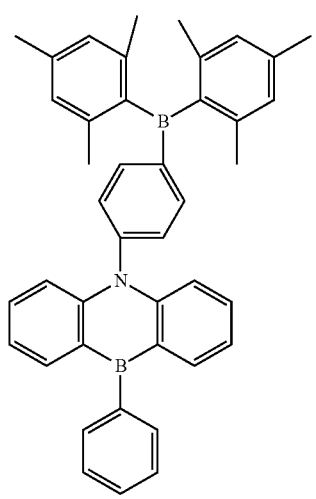
42
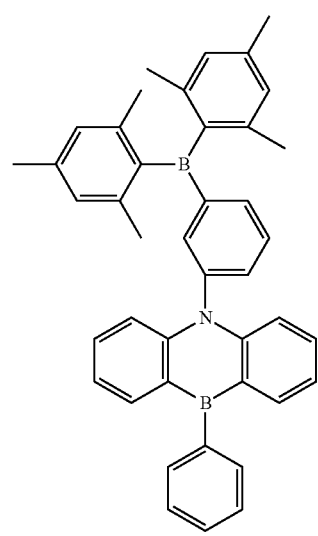

-continued
43
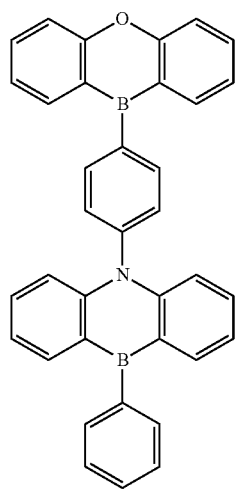
44
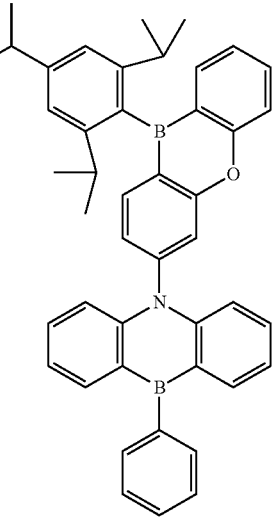
47
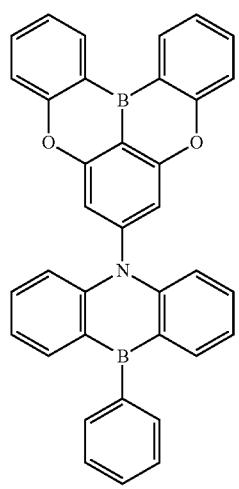
48
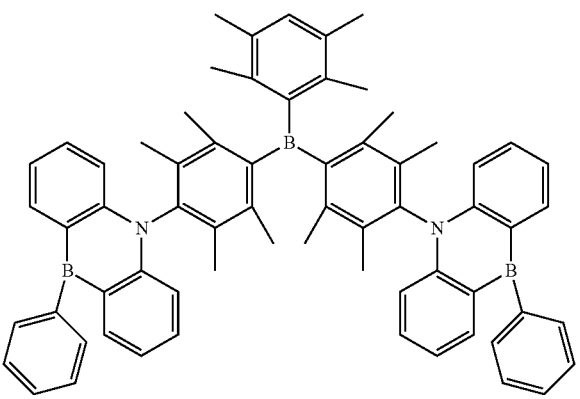
49
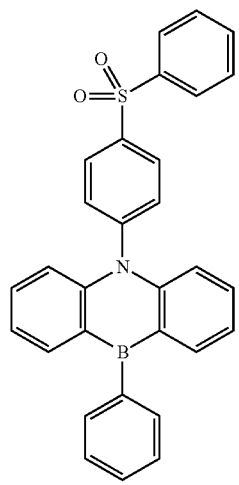
50
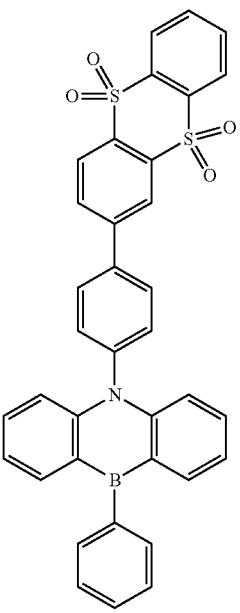

51
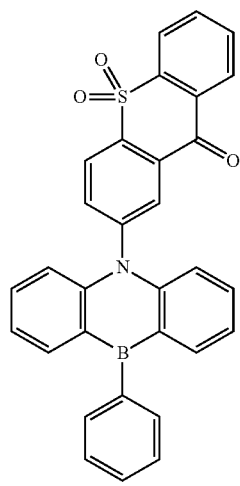
52
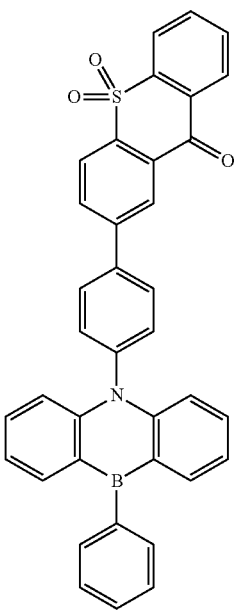
54
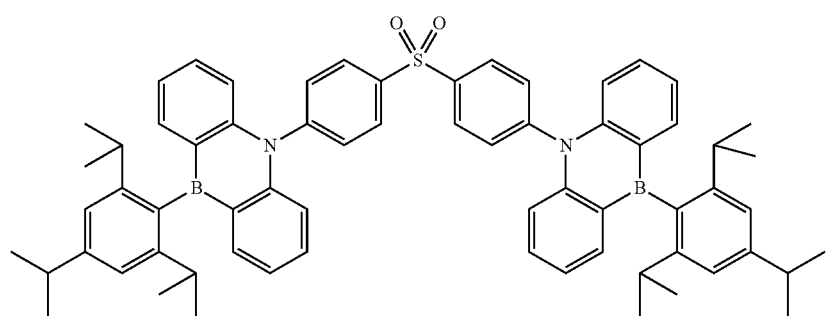
55
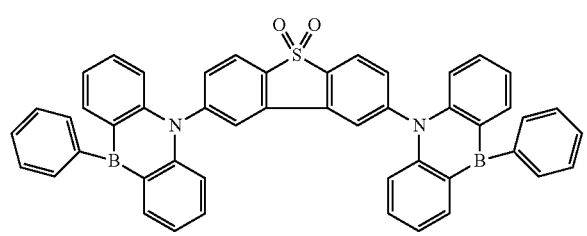
56
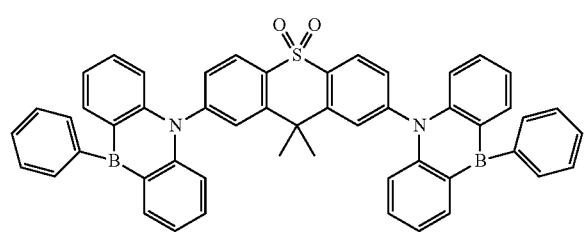
57
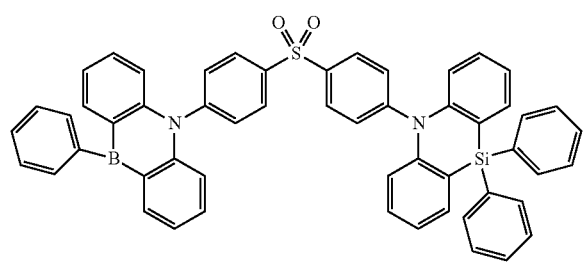
58
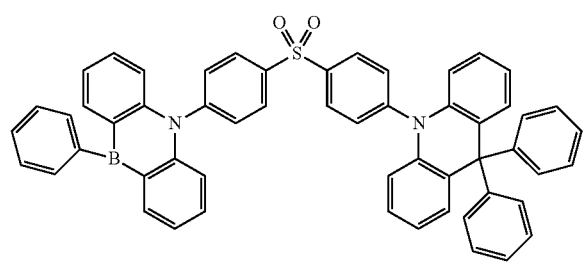

59
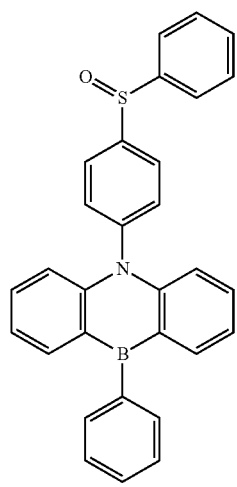
60
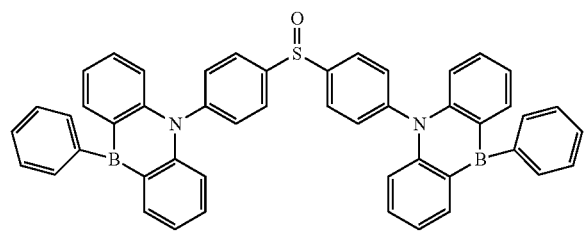
61
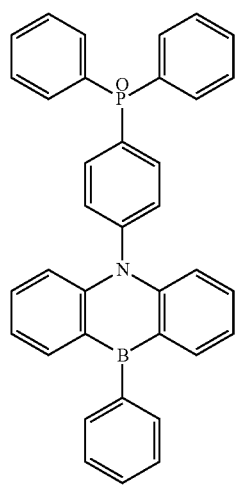
62
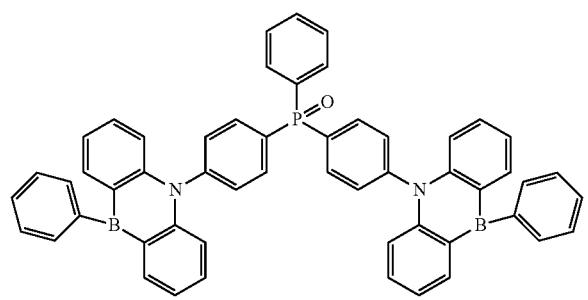
63
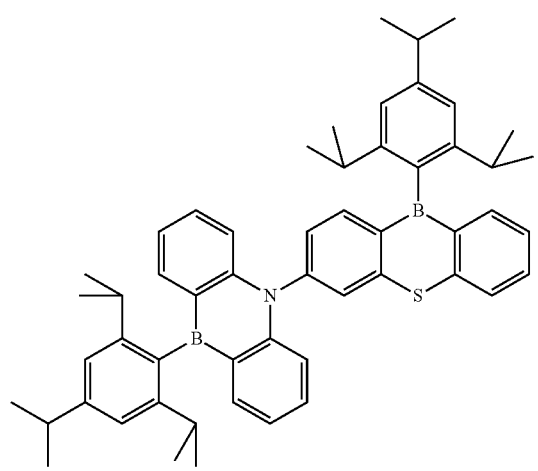
64
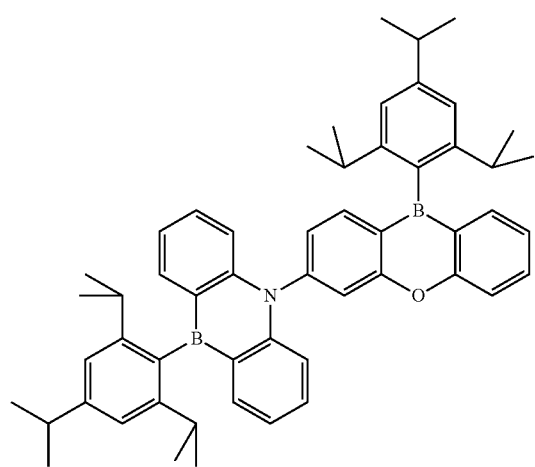

-continued
65
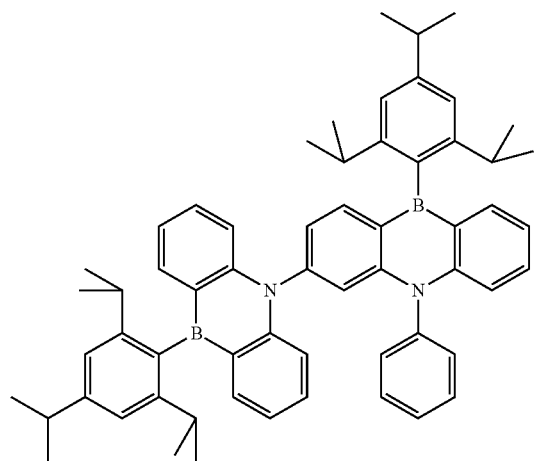
66
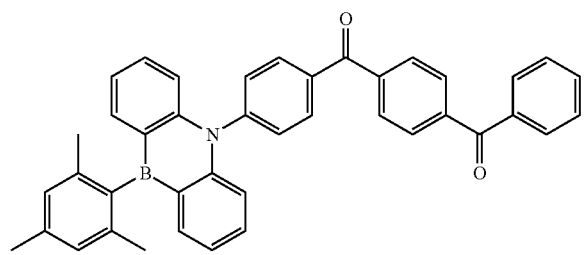
67
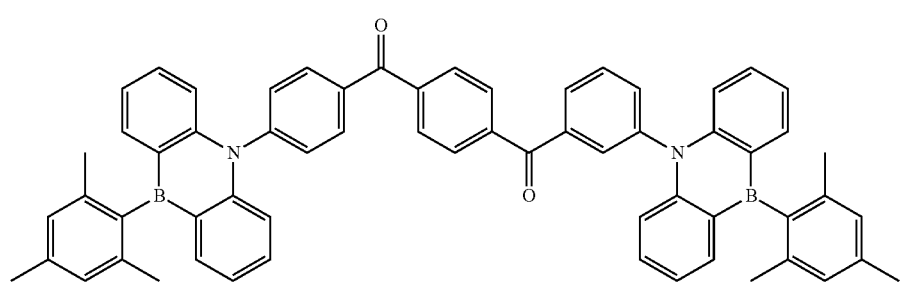
68
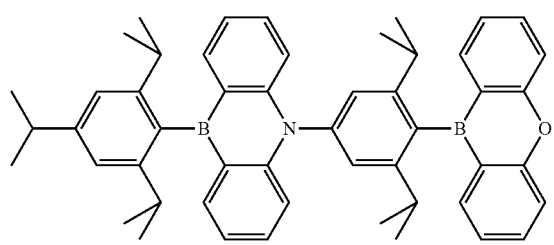
69
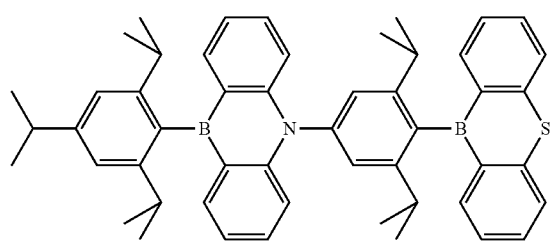
70
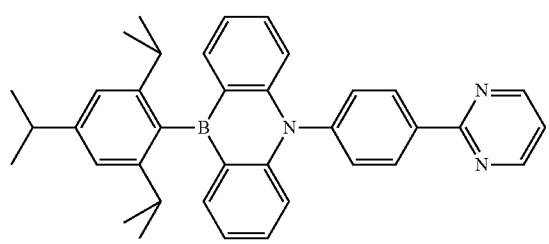
71
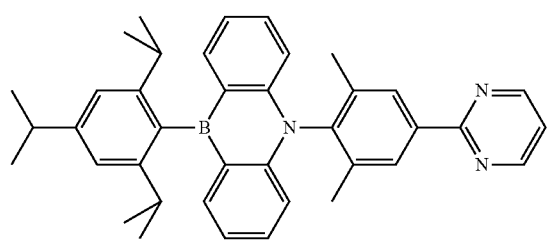

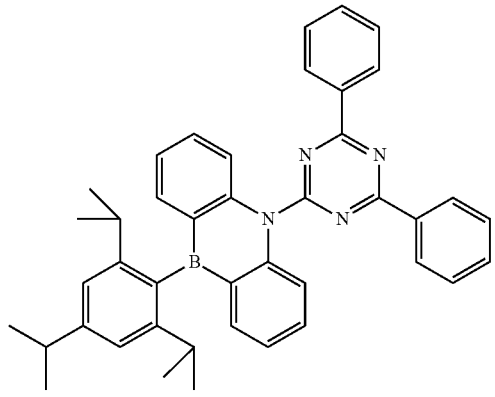

72

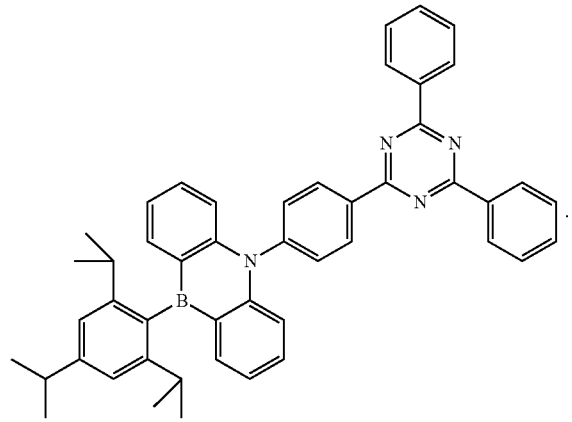

73

The described polycyclic compound represented by Formula 1 may be used in the organic electroluminescence device 10 of an embodiment to improve the efficiency and life-time of the organic electroluminescence device. For example, the described polycyclic compound represented by Formula 1 may be used in the emission layer EML of the organic electroluminescence device 10 of an embodiment to improve the luminous efficiency and life-time of the organic electroluminescence device.

In an embodiment, the emission layer EML may include a host and a dopant, and the host may be for delayed fluorescence emission and the dopant may be for delayed fluorescence emission. The polycyclic compound of an embodiment represented by Formula 1 may be contained as a dopant material in the emission layer EML. For example, the polycyclic compound of an embodiment represented by Formula 1 may be used as a TADF dopant.

On the other hand, the emission layer EML of an embodiment may include any suitable host material generally available in the art. In some embodiments, the emission layer may include tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl] ether oxide (DPEPO), hexaphenylcyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), 2,8-bis(diphenylphosphoryl)dibenzofuran (PPF), or the like. However, the present disclosure is not limited thereto, and in addition to the described host materials, any suitable delayed fluorescence emission host material generally available in the art may be included.

On the other hand, the emission layer EML in the organic electroluminescence device 10 of an embodiment may further include any suitable dopant material generally available in the art. In an embodiment, the emission layer EML may include as a dopant, for example, a styryl derivative (such as 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi)), perylene and a derivative thereof (such as 2,5,8,11-tetra-t-butylperylene (TBP)), pyrene and a derivative thereof (such as 1,1-dipyrene, 1,4-dipyrenylbenzene, and 1,4-bis(N,N-diphenylamino)pyrene), or the like.

Referring to FIGS. 1 to 3 again, in the organic electroluminescence device 10 of an embodiment, the electron transport region ETR may be on the emission layer EML. The electron transport region ETR may include at least one of a hole blocking layer, an electron transport layer ETL, or an electron injection layer EIL, but the present disclosure is not limited thereto.

The electron transport region ETR may have a structure of: a single layer formed of a single material; a single layer formed of a plurality of different materials; or a multi-layer having a plurality of layers formed of a plurality of different materials.

For example, the electron transport region ETR may have a structure of a single layer which is an electron injection layer EIL or an electron transport layer ETL, or may have a structure of a single layer formed of an electron injection material and an electron transport material. In some embodiments, the electron transport region ETR may have a structure of a single layer formed of a plurality of different materials, or may have a structure of, sequentially laminated from the first electrode EL1, electron transport layer ETL/electron injection layer EIL or hole blocking layer/electron transport layer ETL/electron injection layer EIL, but the present disclosure is not limited thereto. A thickness of the electron transport region ETR may be, for example, about 100-1500 Å.

The electron transport region ETR may be formed using various suitable methods such as a vacuum deposition method, a spin coating method, a casting method, a Langmuir-Blodgett (LB) method, an inkjet printing method, a laser printing method, or a laser induced thermal imaging (LITI) method.

When the electron transport region ETR includes the electron transport layer ETL, the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate) (Bebq$_2$), 9,10-di(naphthalene-2-yl)anthracene (ADN), or a mixture thereof, but the present disclosure is not limited thereto.

When the electron transport region ETR includes the electron transport layer ETL, a thickness of the electron transport layer ETL may be about 100-1000 Å, for example, about 150-500 Å. When the thickness of the electron transport layer ETL satisfies the range described herein, suitable or satisfactory electron transport performance may be achieved without substantial rise of a driving voltage.

When the electron transport region ETR includes the electron injection layer EIL, the electron transport region ETR may use, for example, a lanthanide metal such as LiF, lithium quinolate (LiQ), Li$_2$O, BaO, NaCl, CsF, and Yb, a halogenated metal such as RbCl, RbI, and KI, but the present disclosure is not limited thereto. The electron injection layer EIL may also be formed of a mixture of an electron transport material and an insulative organo-metal salt. The organo-metal salt may be a material having an energy band gap of about 4 eV or more. In some embodiments, the organo-metal salt may include, for example, metal acetate, metal benzoate, metal acetoacetate, metal acetylacetonate, or metal stearate.

When the electron transport region ETR includes the electron injection layer EIL, thicknesses of the electron injection layers EIL may be about 1-100 Å or about 3-90 Å. When the thicknesses of the electron injection layers EIL satisfy the range described herein, suitable or satisfactory electron injection performance may be achieved without substantial rise of a driving voltage.

The electron transport region ETR may include the hole blocking layer as described above. The hole blocking layer may include, for example, at least one of 2,9-dimethyl-4,7-diphenyl-1,10-phenanthroline (BCP) or 4,7-diphenyl-1,10-phenanthroline (Bphen), but the present disclosure is not limited thereto.

The second electrode EL2 may be on the electron transport region ETR. The second electrode EL2 may have conductivity (e.g., electrical conductivity). The second electrode EL2 may be formed of a metal alloy or a conductive compound. The second electrode EL2 may be a cathode. The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), or the like.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, or a compound or a mixture thereof (for example, a mixture of Ag and Mg). In some embodiments, the second electrode EL2 may be a structure which has a plurality of layers including: a reflective layer or a transflective layer formed of the described materials; and a transparent conductive layer formed of ITO, IZO, ZnO, ITZO, or the like.

In some embodiments, the second electrode EL2 may be coupled to an auxiliary electrode. When the second electrode EL2 is coupled to the auxiliary electrode, resistance of the second electrode EL2 may be reduced.

In the organic electroluminescence device 10, as a voltage is applied to the first electrode EL1 and the second electrode EL2, respectively, the holes injected from the first electrode EL1 may move through the hole transport region HTR to the emission layer EML and the electrons injected from the second electrode EL2 may move through the electron transport region ETR to the emission layer EML. The electrons and the holes may be recombined in the emission layer EML to generate excitons, and the excitons may emit light when the excitons fall back (e.g., transition or relax) from an excited state to a ground state.

When the organic electroluminescence device 10 is a top emission type (or kind), the first electrode EL1 may be a reflective electrode and the second electrode EL2 may be a transmissive electrode or a transflective electrode. When the organic electroluminescence device 10 is a bottom emission type (or kind), the first electrode EL1 may be a transmissive electrode or a transflective electrode and the second electrode EL2 may be a reflective electrode.

The organic electroluminescence device 10 according to an embodiment of the present disclosure may exhibit the improved luminous efficiency and life-time characteristics using the described polycyclic compound as an emission layer material.

An embodiment of the present disclosure provides a polycyclic compound represented by Formula 1 below:

[Formula 1]

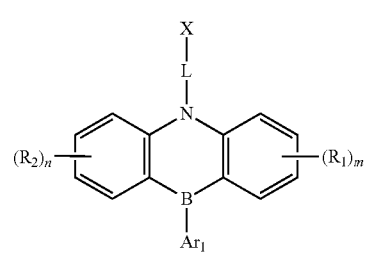

In Formula 1, $R_1$ and $R_2$ may each independently be a hydrogen atom, a deuterium atom, a halogen atom, a boron group, a substituted or unsubstituted amino group, a cyano group, a carbonyl group, a nitro group, a siloxy group, a silyl group, a phosphoryl group, a thiophosphoryl group, a substituted or unsubstituted thiol group, a sulfinyl group, a sulfonyl group, a substituted or unsubstituted alkoxy group having 1 to 20 carbon atoms, a substituted or unsubstituted aryloxy group having 6 to 30 ring-forming carbon atoms, a substituted or unsubstituted alkyl group having 1 to 20 carbon atoms, a substituted or unsubstituted aralkyl group having 7 to 30 carbon atoms, a substituted or unsubstituted aryl group having 6 to 30 ring-forming carbon atoms, or a substituted or unsubstituted heteroaryl group having 2 to 30 ring-forming carbon atoms, or may be bonded to adjacent groups to form a ring.

In Formula 1, m and n may each independently be an integer of 0 to 4. In some embodiments, when m is an integer of 2 or larger, a plurality of $R_1$'s may be the same as or different from each other and when n is an integer of 2 or larger, a plurality of $R_2$'s may be the same as or different from each other.

In Formula 1, L may be a single bond (e.g., a direct bond), a substituted or unsubstituted arylene group having 6 to 30 ring-forming carbon atoms, or a substituted or unsubstituted heteroarylene group having 2 to 30 ring-forming carbon atoms.

In Formula 1, $Ar_1$ may be a substituted or unsubstituted aryl group having 6 to 30 ring-forming carbon atoms, or a substituted or unsubstituted heteroaryl group having 2 to 30 ring-forming carbon atoms.

In Formula 1, X may be represented by any one among Formulae 2-1 to 2-8 below:

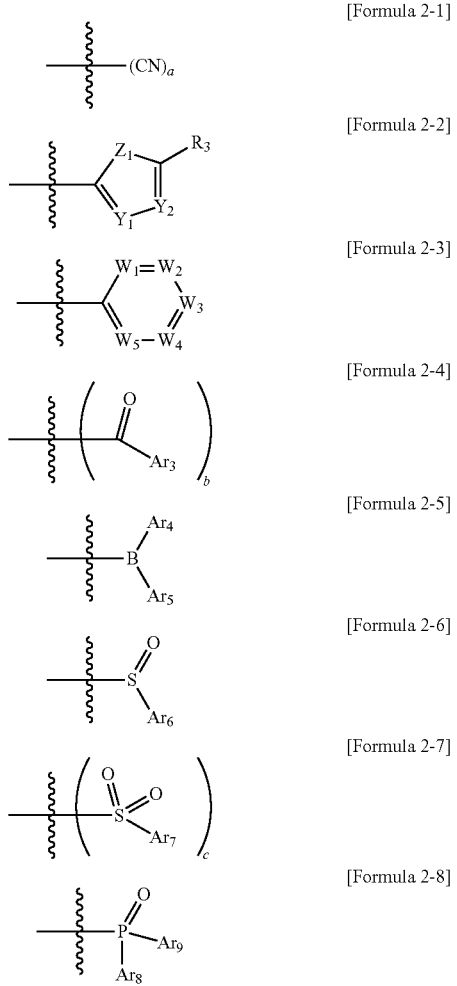

[Formula 2-1]

[Formula 2-2]

[Formula 2-3]

[Formula 2-4]

[Formula 2-5]

[Formula 2-6]

[Formula 2-7]

[Formula 2-8]

In Formula 2-2: $Z_1$ may be O, S, or $NAr_{10}$; $Y_1$ and $Y_2$ may each independently be N or $CR_4$ and at least one among $Y_1$ and $Y_2$ may be N; and $R_3$ and $R_4$ may each independently be a hydrogen atom, a deuterium atom, a halogen atom, a boron group, a substituted or unsubstituted amino group, a cyano group, a carbonyl group, a nitro group, an oxy group, a siloxy group, a silyl group, a phosphine oxide group, a phosphine sulfide group, a sulfinyl group, a sulfonyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl ring having 2 to 30 ring-forming carbon atoms, or may be bonded to adjacent groups to form a ring.

In Formula 2-3: $W_1$ to $W_5$ may each independently be N or $CR_5$ and at least one among $W_1$ to $W_5$ may be N; and $R_5$ may be a hydrogen atom, a deuterium atom, a halogen atom, a boron group, a substituted or unsubstituted amino group, a cyano group, a carbonyl group, a nitro group, an oxy group, a siloxy group, a silyl group, a phosphine oxide group, a phosphine sulfide group, a sulfinyl group, a sulfonyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl ring having 2 to 30 ring-forming carbon atoms.

In Formulae 2-1 to 2-8: a to c may each independently be an integer of 1 to 4; and $Ar_3$ to $Ar_{10}$ may each independently be a substituted or unsubstituted aryl group having 6 to 30 ring-forming carbon atoms or a substituted or unsubstituted heteroaryl group having 2 to 30 ring-forming carbon atoms, or may be bonded to adjacent groups to form a ring.

The description for the polycyclic compound described in the organic electroluminescence device of an embodiment may be equally applied to the polycyclic compound of an embodiment represented by Formula 1.

The polycyclic compound according to an embodiment may be any one selected from the compounds represented by described Compound Group 1.

Hereinafter, embodiments of the present disclosure will be explained in more detail with reference to Examples and Comparative Examples. In addition, the following embodiments are only examples to assist understanding of the subject matter of the present disclosure, and the scope of the present disclosure is not limited thereto.

EXAMPLE

1. Synthesis of Polycyclic Compound

First, a synthesis method for the polycyclic compound according to the embodiment will be described by exemplifying respective synthesis methods for Compound 2, Compound 12, Compound 30, Compound 64, and Compound 54. The synthesis method for the polycyclic compound described below is an example, however, and the synthesis method for the polycyclic compound according to the embodiments of the present disclosure is not limited to the Examples described herein below.

(1) Synthesis of Compound 2

(Synthesis of Intermediate Compound B)

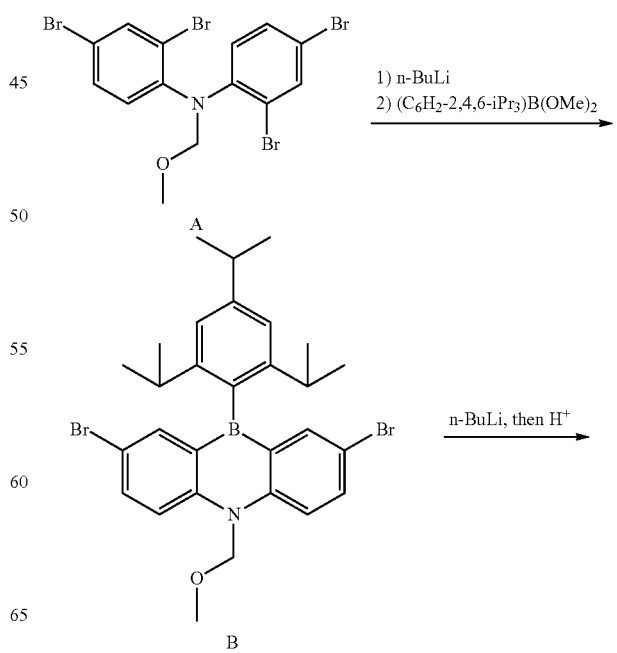

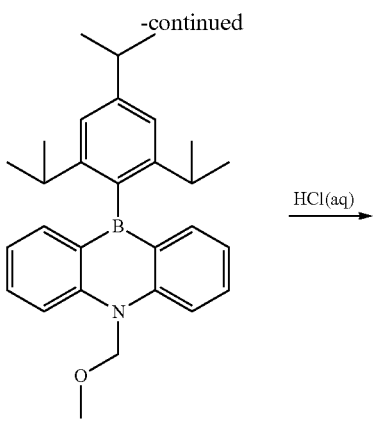

C

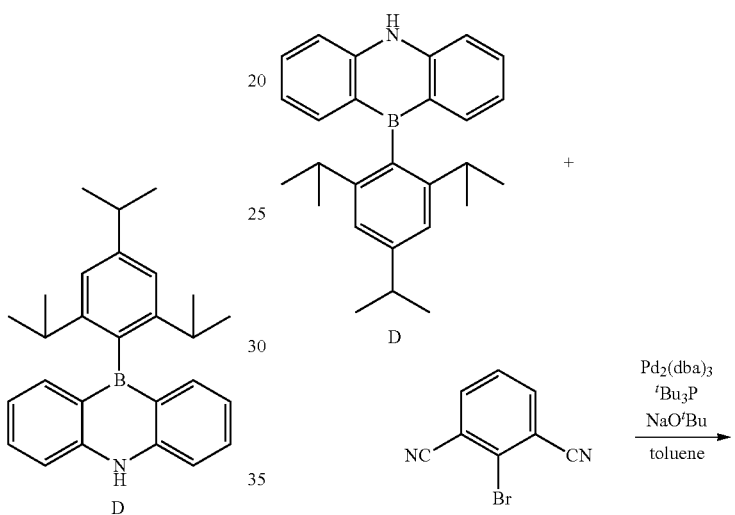

Compound A was synthesized by the method described in "Agou, Tomohiro; Kojima, Tatsuo; Kobayashi, Junji; Kawashima, Takayuki, Organic Letters (2009), 11 (16), 3534-3537)".

Compound A (22 g, 42 mmol) was dissolved in 400 mL of dehydrated diethylether in a 1000 mL three-neck flask under an Ar atmosphere and the mixture was stirred at −78° C. for 1 hour, and then, 52 mL of a hexane solution (83 mmol) of 1.6 M n-BuLi was added thereto and stirred for 2 hours. 12.7 g of 2,4,6-triisopropylphenylboronic acid methyl ester (46 mmol) was added thereto, and then the temperature of the reaction solution was raised to room temperature while stirring. After the reaction, the mixture was washed with water. The obtained organic phase was concentrated to obtain a viscous material. The obtained crude product was purified by column chromatography (silica gel) to obtain 16.3 g of Compound B (28 mmol, yield of 64%) as a solid. The molecular weight of Compound B measured by FAB-MS was 581.

(Synthesis of Compounds C and D)

Compound B (16.3 g, 28 mmol) was dissolved in 200 mL of dehydrated THF in a 1000 mL three-neck flask under an Ar atmosphere and the mixture was stirred at −78° C. for 1 hour, and then, 36 mL of a hexane solution (58 mmol) of 1.6 M n-BuLi was added thereto and stirred for 2 hours. A saturated ammonium chloride aqueous solution was added thereto, and then, the THF component was distilled off from the reaction solution under a reduced pressure. An organic material was extracted from the obtained aqueous solution with chloroform, the obtained organic phase was concentrated, and then, the obtained crude product was purified by column chromatography (silica gel) to obtain Compound C. The obtained Compound C was dissolved in dehydrated diethylether 100 mL, a hydrochloric acid aqueous solution (12 M, 40 mL) was added thereto, and then, the solution was stirred at room temperature for 1 hour. A saturated sodium carbonate aqueous solution was added to the solution to finish the reaction, and then, a liquid separation was performed and the obtained organic layer was concentrated to obtain 7.3 g of Compound D (19 mmol, yield of 68%) as a white solid. The molecular weight of Compound D measured by FAB-MS was 381.

(Synthesis of Compound 2)

3.1 g of Compound D (8.1 mmol), 1.7 g of $C_6H_3$-1,3-$(CN)_2$-2-Br (8.0 mmol), 0.183 g of $Pd_2(dba)_3$ (0.20 mmol), 0.162 g of $(t-Bu)_3P$ (0.80 mmol), and 0.770 g of sodium t-butoxide (8.0 mmol) were added to a 100 mL three-neck flask under an Ar atmosphere and the mixture was stirred in 20 mL of a toluene solution at 90° C. for 12 hours. After air cooling, water was added to separate an organic layer and the solvent was distilled off. The obtained crude product was purified by silica gel column chromatography to obtain 2.6 g of Compound 2 (5.1 mmol, yield of 64%) as a white solid. The molecular weight of Compound 2 measured by FAB-MS was 507.

(2) Synthesis of Compound 12

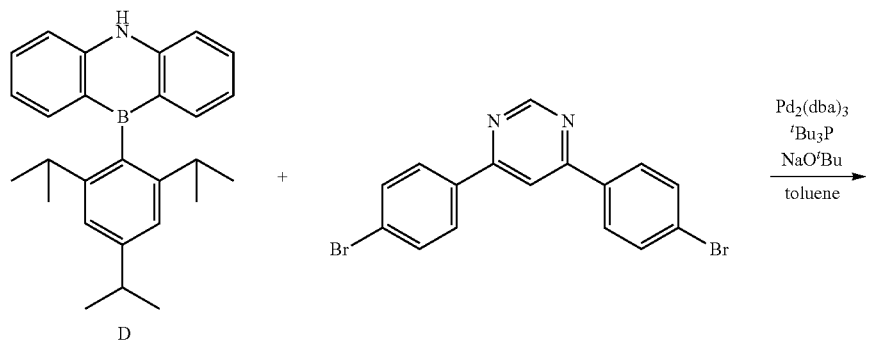

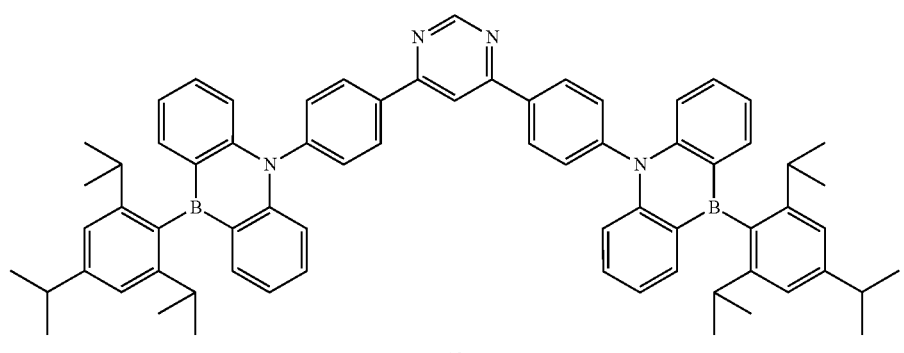

12

3.1 g of Compound D (8.1 mmol), 1.56 g of 4,6-bis(4-bromophenyl)pyrimidine (4.0 mmol), 0.183 g of $Pd_2(dba)_3$ (0.20 mmol), 0.162 g of $(t-Bu)_3P$ (0.80 mmol), and 0.770 g of sodium t-butoxide (8.0 mmol) were added to a 100 mL three-neck flask under an Ar atmosphere and the mixture was stirred in a 20 mL toluene solution at 80° C. for 12 hours. After air cooling, water was added to separate an organic layer and the solvent was distilled off. The obtained crude product was purified by silica gel column chromatography to obtain 3.1 g of Compound 12 (3.1 mmol, yield of 39%) as a white solid. The molecular weight of Compound 12 measured by FAB-MS was 991.

(3) Synthesis of Compound 30

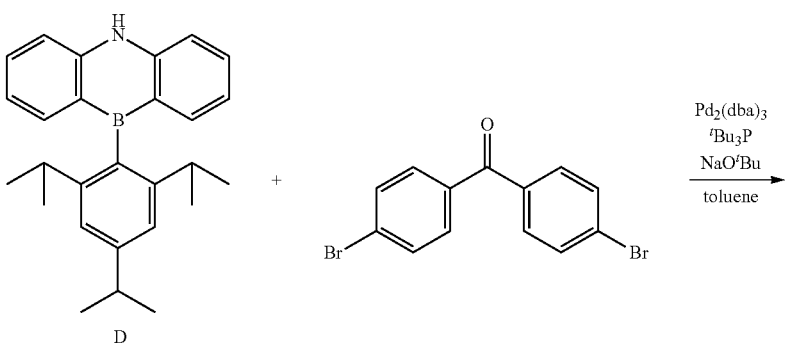

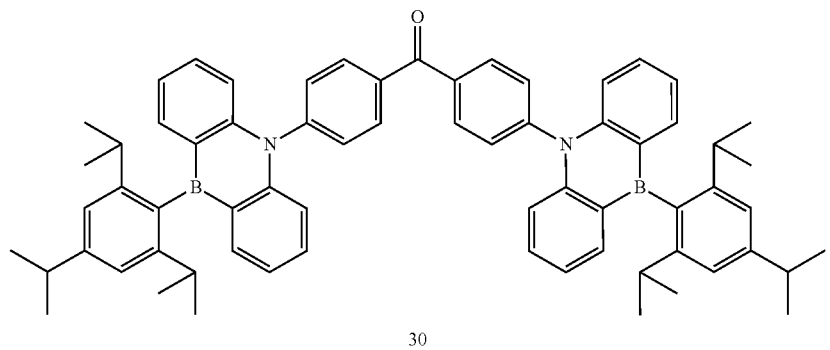

30

3.1 g of Compound D (8.1 mmol), 1.36 g of 4,4'-dibromobenzophenone (4.0 mmol), 0.183 g of Pd$_2$(dba)$_3$ (0.20 mmol), 0.162 g of (t-Bu)$_3$P (0.80 mmol), and 0.769 g of sodium t-butoxide (8.0 mmol) were added to a 100 mL three-neck flask under an Ar atmosphere and the mixture was refluxed while heating in 20 mL of a toluene solution for 4 hours. After air cooling, water was added to separate an organic layer and the solvent was distilled off. The obtained crude product was washed with hexane and purified by silica gel column chromatography to obtain 1.51 g of Compound 30 (1.6 mmol, yield of 40%) as a white solid. The molecular weight of Compound 30 measured by FAB-MS was 941.

(4) Synthesis of Compound 64

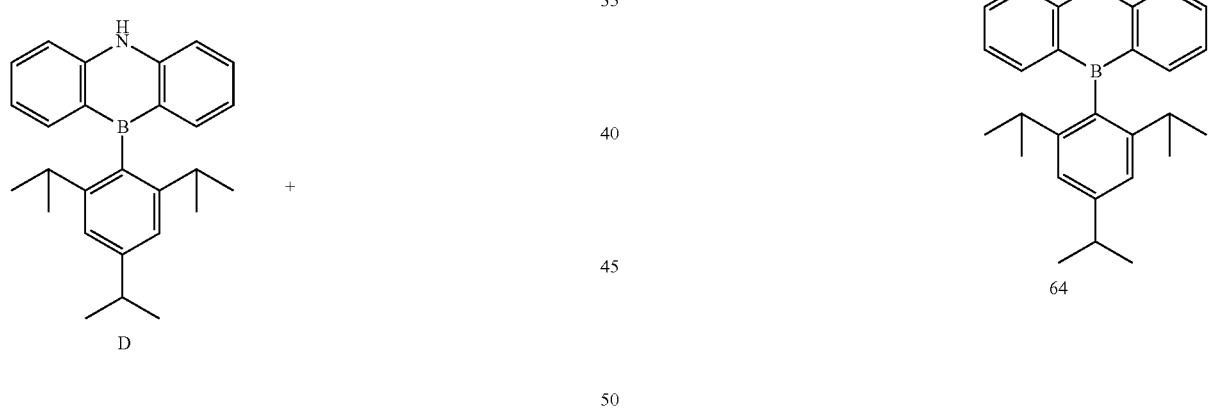

3.1 g of Compound D (8.1 mmol), 3.69 g of 3-bromo-10-[2,4,6-tris(1-methylethyl)phenyl]-10H-phenoxaborin (8.0 mmol), 0.183 g of Pd$_2$(dba)$_3$ (0.20 mmol), 0.163 g of (t-Bu)$_3$P (0.80 mmol), and 0.768 g of sodium t-butoxide (8.0 mmol) were added to a 100 mL three-neck flask under an Ar atmosphere and the mixture was refluxed while heating in a 30 mL toluene solution for 6 hours. After air cooling, water was added to separate an organic layer and the solvent was distilled off. The obtained crude product was purified by silica gel column chromatography to obtain 2.8 g of Compound 64 (3.7 mmol, yield of 46%) as a white solid. The molecular weight of Compound 64 measured by FAB-MS was 762.

(5) Synthesis of Compound 54

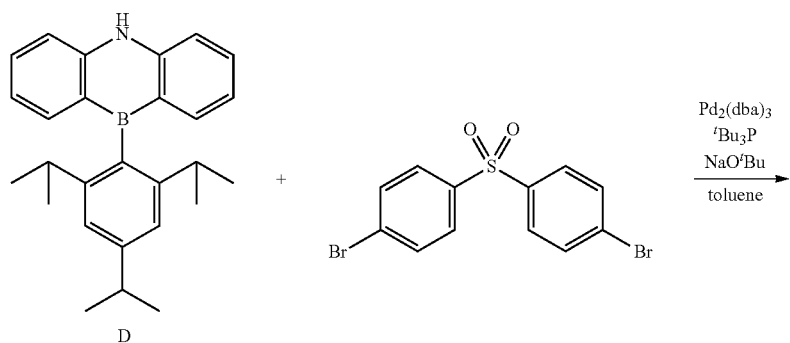

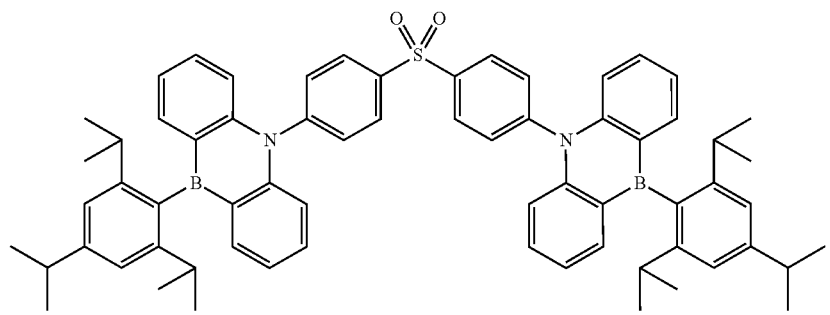

54

3.1 g of Compound D (8.1 mmol), 1.50 g of 1,1'-sulfonylbis(4-bromobenzene) (4.0 mmol), 0.183 g of $Pd_2(dba)_3$ (0.20 mmol), 0.161 g of $(t-Bu)_3P$ (0.80 mmol), and 0.768 g of sodium t-butoxide (8.0 mmol) were added to a 100 mL three-neck flask under an Ar atmosphere and the mixture was refluxed while heating in a 20 mL toluene solution for 6 hours. After air cooling, water was added to separate an organic layer and the solvent was distilled off. The obtained crude product was purified by silica gel column chromatography to obtain 2.4 g of Compound 54 (2.5 mmol, yield of 61%) as a white solid. The molecular weight of Compound 54 measured by FAB-MS was 977.

2. Production and Evaluation of Organic Electroluminescence Device Including Polycyclic Compound (Production of Organic Electroluminescence Device)

An organic electroluminescence device of an embodiment including a polycyclic compound of an embodiment in an emission layer was produced according to the method described herein below. The organic electroluminescence devices in Examples 1 to 5 were produced by using the described polycyclic compounds of Compound 2, Compound 12, Compound 30, Compound 64, and Compound 54, respectively, as emission layer materials. The compounds used in the emission layers in Examples 1 to 11 and Comparative Examples 1 to 4 are shown below:

Compounds in Examples

2

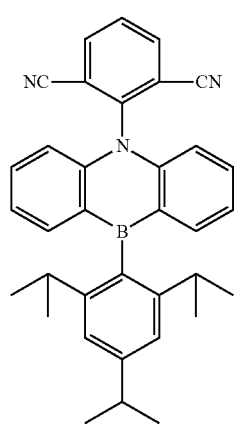

-continued
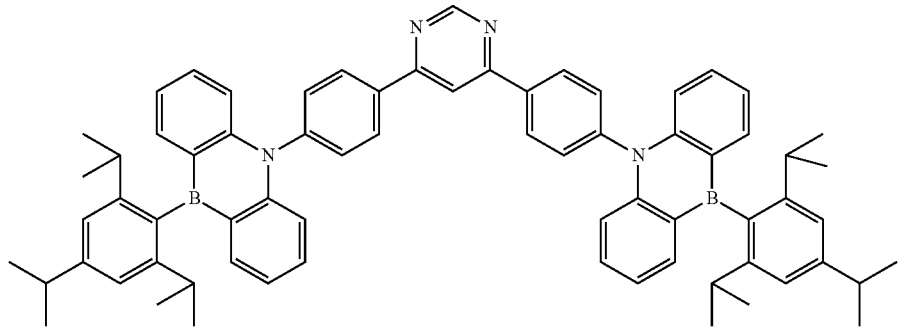
12
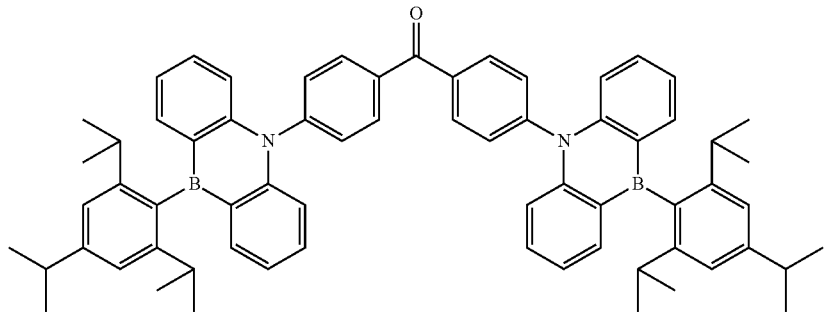
30
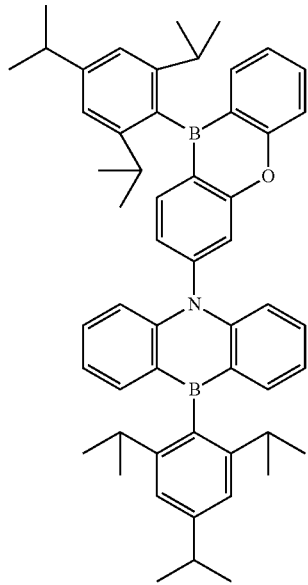
44
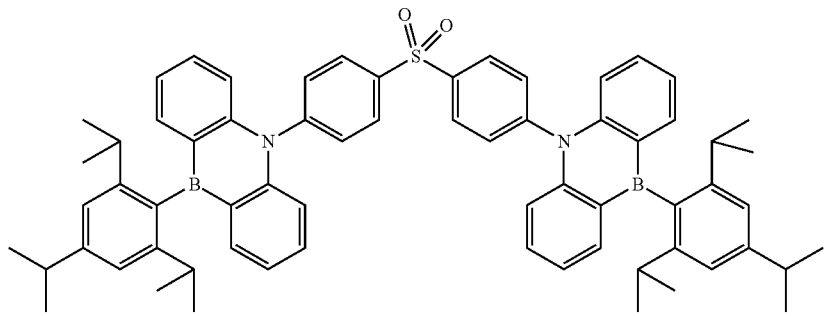
54

Compounds in Comparative Examples c1
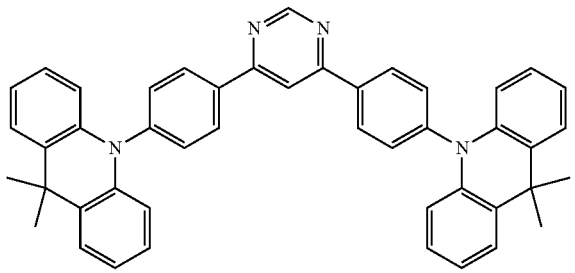

c2
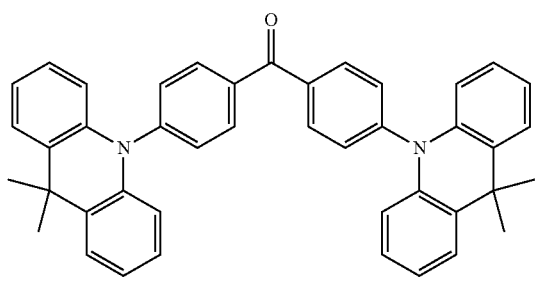

c3
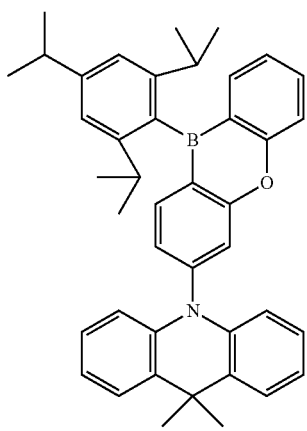

c4
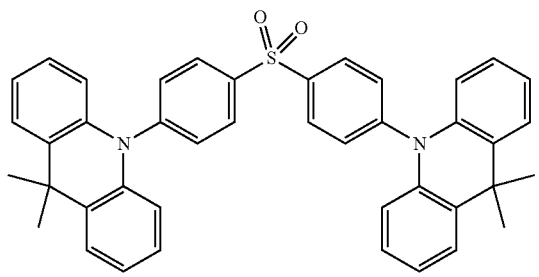

The organic electroluminescence devices in Examples and Comparative Examples were produced according to the method described herein below.

ITO having a thickness of 1500 Å was patterned on a glass substrate, washed with ultrapure water, and treated with UV ozone for 10 minutes. Thereafter, HAT-CN was deposited to have a thickness of 100 Å, α-NPD was deposited to have a thickness of 800 Å, and mCP was deposited to have a thickness of 50 Å, and then, a hole transport region was formed.

Next, when the emission layer was formed, the respective polycyclic compound in the Examples or the respective compound in the Comparative Examples and DPEPO were co-deposited to a ratio of 20:80 to form a layer having a thickness of 200 Å. Next, a layer having a thickness of 100 Å was formed by using DPEPO. The emission layers, which were formed by the co-deposition, were deposited by mixing Compounds 2, 12, 30, 64, and 54 with DPEPO in Examples 1 to 11, respectively, and by mixing Comparative Compounds C1, C2, C3, and C4 with DPEPO in Comparative Examples 1 to 4, respectively.

On the emission layer, a layer having a thickness of 300 Å was formed by using TPBi and a layer having a thickness of 5 Å was formed by using LiF, and then, an electron transport region was formed. Subsequently, a second electrode having a thickness of 1000 Å was formed by using aluminum (Al).

The hole transport region, the emission layer, the electron transport region, and the second electrode were formed through using vacuum deposition apparatus in Examples.

(Performance Evaluation of Organic Electroluminescence Device)

A maximum emission wavelength (nm) and an external quantum yield (%) were measured to evaluate the performances of the organic electroluminescence devices according to Examples and Comparative Examples. In the measurement, luminance orientation characteristic measuring apparatus of Hamamatsu Photonics C9920-11 was used as measuring apparatus.

TABLE 1

| Division | Dopant of emission layer | Maximum emission wavelength (nm) | External quantum yield (%) | Life-time ($LT_{50}$ (h)) |
| --- | --- | --- | --- | --- |
| Example 1 | Compound 2 | 484 | 12.1 | 28.3 |
| Example 2 | Compound 12 | 482 | 15.1 | 28.4 |
| Example 3 | Compound 30 | 480 | 14.3 | 5.7 |
| Example 4 | Compound 44 | 478 | 11.1 | 14.8 |
| Example 5 | Compound 54 | 481 | 13.5 | 20.1 |
| Comparative Example 1 | Comparative Compound C1 | 500 | 8.0 | 16.0 |
| Comparative Example 2 | Comparative Compound C2 | 488 | 8.8 | 4.7 |
| Comparative Example 3 | Comparative Compound C3 | 506 | 10.8 | 19.9 |
| Comparative Example 4 | Comparative Compound C4 | 477 | 9.2 | 10.0 |

Referring to Table 1, it could be found that the respective organic electroluminescence devices in Examples 1 to 5, in which the polycyclic compound of an embodiment has been used as a dopant material of the emission layer, respectively, exhibited high efficiency and long life-time as compared with Comparative Examples 1 to 4. It could also be found that the respective organic electroluminescence devices in Examples 1 to 5, in which the polycyclic compound of an embodiment has been used as a dopant material of the emission layer, respectively, emitted deep-blue light which has a relatively short wavelength of 485 nm or less.

The compounds in Example 2 and Comparative Example 1, Example 3 and Comparative Example 2, Example 4 and Comparative Example 3, and Example 5 and Comparative Example 4 include the same electron acceptor. However, it could be found that respective Examples, in which each of the compounds in Examples includes an azaborine group as an electron donor, exhibited high efficiency and long life-time as compared with Comparative Examples. Referring to Example 3 and Comparative Example 2, Example 3, which included the compound including an azaborine portion as an electron donor although using the compound including the same benzophenone group as an electron acceptor, had 21% improved life-time as compared with Comparative Example 2.

Examples 1 to 5 include an azaborine group containing a boron atom as an electron donor and the azaborine group serves as a weaker electron donor than acridine included in Comparative Examples because of weak electron-withdrawing derived from an empty p orbital of the boron atom. Accordingly, while the present disclosure is not bound by any particular mechanism or theory, it was considered that charge transfer between the electron donor and the electron acceptor was weakened to shorten the wavelength, and at the same (e.g., substantially the same) time, polarization of the carbon-nitrogen bond connecting the donor and the acceptor was weakened and stability of the bond was increased to improve the external quantum efficiency and the life-time as compared with Comparative Examples 1 to 4.

The organic electroluminescence device of an embodiment having high luminous efficiency in a blue light wavelength region may be achieved by using a polycyclic compound as a emission layer material, wherein the polycyclic compound may include one electron donor and one electron acceptor, and the electron donor may include an azaborine group and the electron acceptor may include any one of a cyano group, a carbonyl group, a boron group, a sulfonyl group, a sulfinyl group, a phosphine oxide group, a nitrogen-containing five-membered ring, or a nitrogen-containing six-membered monocyclic ring.

An organic electroluminescence device according to an embodiment of the present disclosure may have high efficiency and long life-time.

A polycyclic compound according to an embodiment of the present disclosure may improve life-time and efficiency of an organic electroluminescence device.

Although exemplary embodiments of the present disclosure have been described, it is understood that the subject matter of the present disclosure should not be limited to these exemplary embodiments but various changes and modifications can be made by one ordinary skilled in the art within the spirit and scope of the appended claims, and equivalents thereof.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Therefore, the technical scope of the present disclosure should not be limited to the contents described in the detailed description of the specification, but should be defined by the appended claims, and equivalents thereof.

What is claimed is:

1. An organic electroluminescence device comprising:
a first electrode;
a hole transport region on the first electrode;
an emission layer on the hole transport region;
an electron transport region on the emission layer; and
a second electrode on the electron transport region,
wherein the first electrode and the second electrode each independently comprise at least one selected from the group consisting of Ag, Mg, Cu, Al, Pt, Pd, Au, Ni, Nd, Ir, Cr, Li, Ca, LiF/Ca, LiF/Al, Mo, Ti, In, Sn, Zn, a compound of two or more thereof, a mixture of two or more thereof, and oxides thereof,
wherein the emission layer comprises a polycyclic compound represented by Formula 1, or compound 21, 22, or 24,

[Formula 1]

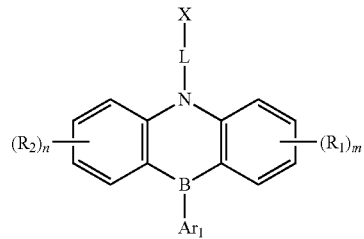

in Formula 1 above,

R₁ and R₂ are each independently a hydrogen atom, a deuterium atom, a halogen atom, a boron group, a substituted or unsubstituted amino group, a cyano group, a carbonyl group, a nitro group, a siloxy group, a silyl group, a phosphoryl group, a thiophosphoryl group, a substituted or unsubstituted thiol group, a sulfinyl group, a sulfonyl group, a substituted or unsubstituted alkoxy group having 1 to 20 carbon atoms, a substituted or unsubstituted aryloxy group having 6 to 30 ring-forming carbon atoms, a substituted or unsubstituted alkyl group having 1 to 20 carbon atoms, a substituted or unsubstituted aralkyl group having 7 to 30 carbon atoms, a substituted or unsubstituted aryl group having 6 to 30 ring-forming carbon atoms, or a substituted or unsubstituted heteroaryl group having 2 to 30 ring-forming carbon atoms, or are bonded to adjacent groups to form a ring, L is a direct bond, a substituted or unsubstituted arylene group having 6 to 30 ring-forming carbon atoms, or a substituted or unsubstituted heteroarylene group having 2 to 30 ring-forming carbon atoms, Ar₁ is a substituted or unsubstituted aryl group having 6 to 30 ring-forming carbon atoms, or a substituted or unsubstituted heteroaryl group having 2 to 30 ring-forming carbon atoms, m and n are each independently an integer of 0 to 4, and X is represented by any one among Formulae 2-1, 2-3 to 2-10, and 2-2-3 below:

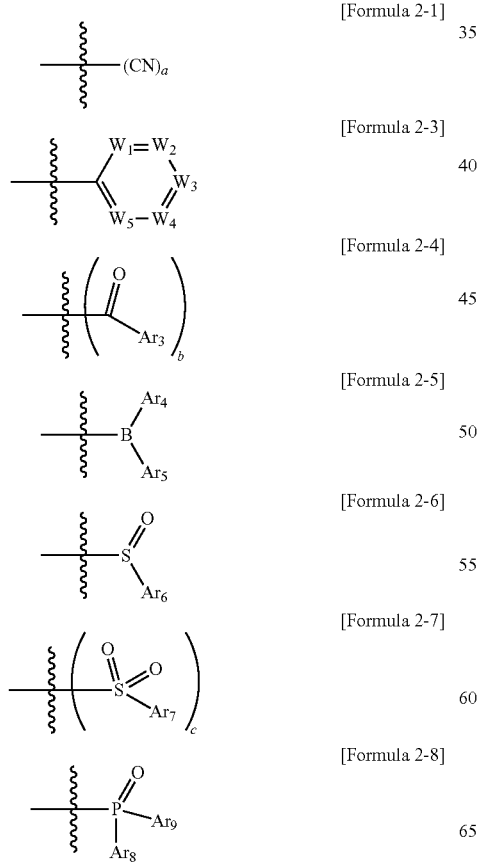

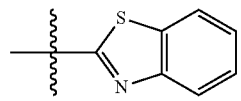

[Formula 2-9]

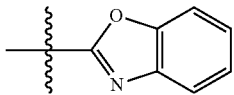

[Formula 2-10]

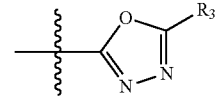

[Formula 2-2-3]

in Formulae 2-1, 2-3 to 2-10, and 2-2-3 above, a to c are each independently an integer of 1 to 4, $W_1$ to $W_5$ are each independently N or $CR_5$, and at least one selected from the group consisting of $W_1$ to $W_5$ is N, Ar₃ to Ar₉ are each independently a substituted or unsubstituted aryl group having 6 to 30 ring-forming carbon atoms or a substituted or unsubstituted heteroaryl group having 2 to 30 ring-forming carbon atoms, or are bonded to adjacent groups to form a ring, R₃ is a hydrogen atom, a deuterium atom, a halogen atom, a boron group, a substituted or unsubstituted amino group, a cyano group, a carbonyl group, a nitro group, an oxy group, a siloxy group, a silyl group, a phosphine oxide group, a phosphine sulfide group, a sulfinyl group, a sulfonyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to adjacent groups to form a ring, and R₅ is a hydrogen atom, a deuterium atom, a halogen atom, a boron group, a substituted or unsubstituted amino group, a cyano group, a carbonyl group, a nitro group, an oxy group, a siloxy group, a silyl group, a phosphine oxide group, a phosphine sulfide group, a sulfinyl group, a sulfonyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, wherein when X includes pyridine or is represented by Formula 2-1 or 2-3, L is a substituted arylene group having 6 to 30 ring-forming carbon atoms, wherein the substituted arylene group is substituted with at least one boron group, or a substituted heteroarylene group having 2 to 30 ring-forming carbon atoms, wherein the substituted heteroarylene group is substituted with at least one boron group, or at least one selected from R₁, R₂, or R₅ is a boron group, and wherein when X is represented by Formula 2-9, 2-10, or 2-2-3 above, the polycyclic compound includes the azaborine group of Formula 1 as the only azaborine group,

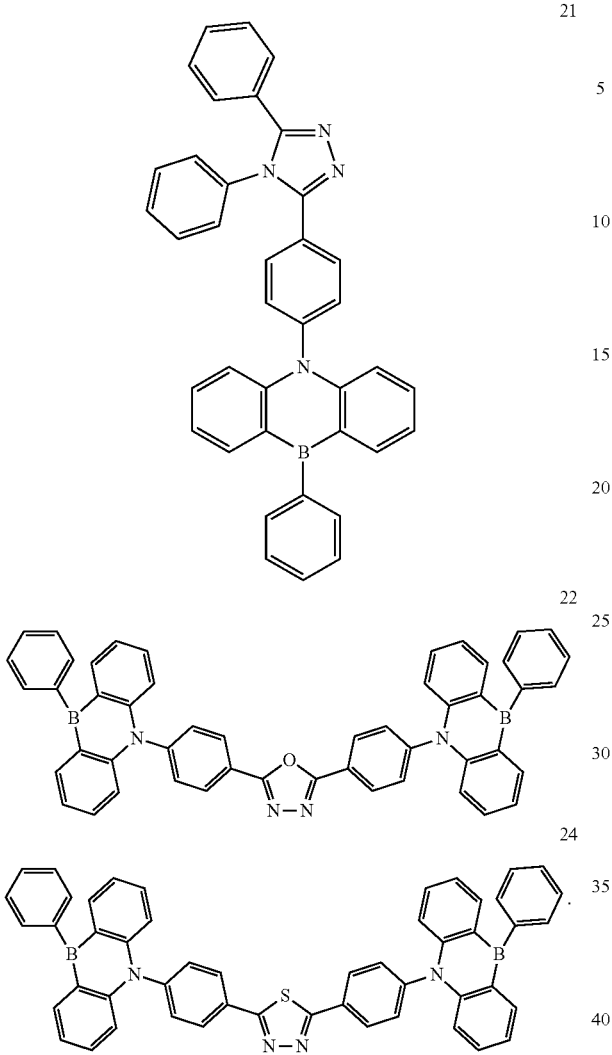

2. The organic electroluminescence device of claim 1, wherein the emission layer emits delayed fluorescence.

3. The organic electroluminescence device of claim 1,
   wherein the emission layer is a delayed fluorescence emission layer comprising a host and a dopant,
   wherein the dopant is the polycyclic compound.

4. The organic electroluminescence device of claim 1, wherein the emission layer is a thermally activated delayed fluorescence emission layer emitting blue light.

5. The organic electroluminescence device of claim 1, wherein $Ar_1$ is represented by Formula 3 below:

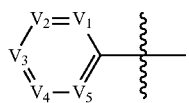

[Formula 3]

in Formula 3 above,
$V_1$ to $V_5$ are each independently N or $CR_6$, and
$R_6$ is a hydrogen atom, a deuterium atom, a halogen atom, a boron group, a substituted or unsubstituted amino group, a cyano group, a carbonyl group, an oxy group, a silyl group, a thiol group, a phosphine oxide group, a phosphine sulfide group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted aralkyl group having 7 to 30 carbon atoms, or a substituted or unsubstituted heteroaryl group having 2 to 30 ring-forming carbon atoms, or is bonded to an adjacent group to form a ring.

6. The organic electroluminescence device of claim 5,
   wherein at least one selected from the group consisting of $V_1$ and $V_5$ is $CR_7$,
   wherein $R_7$ is a substituted or unsubstituted alkyl group having 2 to 20 carbon atoms.

7. The organic electroluminescence device of claim 1, wherein Formula 2-3 above is represented by any one among Formulae 2-3-1 to 2-3-5 below:

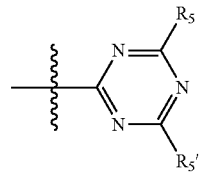

[Formula 2-3-1]

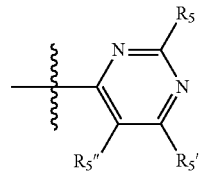

[Formula 2-3-2]

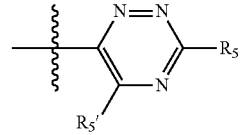

[Formula 2-3-3]

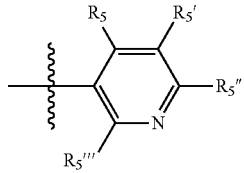

[Formula 2-3-4]

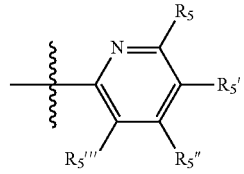

[Formula 2-3-5]

in Formulae 2-3-1 to 2-3-5 above,
$R_5$, $R_5'$, $R_5''$, and $R_5'''$ are each independently a hydrogen atom, a deuterium atom, a halogen atom, a boron group, a substituted or unsubstituted amino group, a cyano group, a carbonyl group, a nitro group, an oxy group, a siloxy group, a silyl group, a phosphine oxide group, a phosphine sulfide group, a sulfinyl group, a sulfonyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and wherein when Formula 2-3 above is represented by Formula 2-3-4 or Formula 2-3-5 above, the polycyclic compound includes at least one other borine group in addition to the azaborine group of Formula 1.

8. The organic electroluminescence device of claim 1, wherein L is a direct bond, a substituted or unsubstituted phenylene group, or a substituted or unsubstituted bivalent biphenyl group.

9. The organic electroluminescence device of claim 1, wherein Formula 1 is represented by any one among Formulae 4-1 to 4-4 below:

[Formula 4-1]

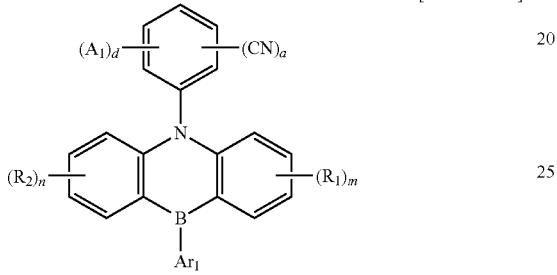

[Formula 4-2]

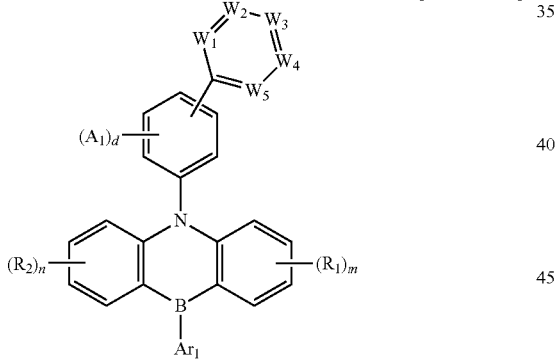

[Formula 4-3]

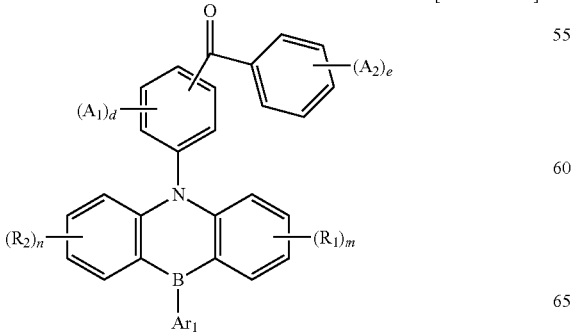

[Formula 4-4]

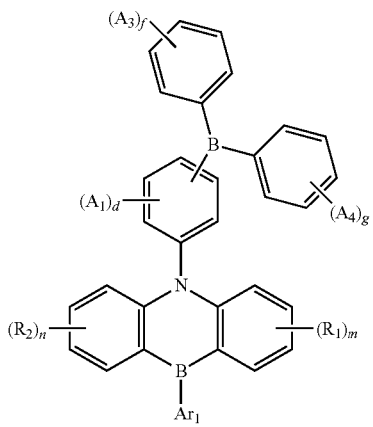

[Formula 4-5]

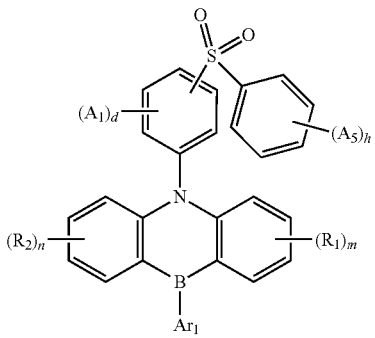

in Formulae 4-1 to 4-5 above, $A_1$ to $A_5$ are each independently a hydrogen atom, a deuterium atom, a halogen atom, a boron group, a substituted or unsubstituted amino group, a cyano group, a carbonyl group, an oxy group, a silyl group, a thiol group, a phosphine oxide group, a phosphine sulfide group, a substituted or unsubstituted alkyl group having 1 to 20 carbon atoms, a substituted or unsubstituted aryl group having 6 to 30 ring-forming carbon atoms, an aralkyl group, or a substituted or unsubstituted heteroaryl group having 2 to 30 ring-forming carbon atoms, or are bonded to adjacent groups to form a ring, d to h are each independently an integer of 0 to 4, $W_1$ to $W_5$, $R_1$, $R_2$, $Ar_1$, a, m, and n are the same as defined with respect to Formulae 1, 2-1 and 2-3, and in Formulae 4-1 and 4-2, the polycyclic compound at least one other boron group in addition to the azaborine group of Formula 4-1 or Formula 4-2.

10. The organic electroluminescence device of claim 1, wherein the polycyclic compound represented by Formula 1 is any one among compounds represented by Compound Group 1:

Compound Group 1
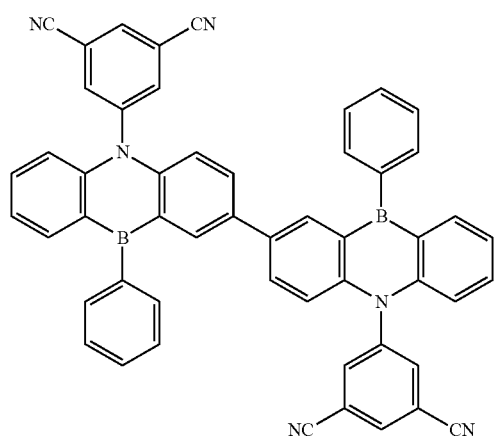
7
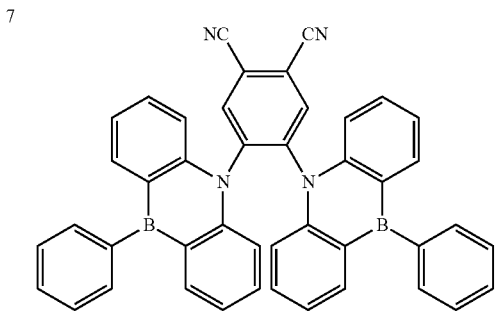
8
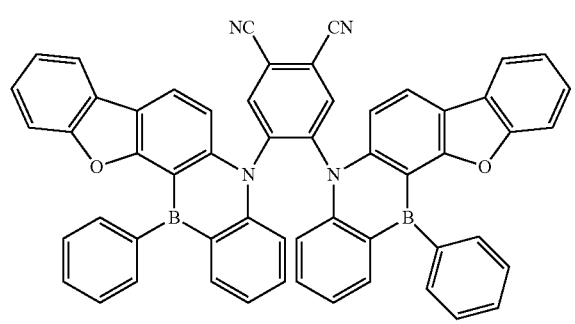
9
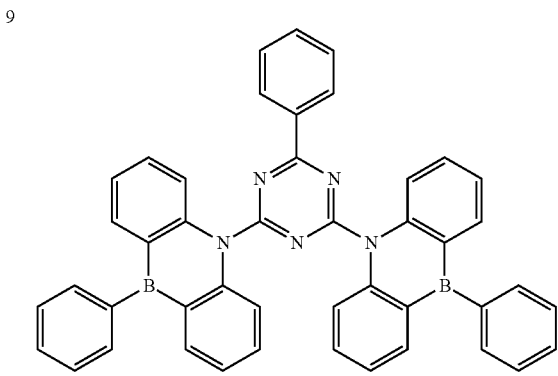
11
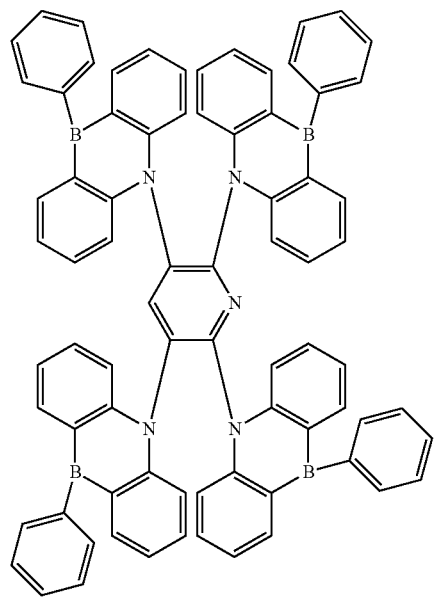
14
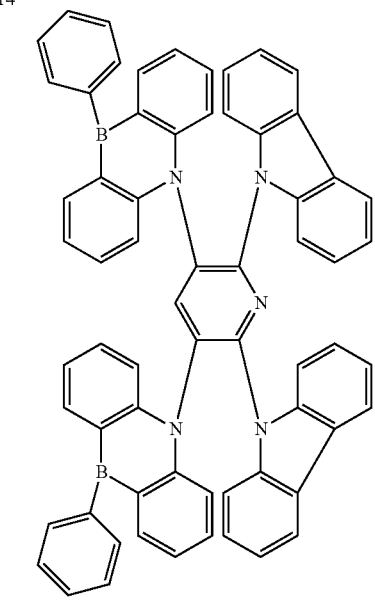
15

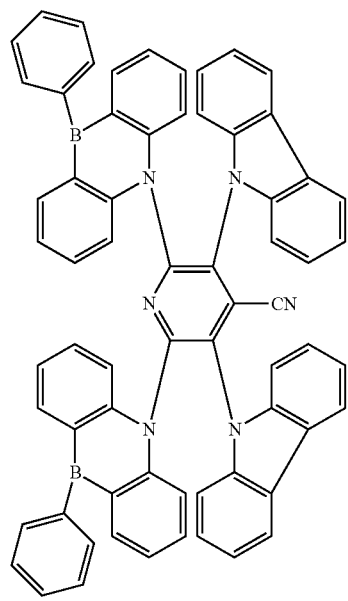
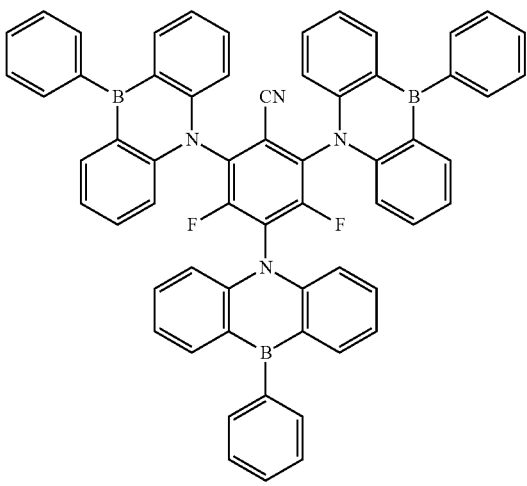
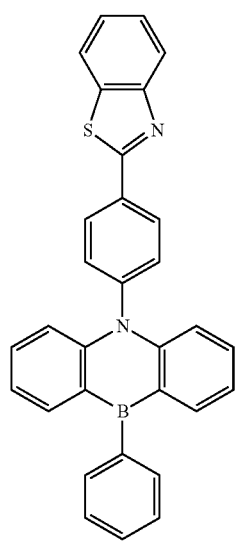
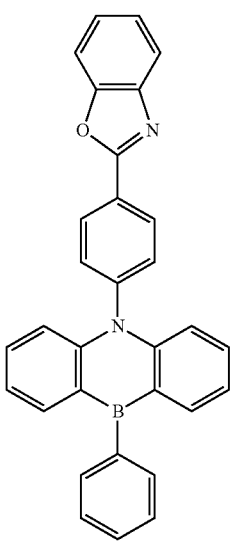

-continued
20
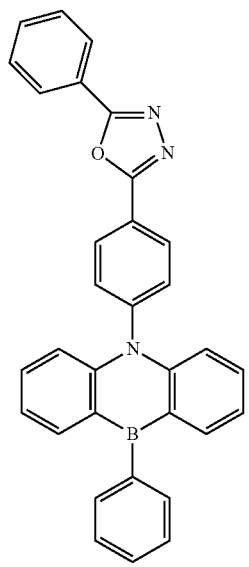
28
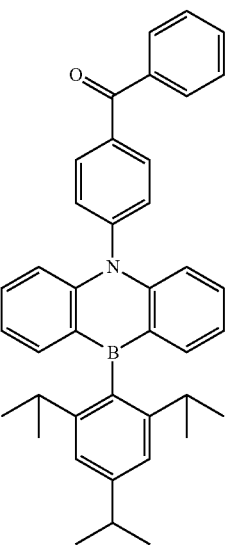
29
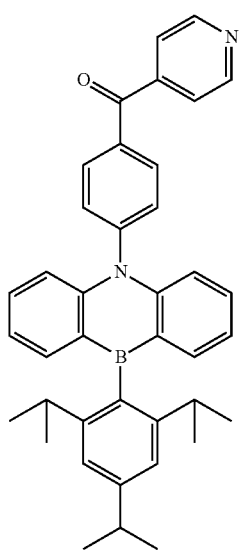
30
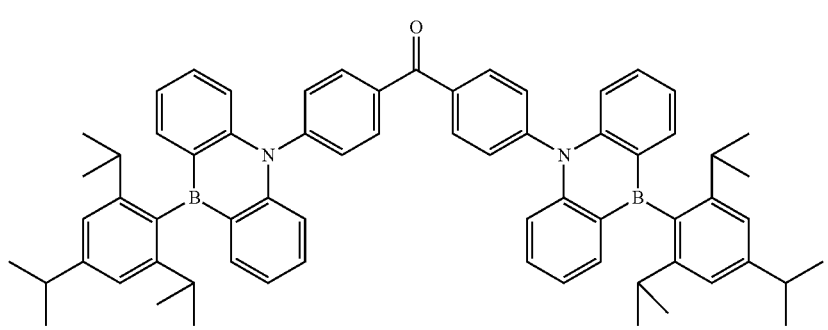

31
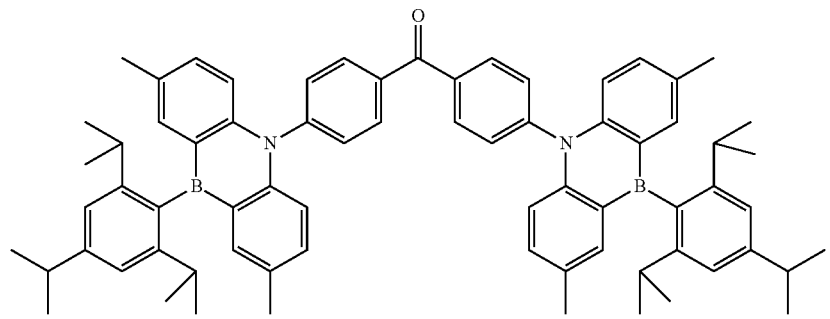
32
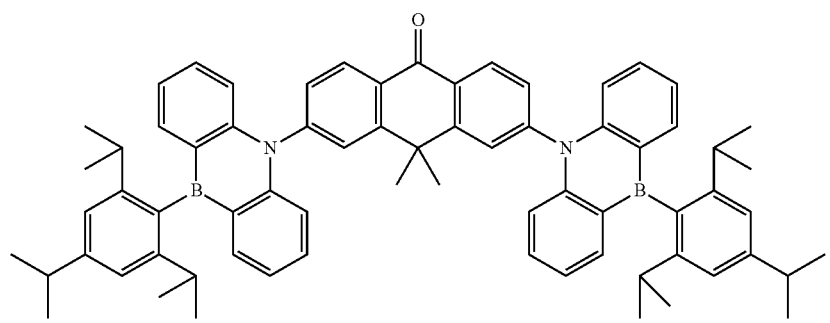
33
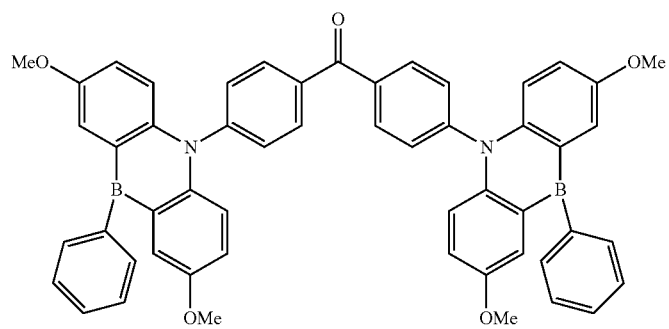
34
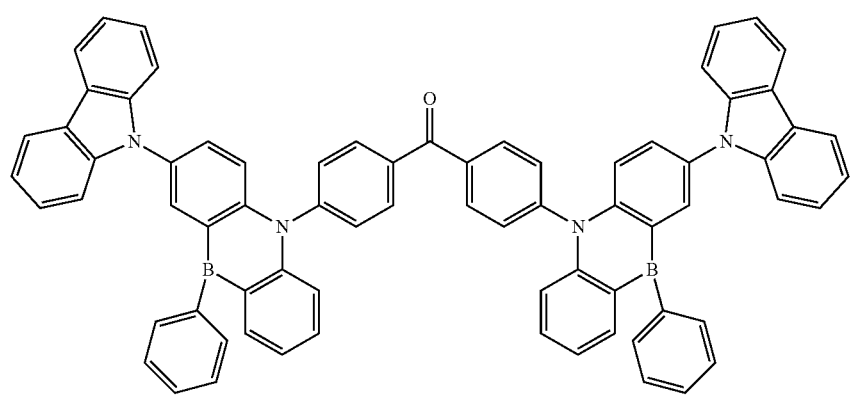

35
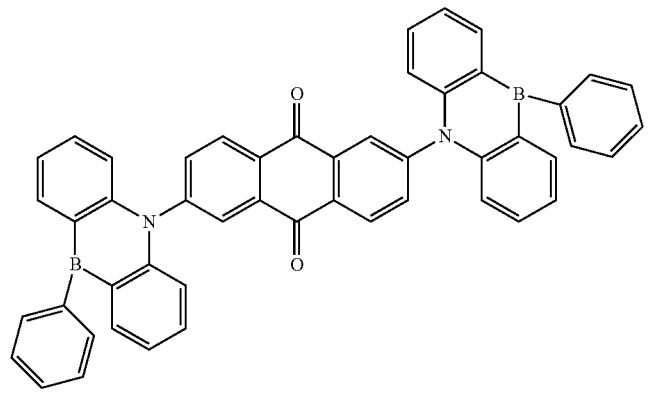
36
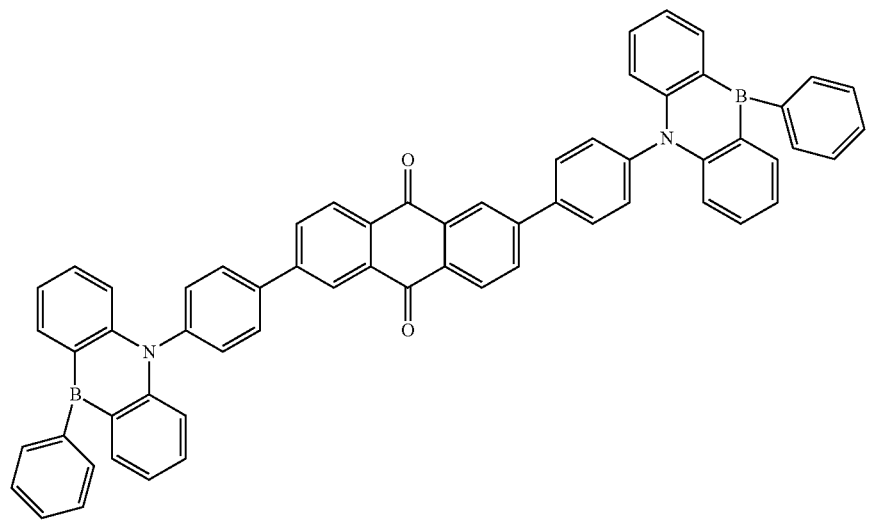
37
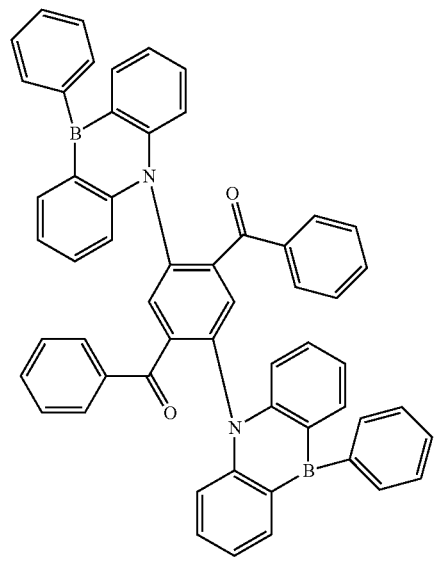
38
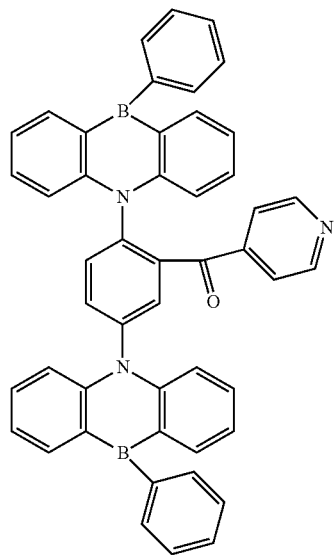

-continued
39
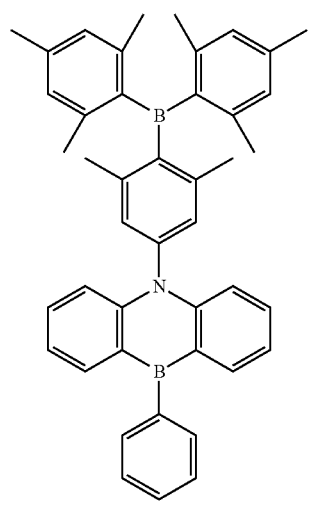
40
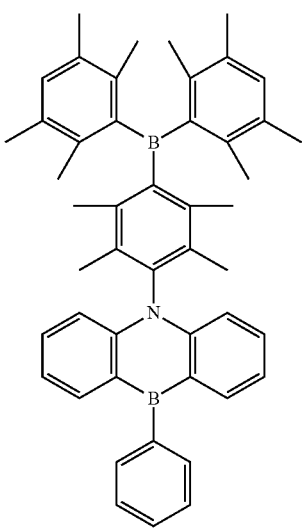
41
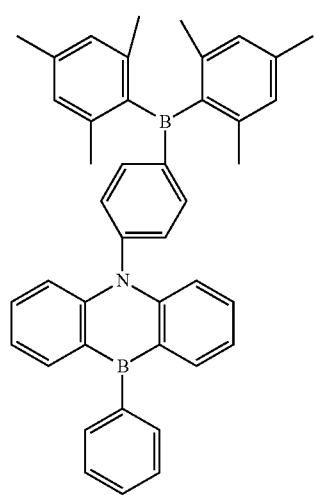
42
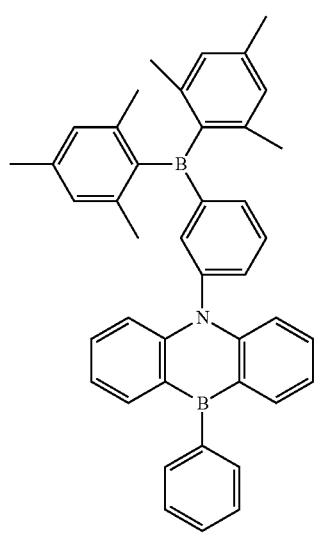
43
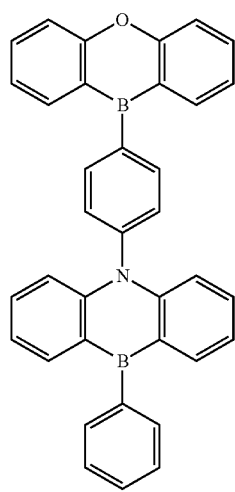
44
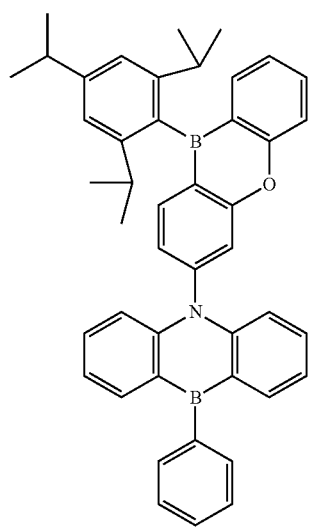

47
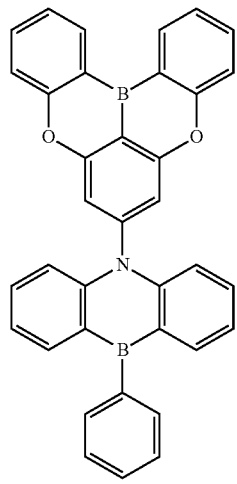
48
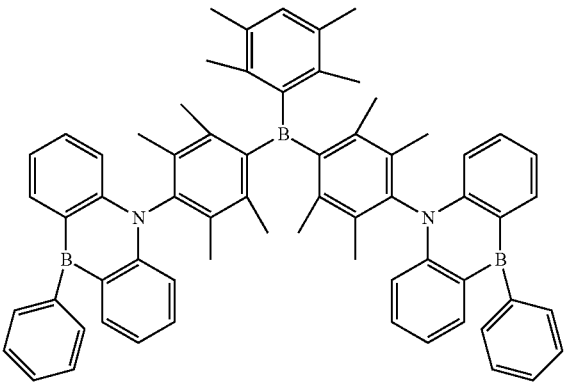
49
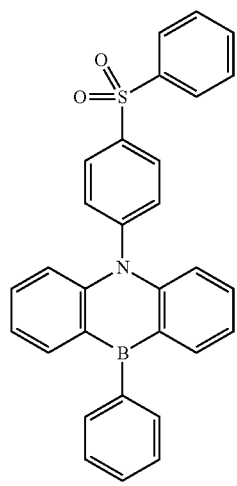
50
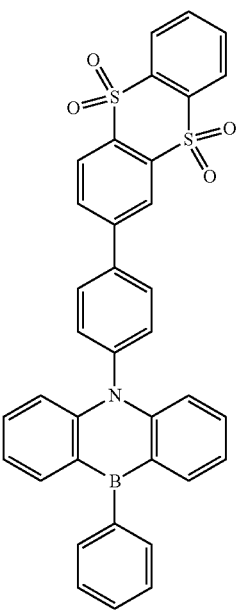

-continued
51
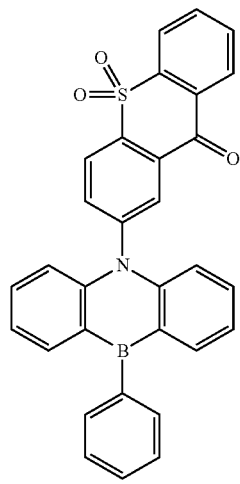
52
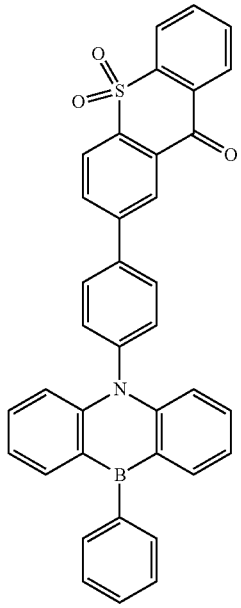
54
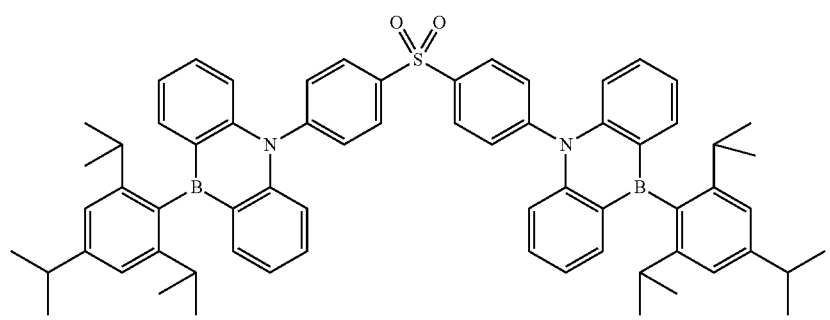
55
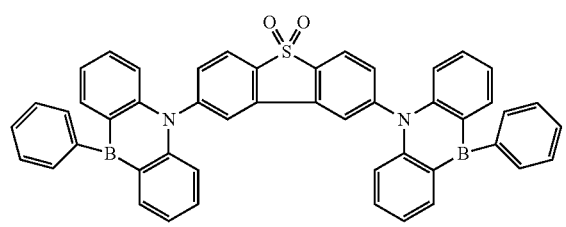
56
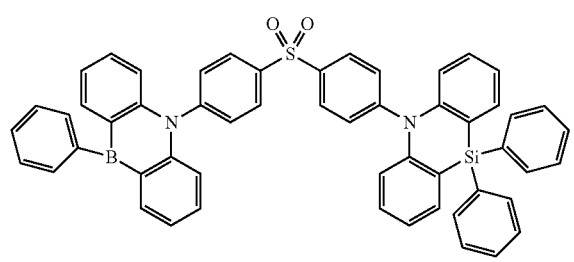
57
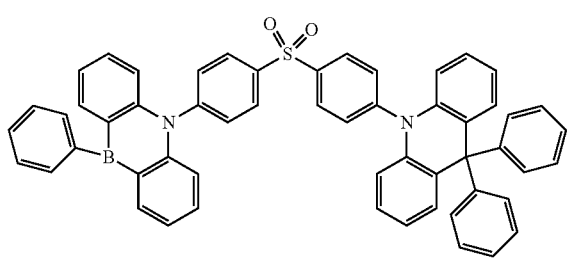
58

-continued
59
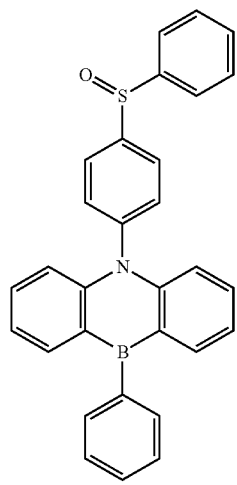
60
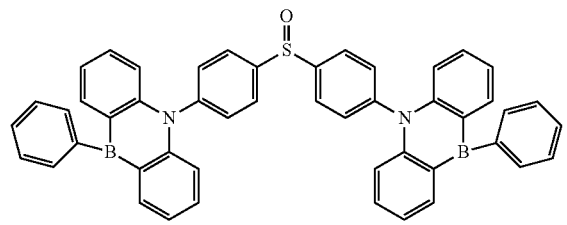
61
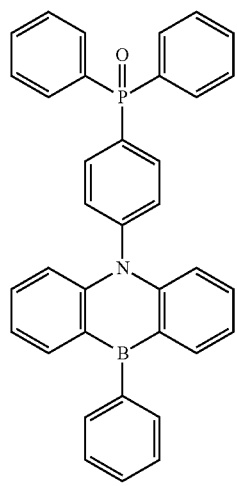
62
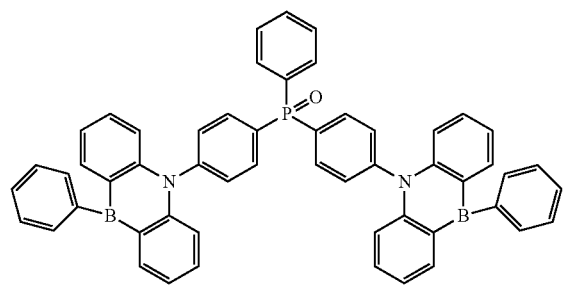
63
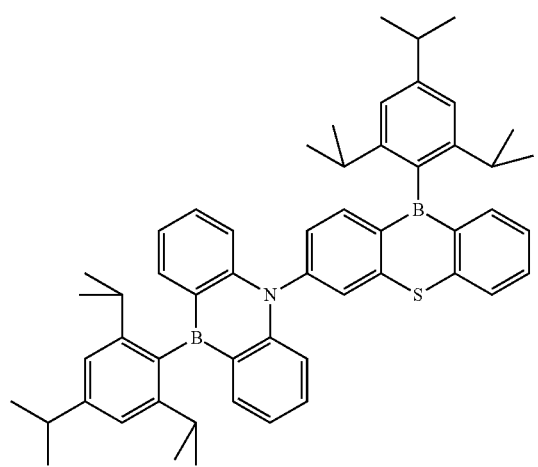
64
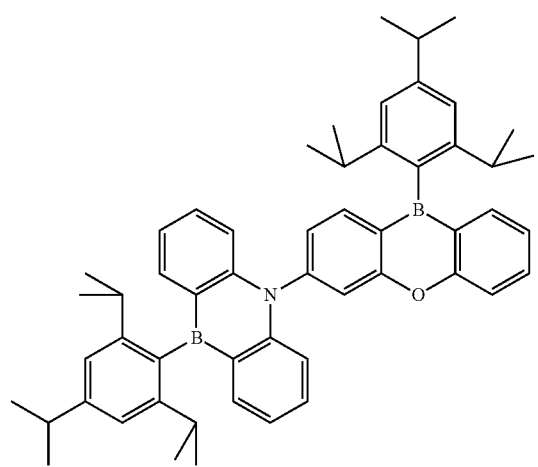

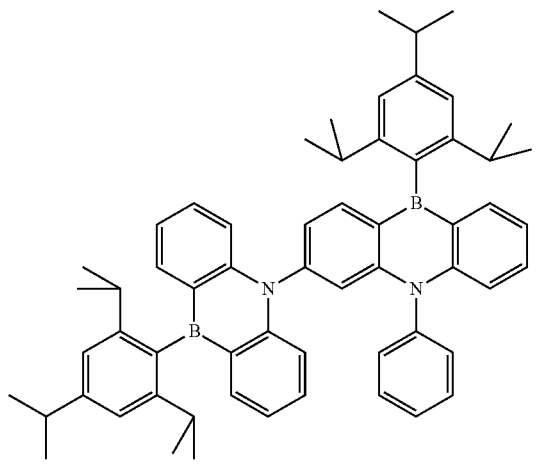
65

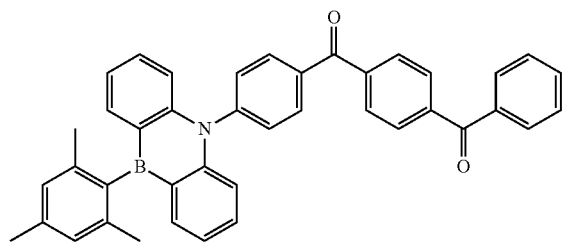
66

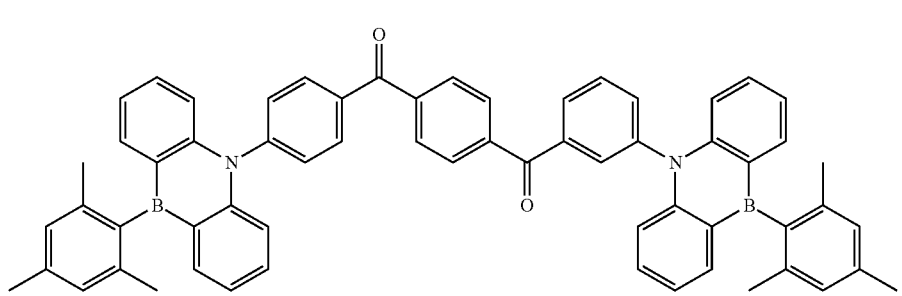
67

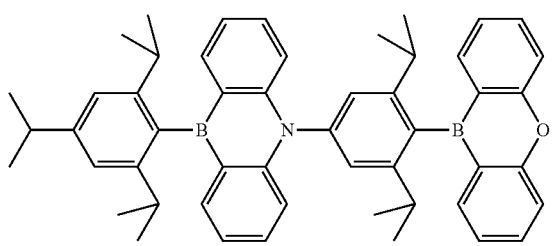
68

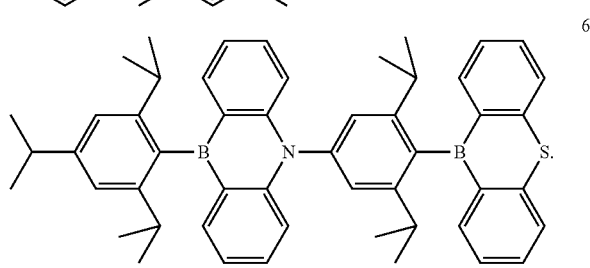
69

11. A polycyclic compound represented by Formula 1 below or compound 21, 22, or 24:

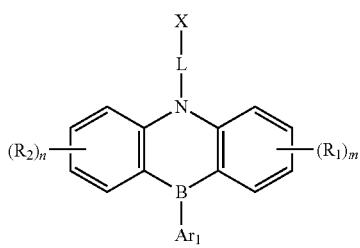

[Formula 1]

in Formula 1 above, $R_1$ and $R_2$ are each independently a hydrogen atom, a deuterium atom, a halogen atom, a boron group, a substituted or unsubstituted amino group, a cyano group, a carbonyl group, a nitro group, a siloxy group, a silyl group, a phosphoryl group, a thiophosphoryl group, a substituted or unsubstituted thiol group, a sulfinyl group, a sulfonyl group, a substituted or unsubstituted alkoxy group having 1 to 20 carbon atoms, a substituted or unsubstituted aryloxy group having 6 to 30 ring-forming carbon atoms, a substituted or unsubstituted alkyl group having 1 to 20 carbon atoms, a substituted or unsubstituted aralkyl group having 7 to 30 carbon atoms, a substituted or unsubstituted aryl group having 6 to 30 ring-forming carbon atoms, or a substituted or unsubstituted heteroaryl group having 2 to 30 ring-forming carbon atoms, or are bonded to adjacent groups to form a ring, L is a direct bond, a substituted or unsubstituted arylene group having 6 to 30 ring-forming carbon atoms, or a substituted or unsubstituted heteroarylene group having 2 to 30 ring-forming carbon atoms, $Ar_1$ is a substituted or unsubstituted aryl group having 6 to 30 ring-forming carbon atoms, or a substituted or unsubstituted heteroaryl group having 2 to 30 ring-forming carbon atoms, m and n are each independently an integer of 0 to 4, and X is represented by any one among Formulae 2-1, 2-3 to 2-10, and 2-2-3 below:

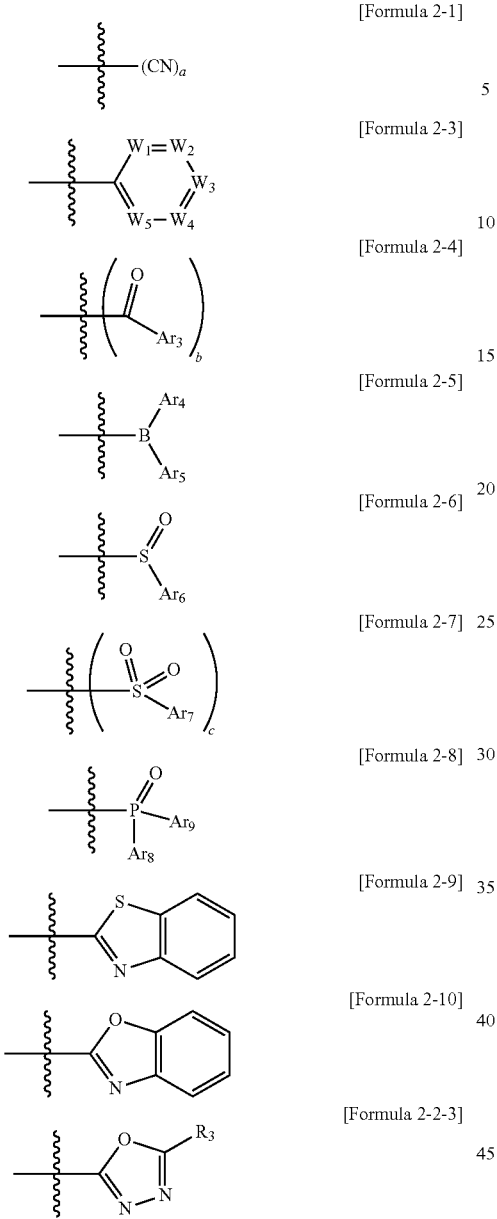

[Formula 2-1]
[Formula 2-3]
[Formula 2-4]
[Formula 2-5]
[Formula 2-6]
[Formula 2-7]
[Formula 2-8]
[Formula 2-9]
[Formula 2-10]
[Formula 2-2-3]

in Formulae 2-1, 2-3 to 2-10, and 2-2-3 above, a to c are each independently an integer of 1 to 4, $W_1$ to $W_5$ are each independently N or $CR_5$, and at least one selected from the group consisting of $W_1$ to $W_5$ is N, $Ar_3$ to $Ar_9$ are each independently a substituted or unsubstituted aryl group having 6 to 30 ring-forming carbon atoms or a substituted or unsubstituted heteroaryl group having 2 to 30 ring-forming carbon atoms, or are bonded to adjacent groups to form a ring, $R_3$ is a hydrogen atom, a deuterium atom, a halogen atom, a boron group, a substituted or unsubstituted amino group, a cyano group, a carbonyl group, a nitro group, an oxy group, a siloxy group, a silyl group, a phosphine oxide group, a phosphine sulfide group, a sulfinyl group, a sulfonyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to adjacent groups to form a ring, and $R_5$ is a hydrogen atom, a deuterium atom, a halogen atom, a boron group, a substituted or unsubstituted amino group, a cyano group, a carbonyl group, a nitro group, an oxy group, a siloxy group, a silyl group, a phosphine oxide group, a phosphine sulfide group, a sulfinyl group, a sulfonyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, wherein when X includes pyridine or is represented by Formula 2-1 or 2-3, L is a substituted arylene group having 6 to 30 ring-forming carbon atoms, wherein the substituted arylene group is substituted with at least one boron group, or a substituted heteroarylene group having 2 to 30 ring-forming carbon atoms, wherein the substituted heteroarylene group is substituted with at least one boron group, or at least one selected from $R_1$, $R_2$, or $R_5$ is a boron group, and wherein when X is represented by Formula 2-9, 2-10, or 2-2-3 above, the polycyclic compound includes the azaborine group of Formula 1 as the only azaborine group,

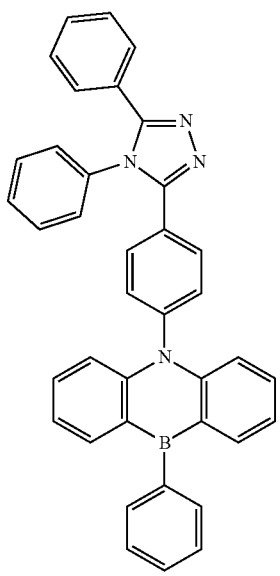

21

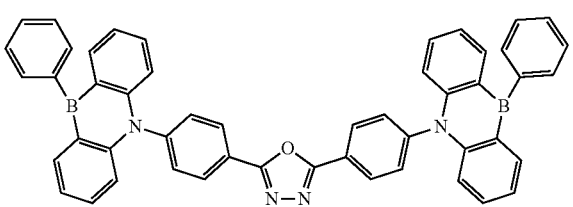

22

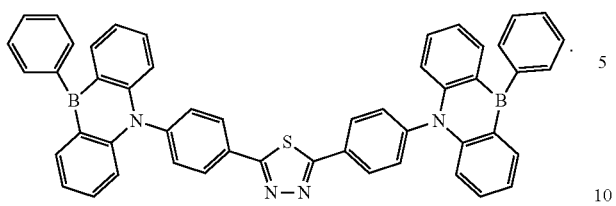

24

12. The polycyclic compound of claim 11, wherein $Ar_1$ is represented by Formula 3 below:

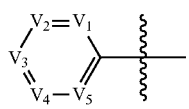

[Formula 3]

in Formula 3 above, $V_1$ to $V_5$ are each independently N or $CR_6$, and $R_6$ is a hydrogen atom, a deuterium atom, a halogen atom, a boron group, a substituted or unsubstituted amino group, a cyano group, a carbonyl group, an oxy group, a silyl group, a thiol group, a phosphine oxide group, a phosphine sulfide group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted aralkyl group having 7 to 30 carbon atoms, or a substituted or unsubstituted heteroaryl group having 2 to 30 ring-forming carbon atoms, or is bonded to an adjacent group to form a ring.

13. The polycyclic compound of claim 12,
wherein at least one selected from the group consisting of $V_1$ and $V_5$ is $CR_7$,
wherein $R_7$ is a substituted or unsubstituted alkyl group having 2 to 20 carbon atoms.

14. The polycyclic compound of claim 11, wherein the compound represented by Formula 1 above is a thermally activated delayed fluorescence emission material.

15. The polycyclic compound of claim 11, wherein Formula 2-3 above is represented by any one among Formulae 2-3-1 to 2-3-5 below:

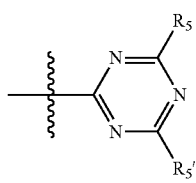

[Formula 2-3-1]

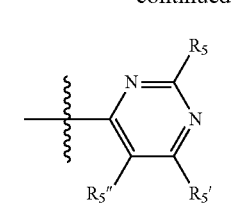

[Formula 2-3-2]

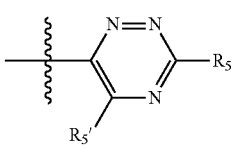

[Formula 2-3-3]

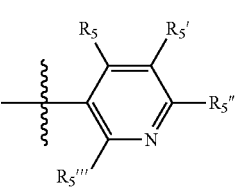

[Formula 2-3-4]

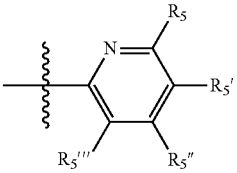

[Formula 2-3-5]

in Formulae 2-3-1 to 2-3-5 above, $R_5$, $R_5'$, $R_5''$, and $R_5'''$ are each independently a hydrogen atom, a deuterium atom, a halogen atom, a boron group, a substituted or unsubstituted amino group, a cyano group, a carbonyl group, a nitro group, an oxy group, a siloxy group, a silyl group, a phosphine oxide group, a phosphine sulfide group, a sulfinyl group, a sulfonyl group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and wherein when Formula 2-3 above is represented by Formula 2-3-4 above or Formula 2-3-5 above, the polycyclic compound includes at least one other borine group in addition to the azaborine group of Formula 1.

16. The polycyclic compound of claim 11, wherein the polycyclic compound represented by Formula 1 above is any one among compounds represented by Compound Group 1:

Compound Group 1
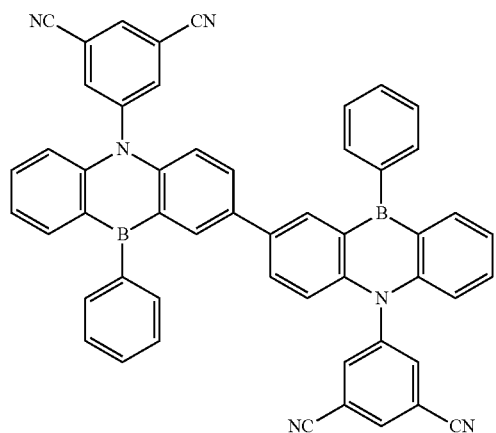
7
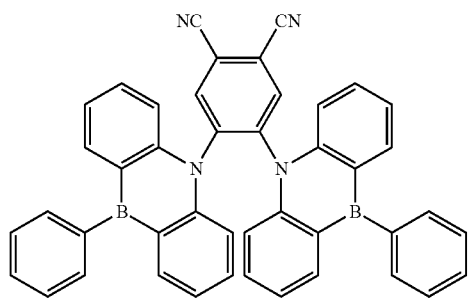
8
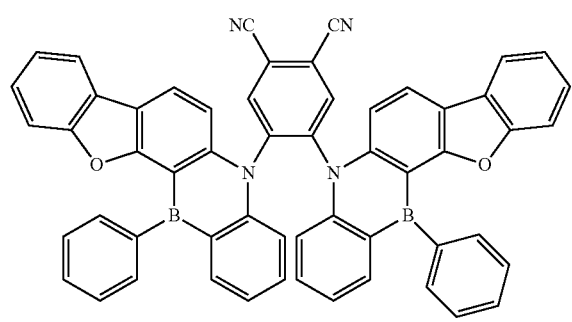
9
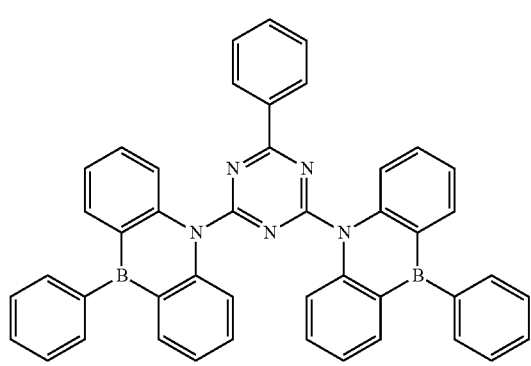
11
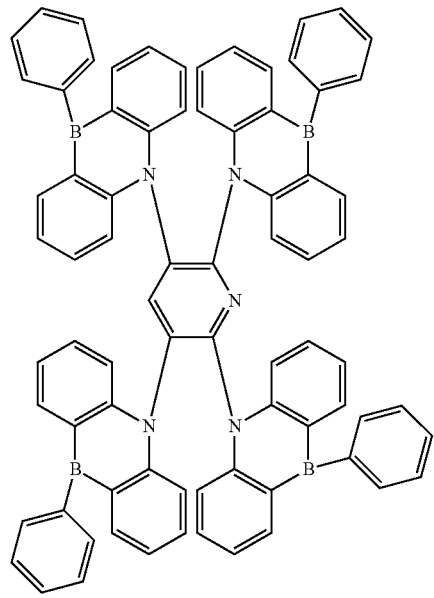
14
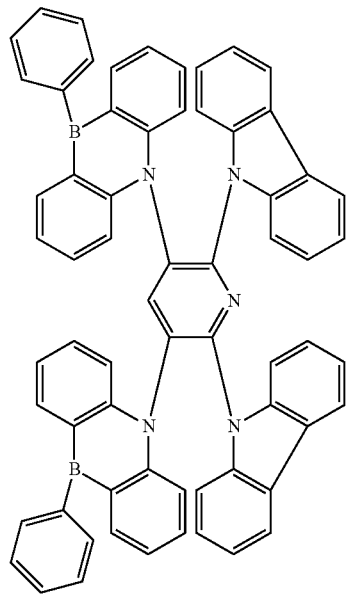
15

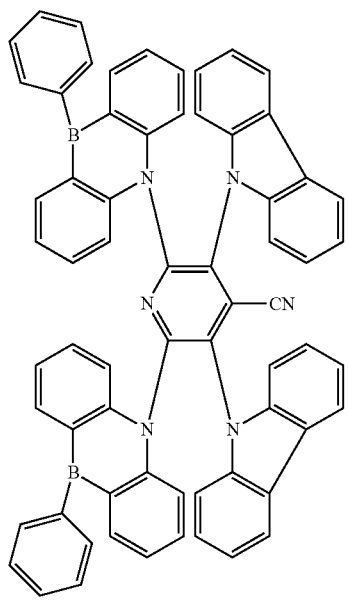
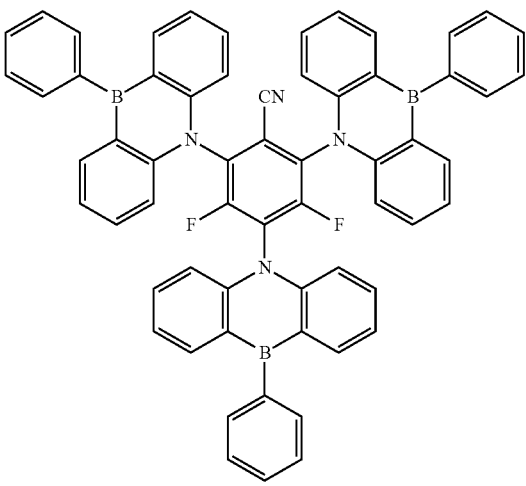
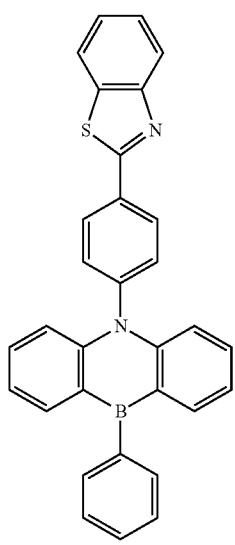
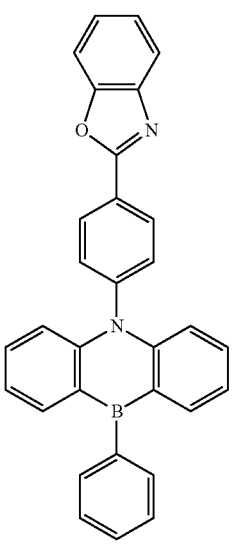

20
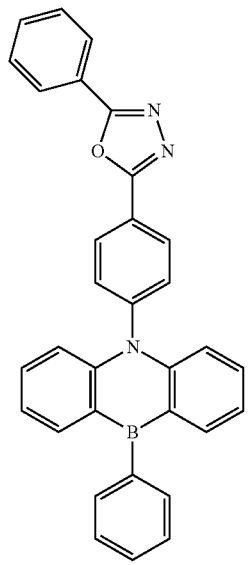
28
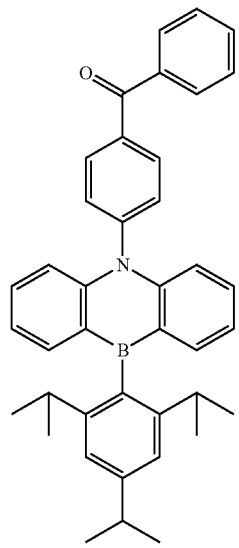
29
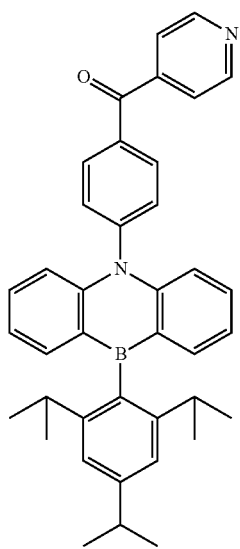
30
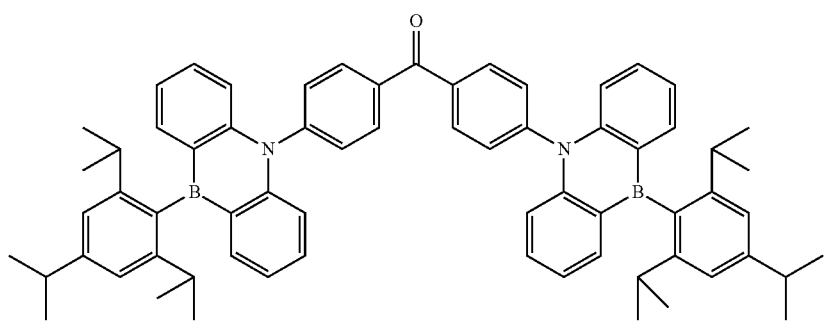

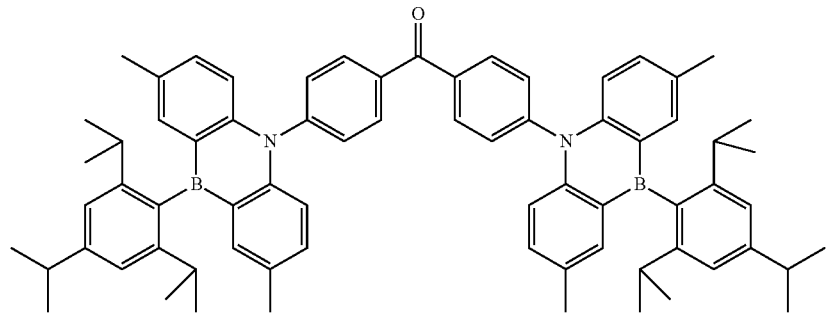
31
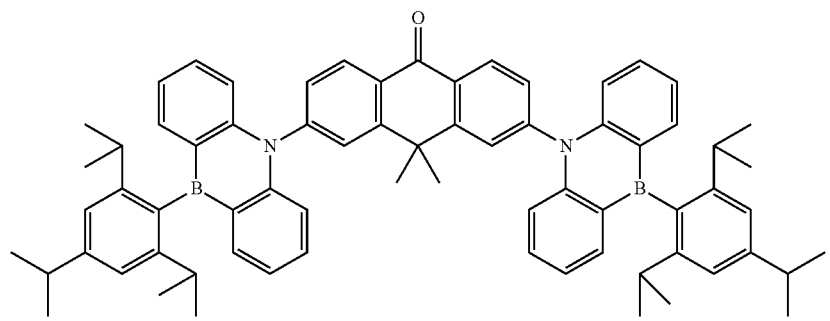
32
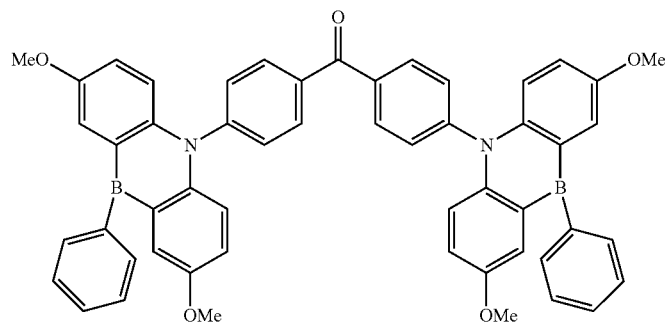
33
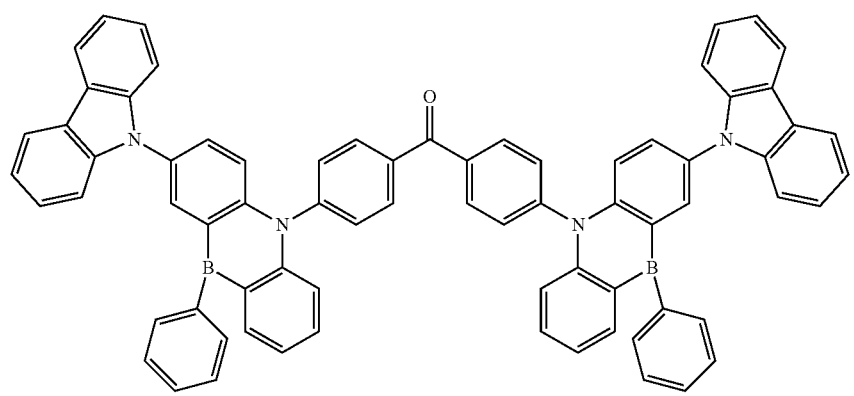
34

-continued
35
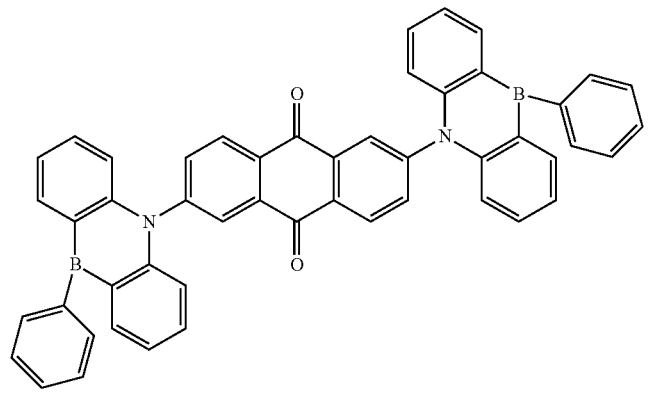
36
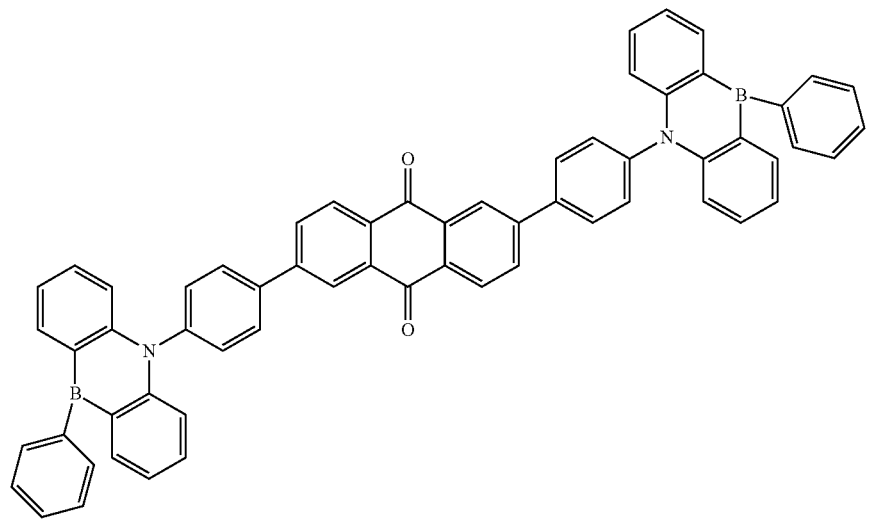
37
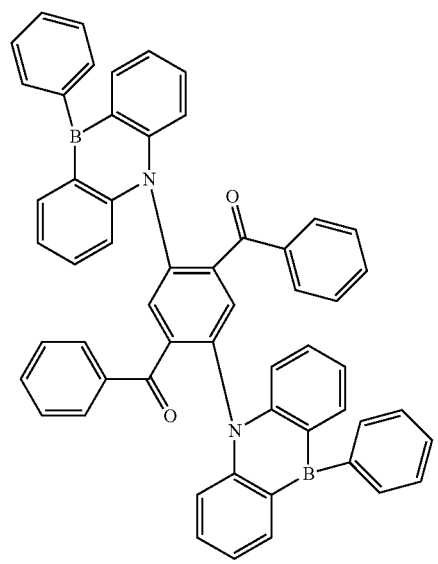
38
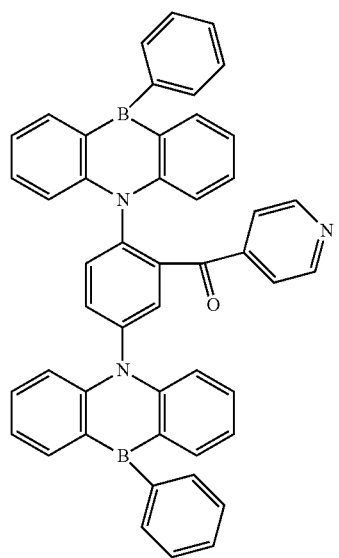

-continued
39
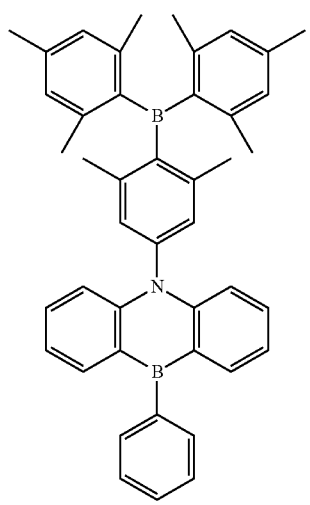
40
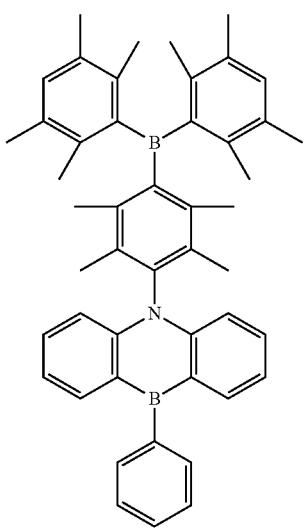
41
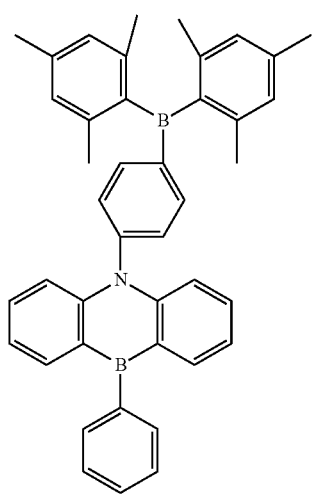
42
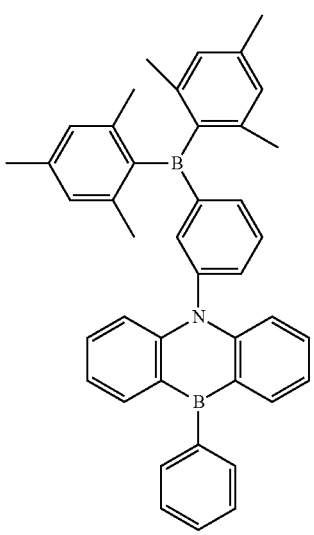
43
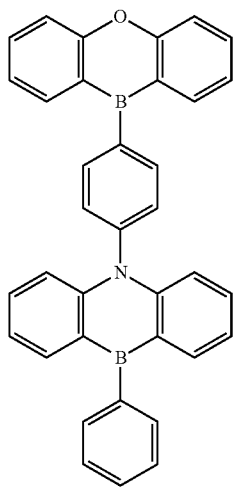
44
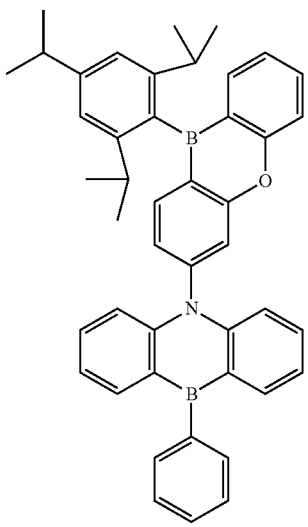

47
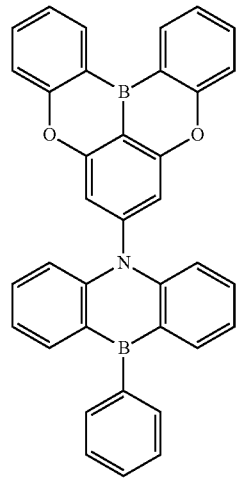
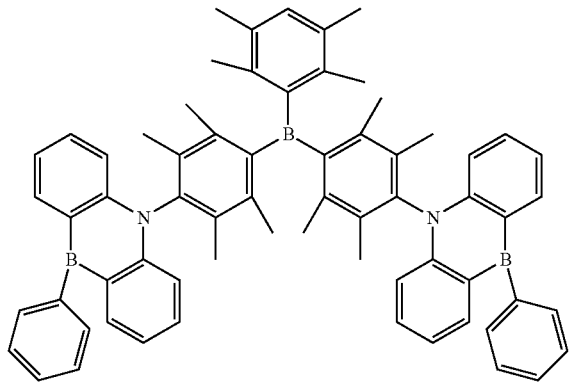
48
49
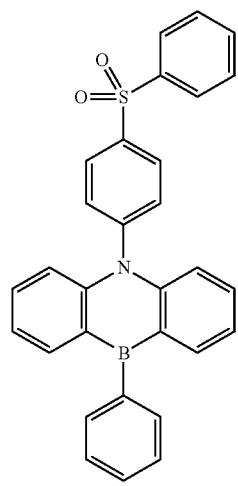
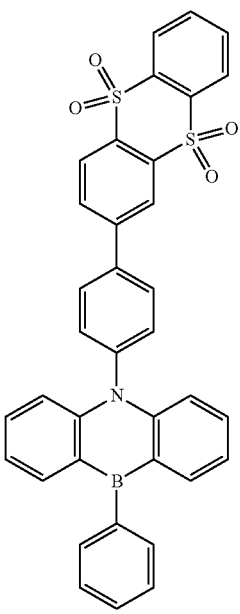
50

-continued
51
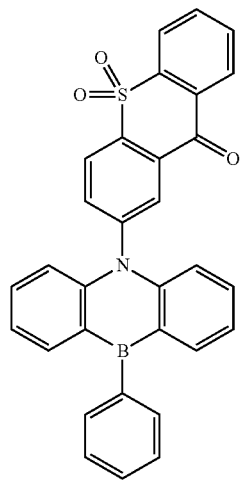
52
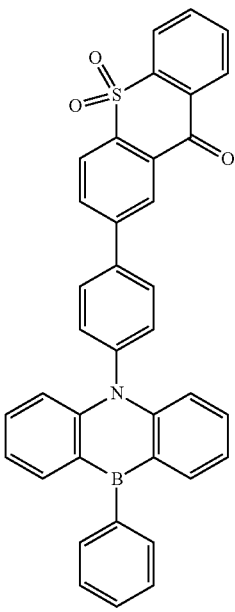
54
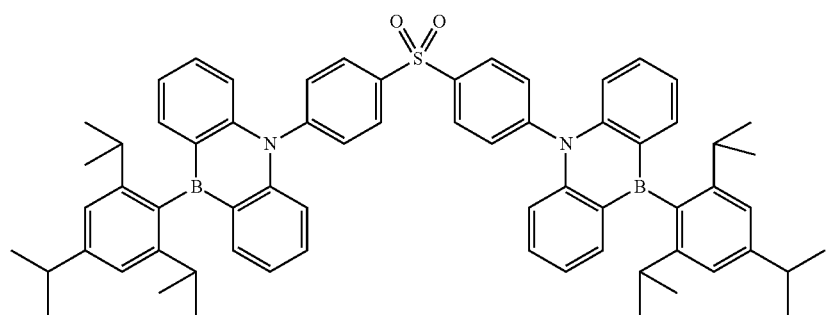
55
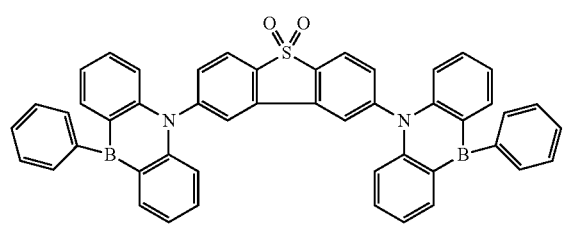
56
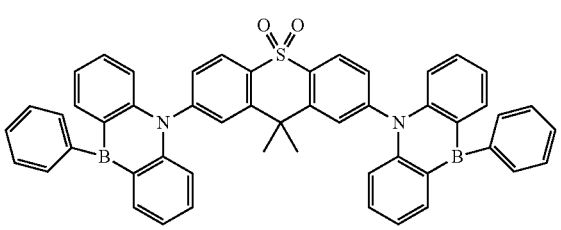
57
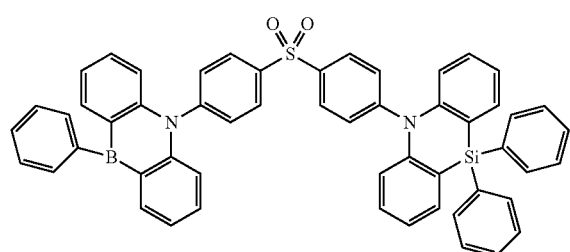
58
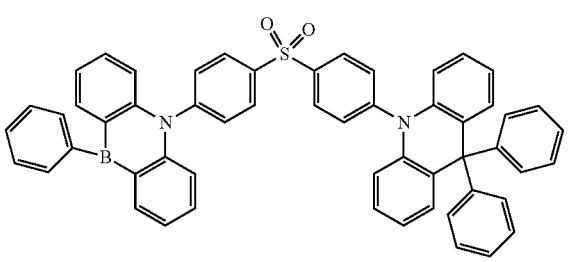

-continued
59
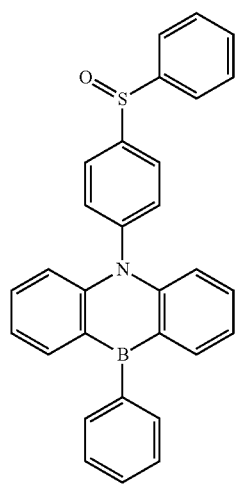
60
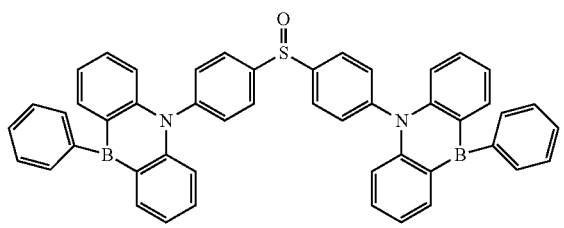
61
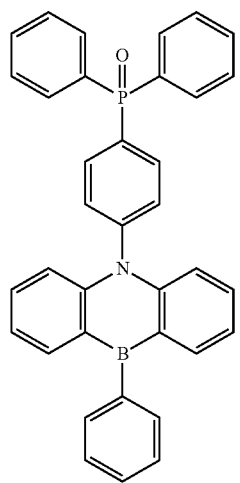
62
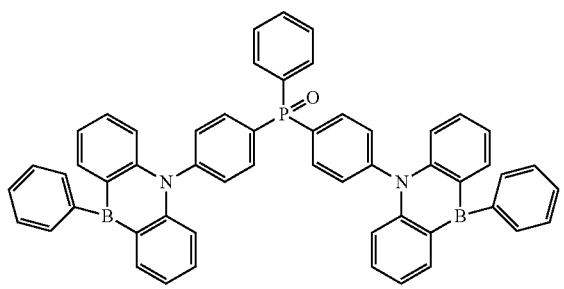
63
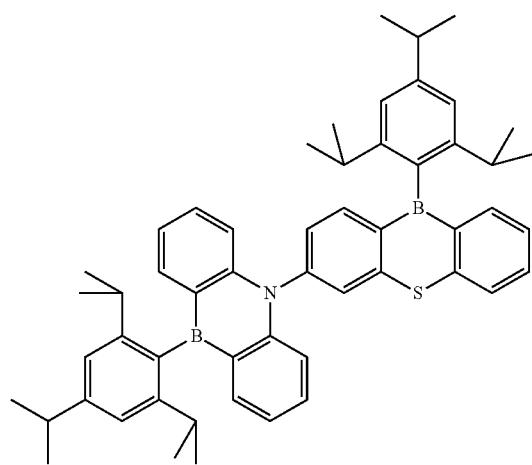
64
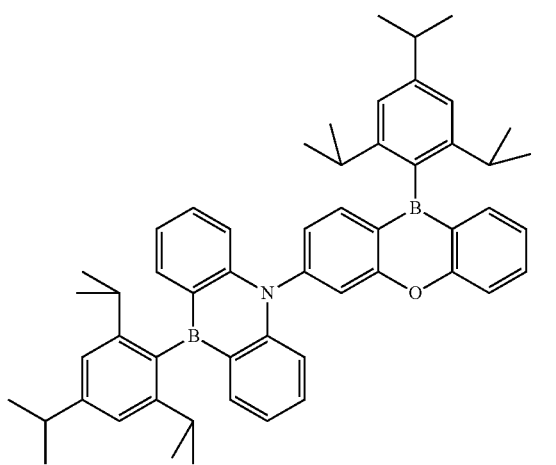

111 112
-continued
65
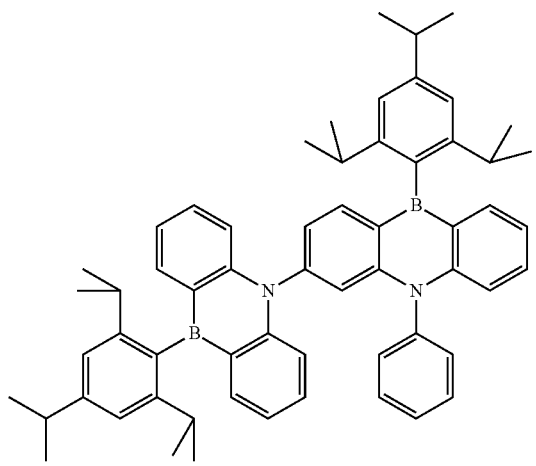
66
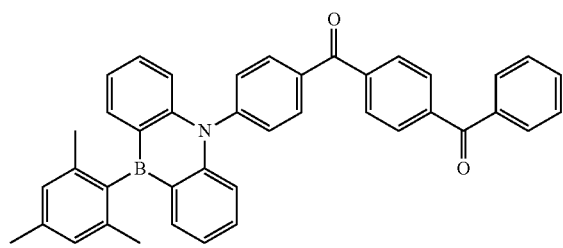
67
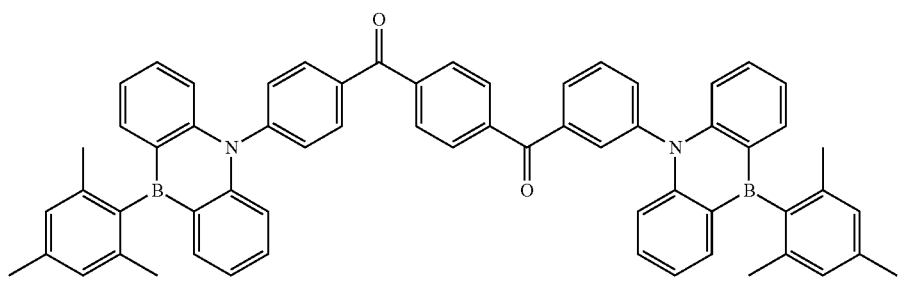
68
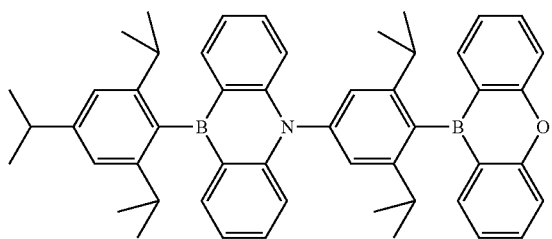
69
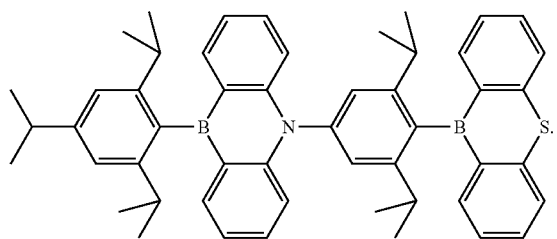
17. A polycyclic compound is any one among compounds represented by Compound Group 1-1:
[Compound Group 1-1]
5
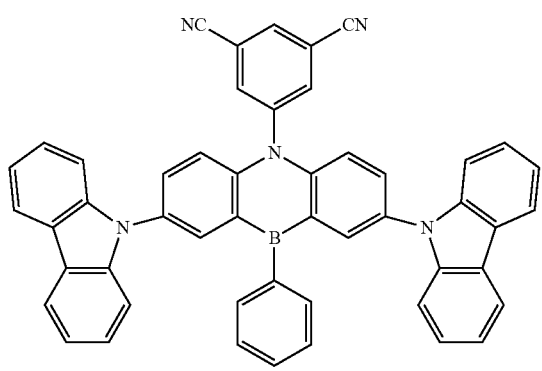
6
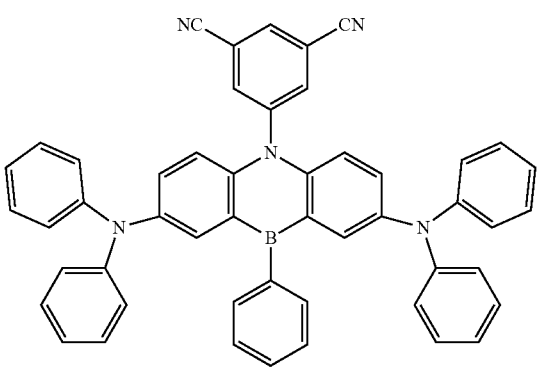

-continued
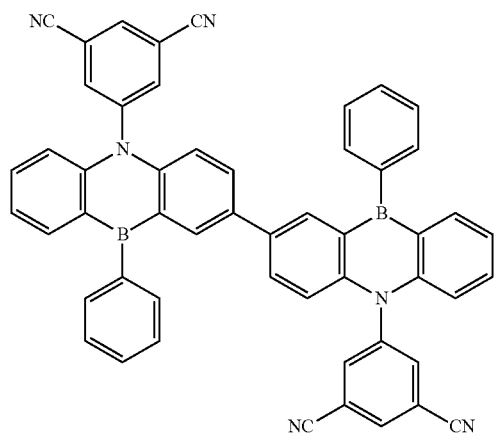
7
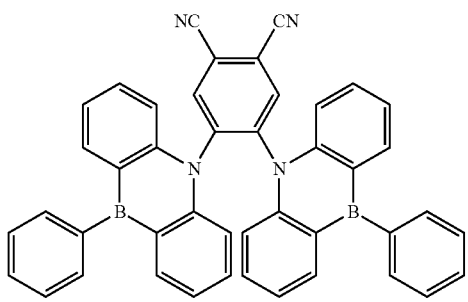
8
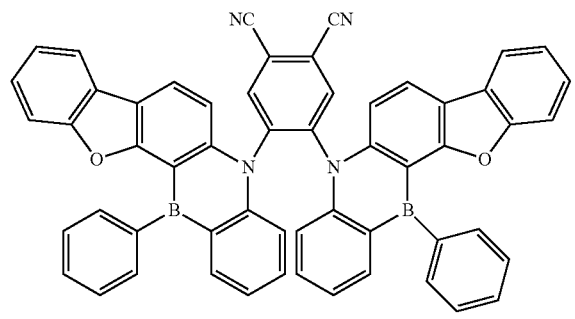
9
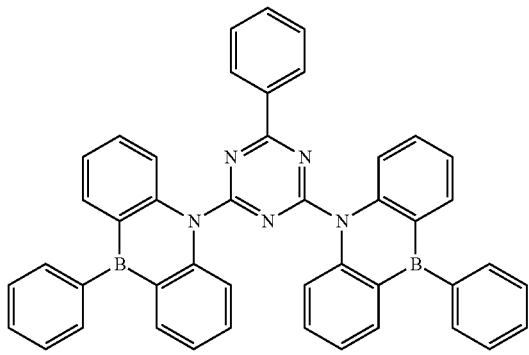
11
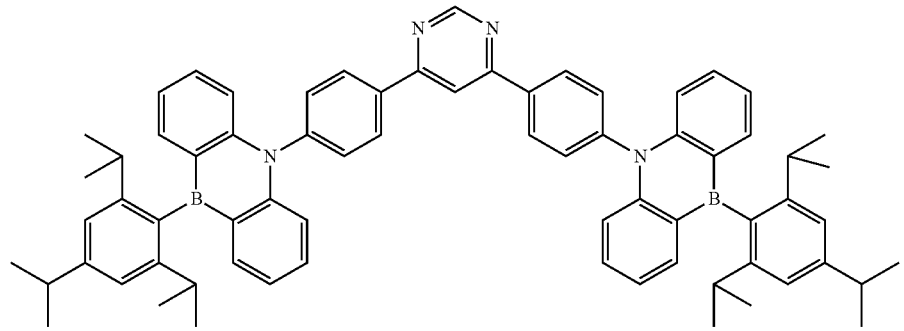
12

-continued
13
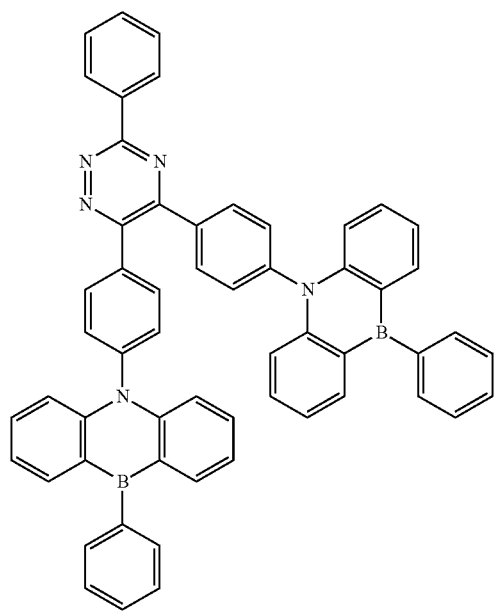
14
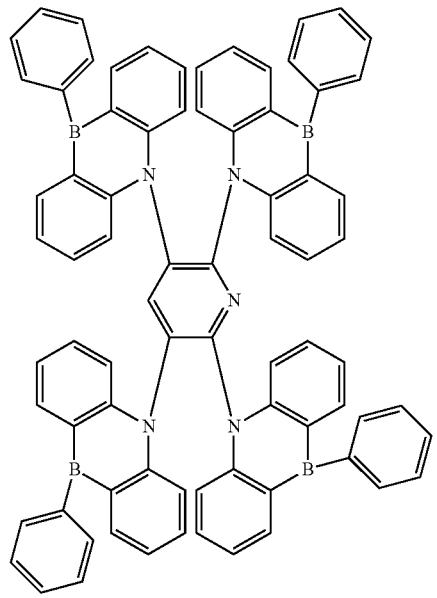
15
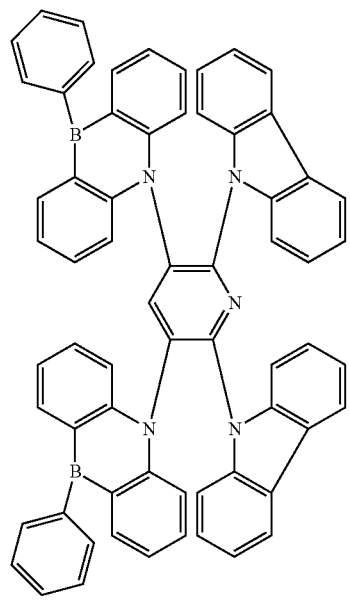
16
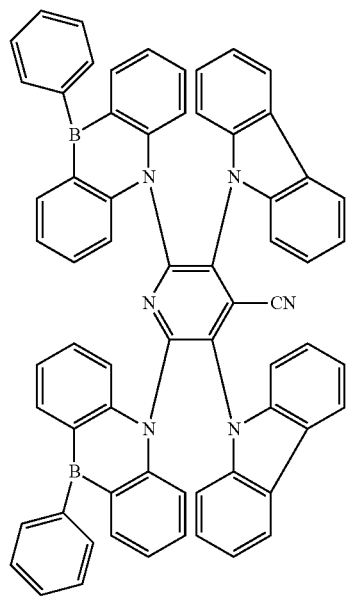

-continued
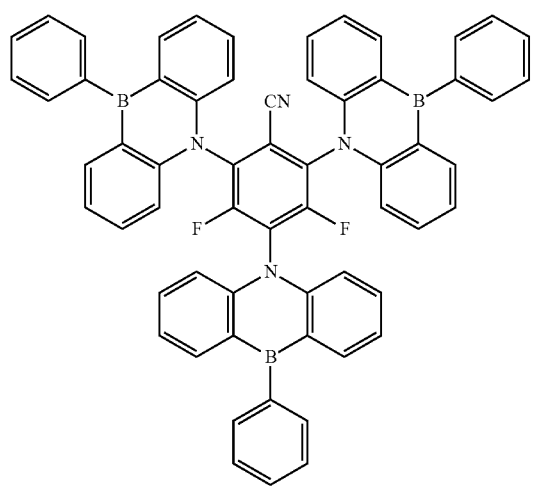
17
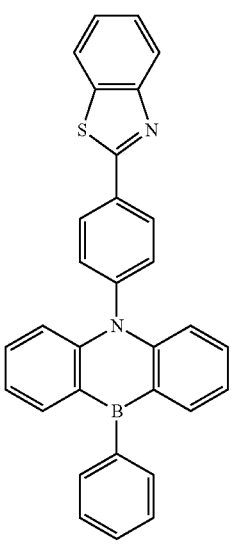
18
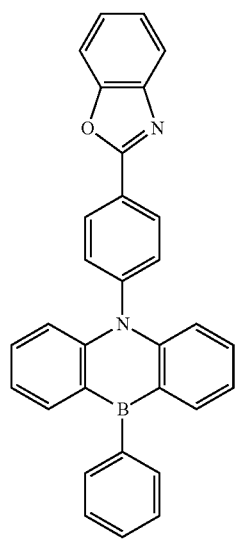
19
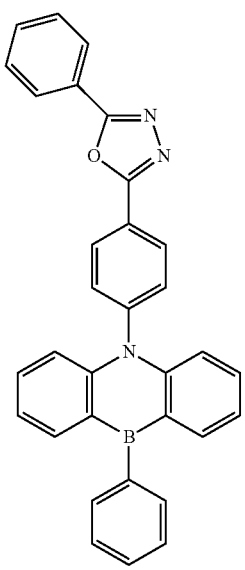
20

21
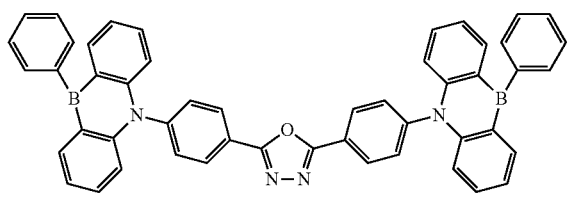
22
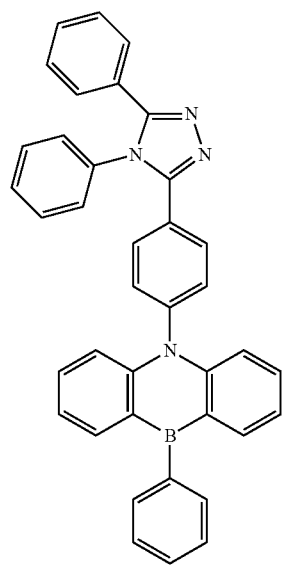
24
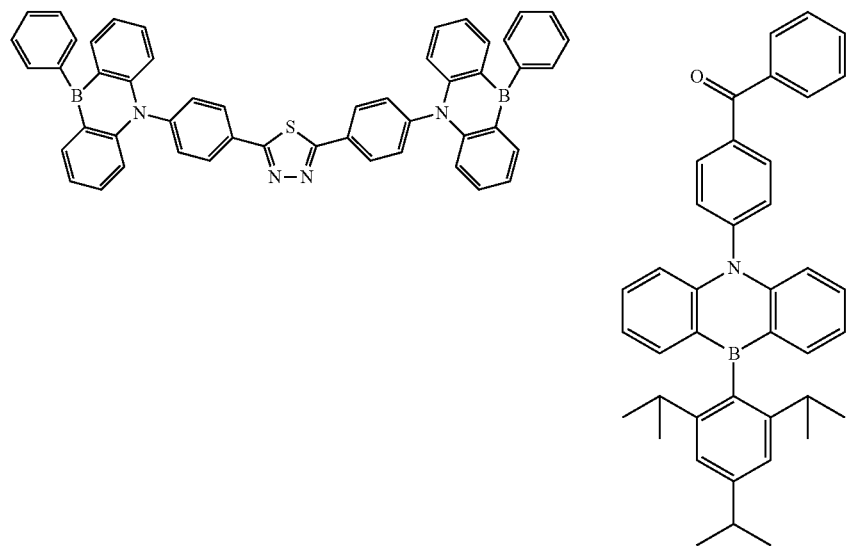
28

29
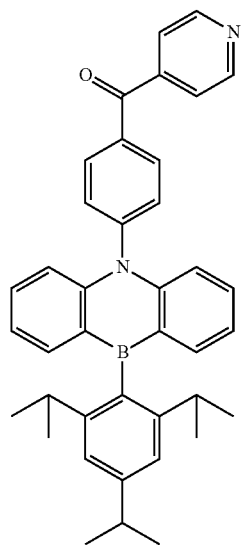
30
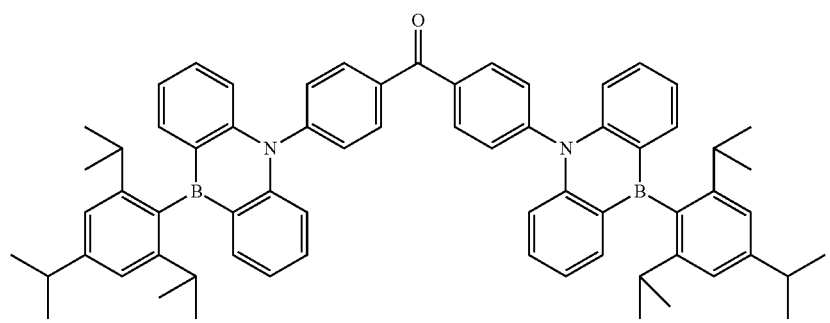
31
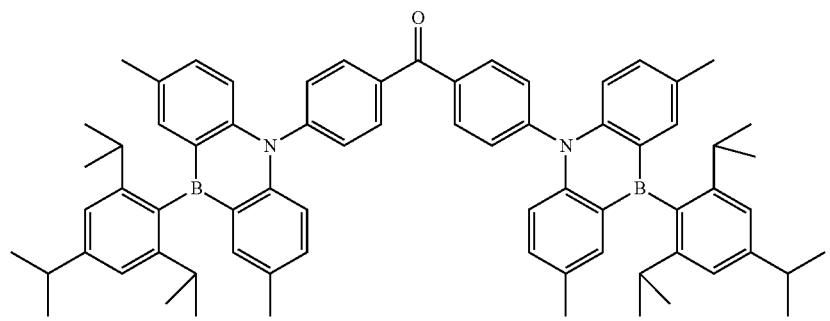
32
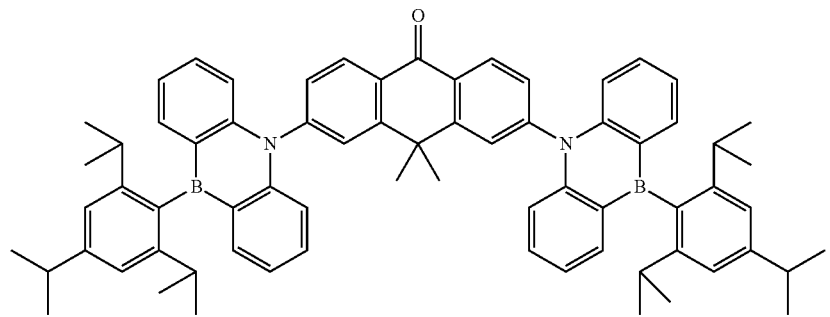

33
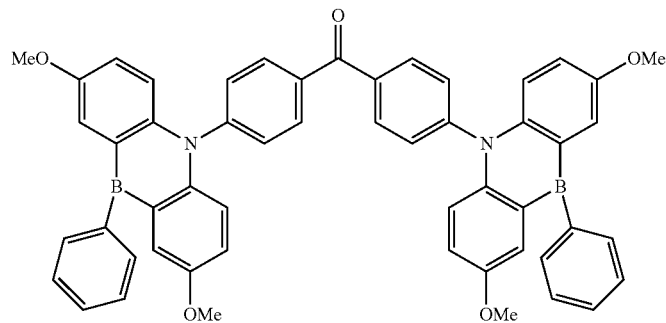
34
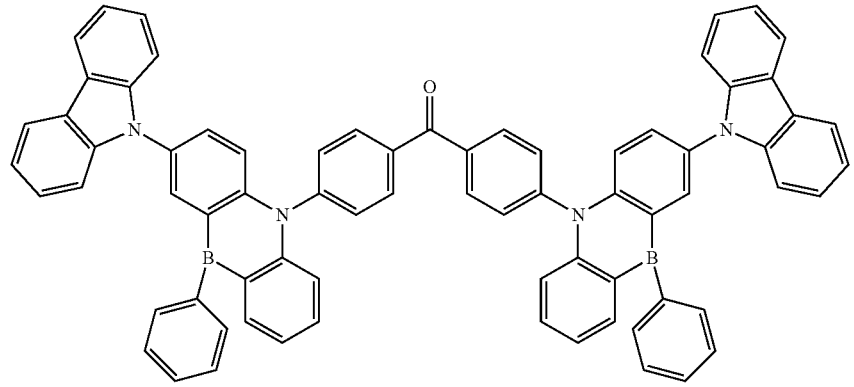
35
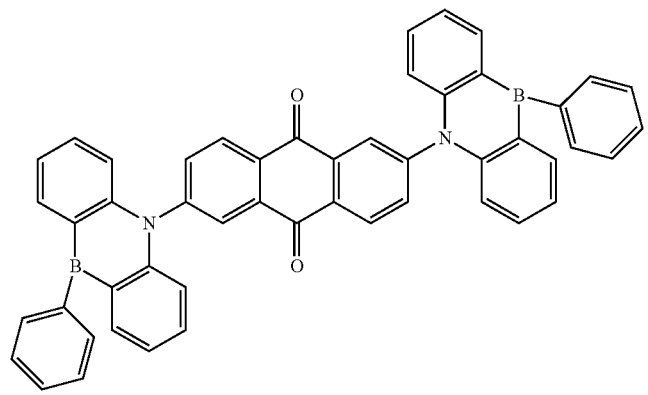
36
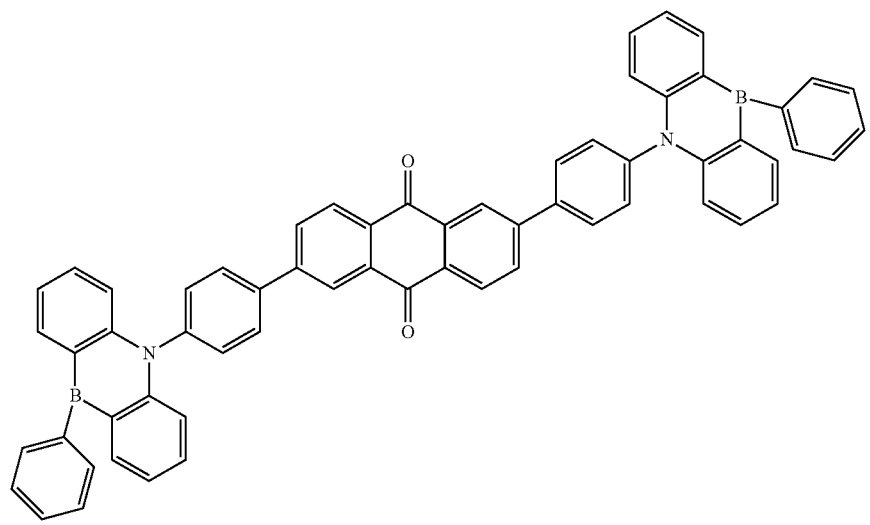

-continued
37
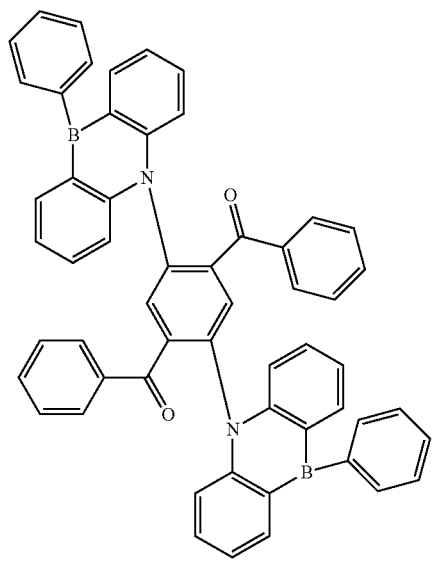
38
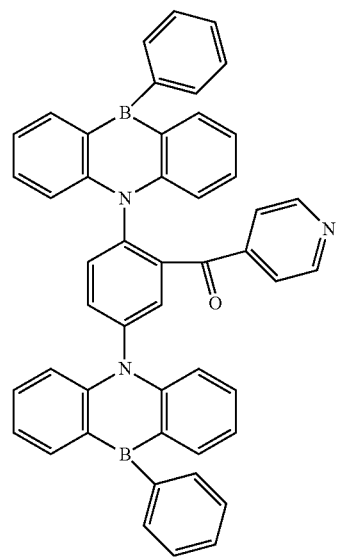
39
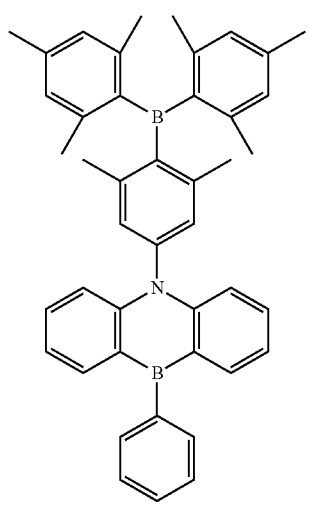
40
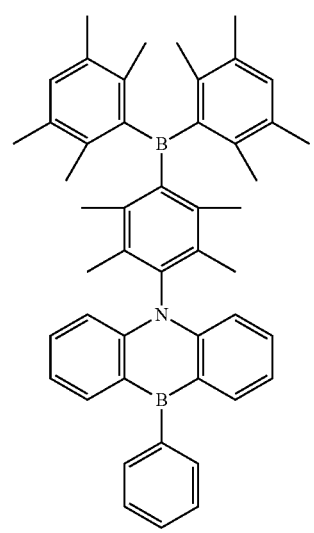
41
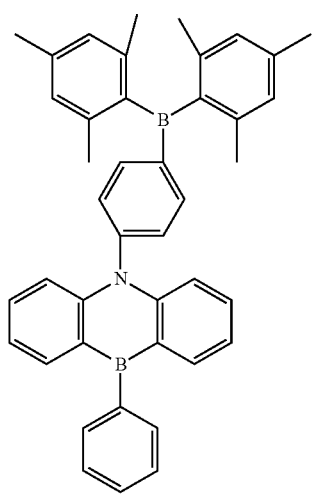
42
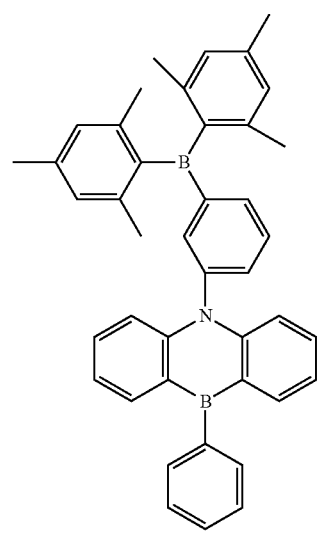

-continued
43
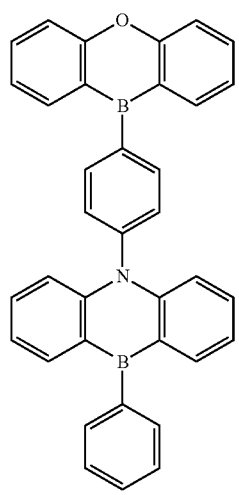
44
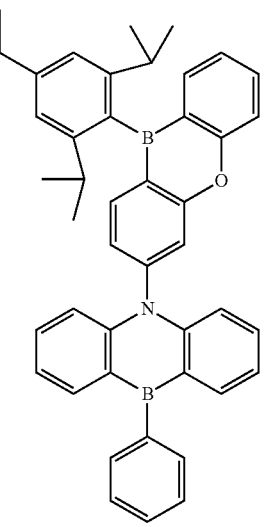
47
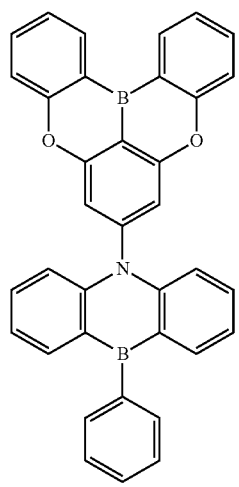
48
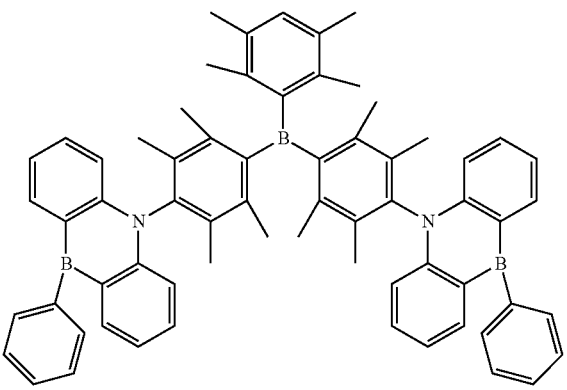
49
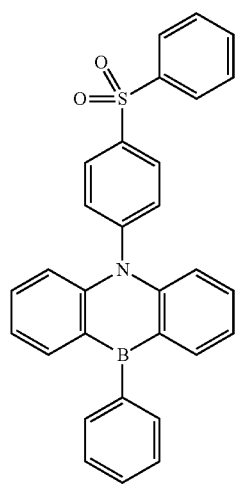
50
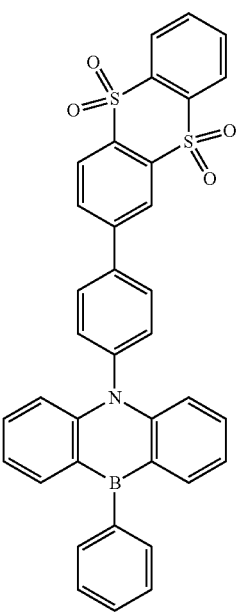

-continued
51
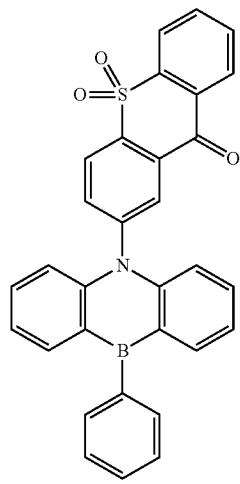
52
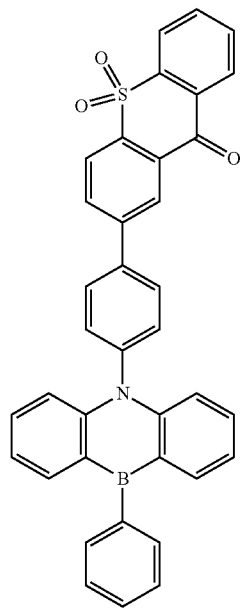
54
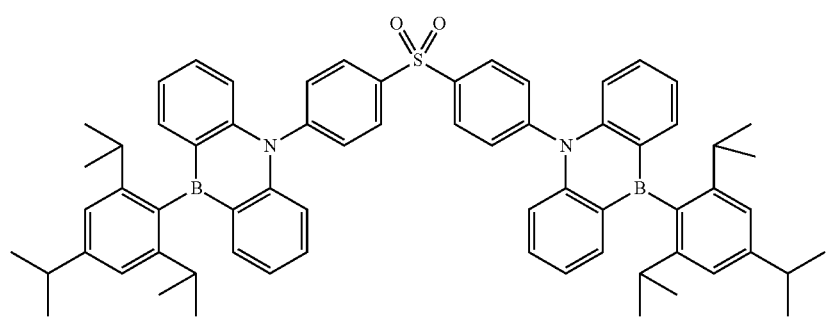
55
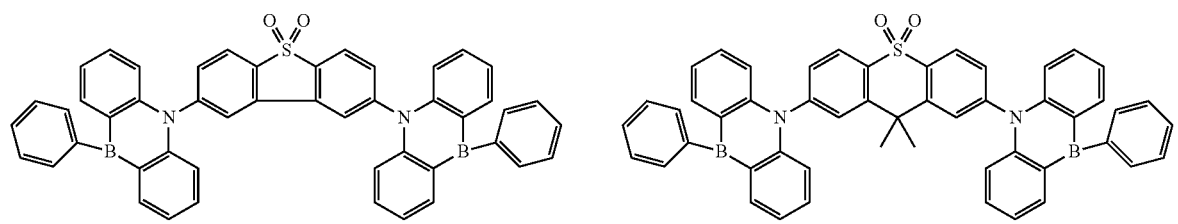
56
57
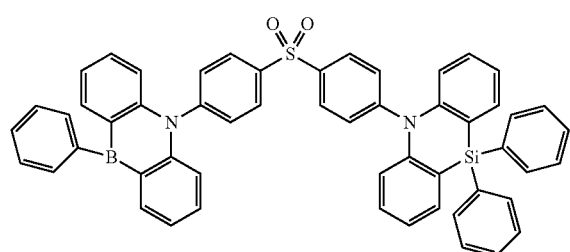
58
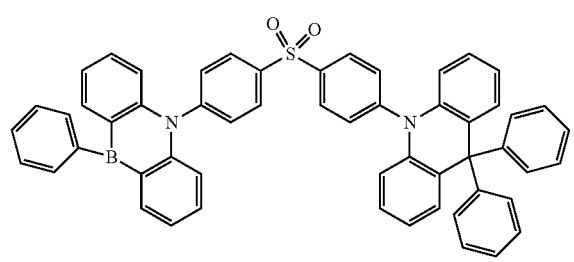

59
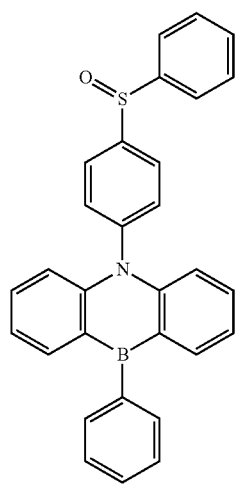
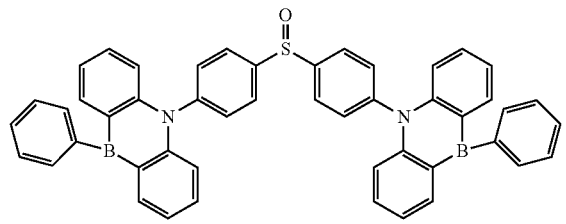
60
61
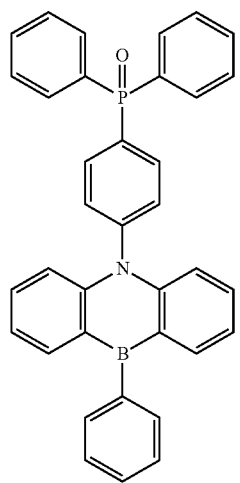
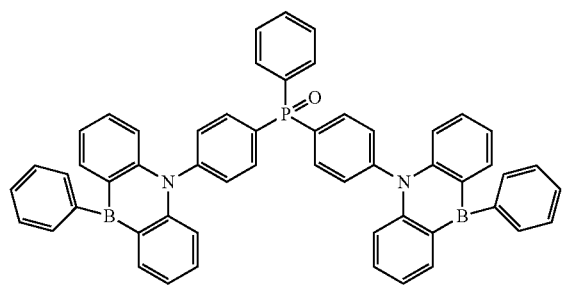
62
63
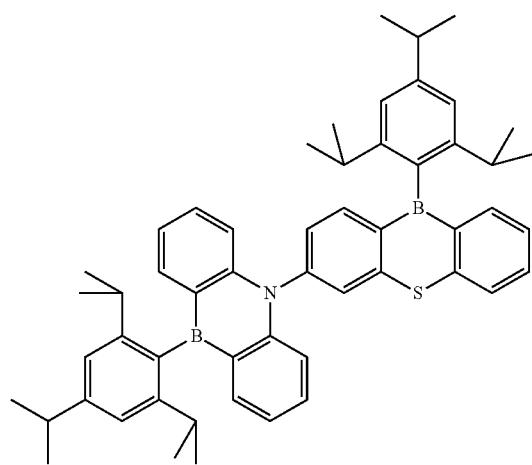
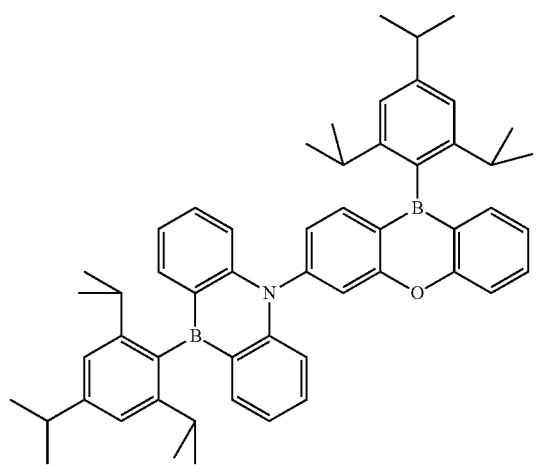
64

-continued
65
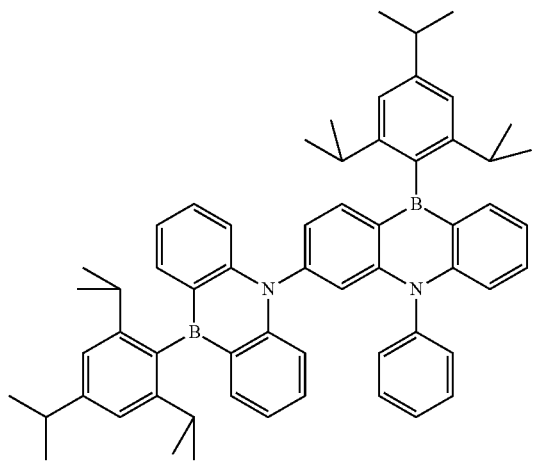
66
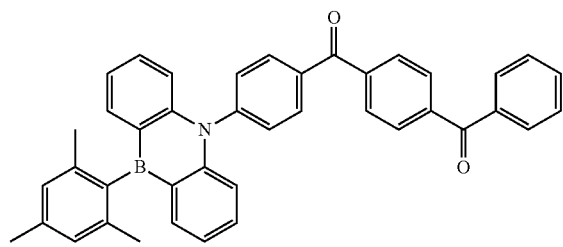
67
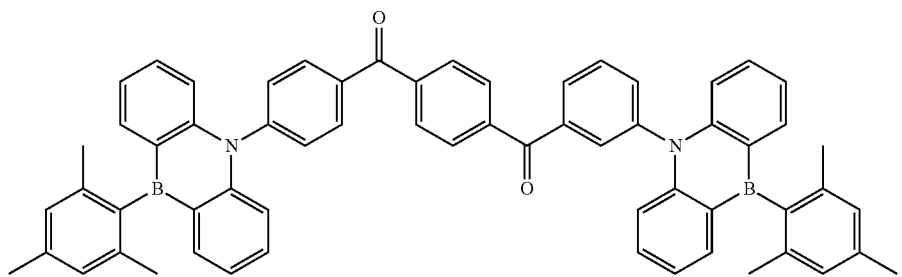
68
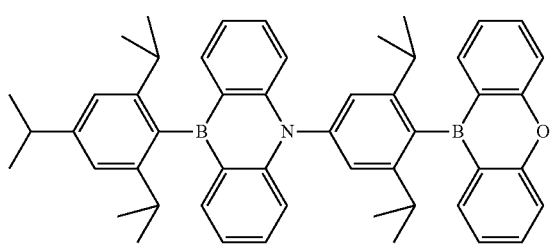
69
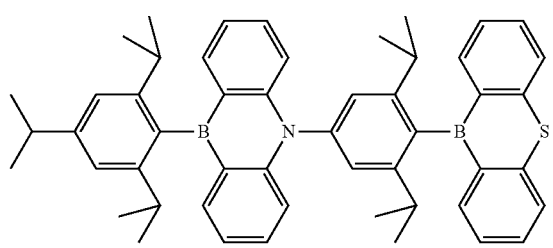
70
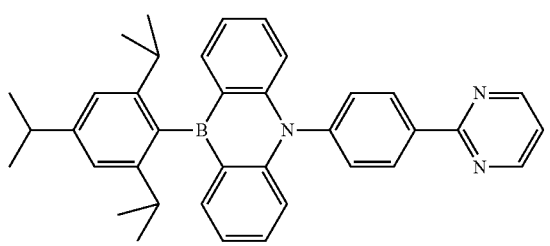
71
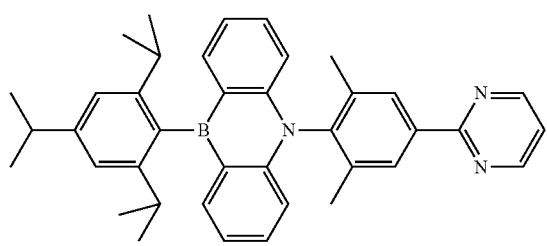

135 136
-continued
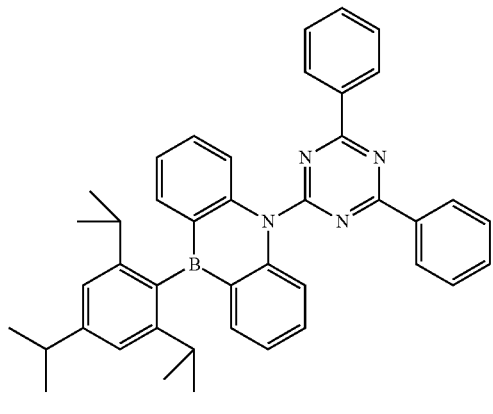 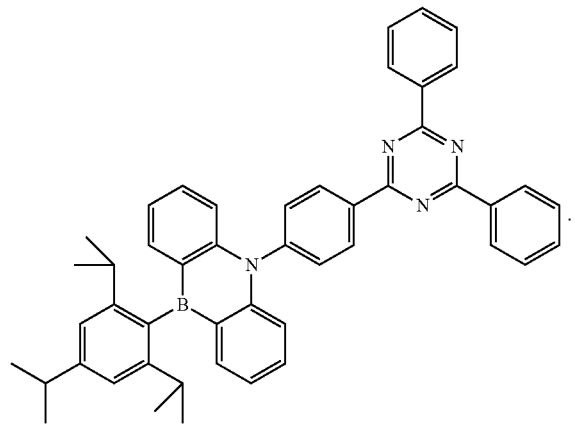
* * * * *